US012696786B2

(12) United States Patent
Tang

(10) Patent No.: US 12,696,786 B2
(45) Date of Patent: Jul. 28, 2026

(54) PACKAGING STRUCTURE INCLUDING AN UNDERFILL OUTFLANKED BY A SUBSTRATE AND AN ELECTRONIC DEVICE

(71) Applicant: Advanced Semiconductor Engineering, Inc., Kaohsiung (TW)

(72) Inventor: Shih-Chieh Tang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 391 days.

(21) Appl. No.: 18/244,207

(22) Filed: Sep. 8, 2023

(65) Prior Publication Data

US 2025/0087618 A1     Mar. 13, 2025

(51) Int. Cl.
| | |
|---|---|
| *H10W 72/30* | (2026.01) |
| *H10W 74/01* | (2026.01) |
| *H10W 74/15* | (2026.01) |
| *H10W 90/00* | (2026.01) |
| *H10H 29/14* | (2025.01) |
| *H10W 72/00* | (2026.01) |
| *H10W 72/20* | (2026.01) |

(52) U.S. Cl.
CPC ......... *H10W 72/30* (2026.01); *H10W 74/012* (2026.01); *H10W 74/019* (2026.01); *H10W 74/15* (2026.01); *H10W 90/401* (2026.01); *H10H 29/14* (2025.01); *H10W 72/072* (2026.01); *H10W 72/07207* (2026.01); *H10W 72/07236* (2026.01); *H10W 72/073* (2026.01); *H10W 72/07302* (2026.01); *H10W 72/07307* (2026.01); *H10W 72/07338* (2026.01); *H10W*

72/222 (2026.01); *H10W 72/241* (2026.01); *H10W 72/242* (2026.01); *H10W 72/252* (2026.01); *H10W 72/354* (2026.01); *H10W 90/724* (2026.01); *H10W 90/734* (2026.01)

(58) Field of Classification Search
CPC ......... H01L 24/13; H01L 24/16; H01L 24/26; H01L 24/32; H01L 24/73; H01L 24/81; H01L 24/83; H01L 24/92; H01L 2224/83102; H01L 21/568; H10W 72/30; H10W 72/242; H10W 74/012; H10W 74/019; H10W 74/15; H10W 90/401; H10W 90/701
See application file for complete search history.

(56) References Cited

U.S. PATENT DOCUMENTS

| | | | |
|---|---|---|---|
| 9,922,846 B2 | 3/2018 | Han et al. | |
| 11,424,219 B2 * | 8/2022 | Shen | H01L 23/5386 |
| 2013/0093079 A1 * | 4/2013 | Tu | H01L 24/81 |
| | | | 257/737 |
| 2017/0287735 A1 * | 10/2017 | Yao | H01L 21/565 |

(Continued)

*Primary Examiner* — Khiem D Nguyen
(74) *Attorney, Agent, or Firm* — Foley and Lardner LLP

(57) ABSTRACT

A package structure includes a substrate, an electronic device, an underfill, and an underfill guide structure. The electronic device is disposed over the substrate. The underfill is outflanked by the substrate and the electronic device. The underfill guide structure is disposed outside of a vertical projection of the circuit structure and horizontally overlaps a gap between the substrate and the electronic device, and configured to reduce an extension of a portion of the underfill outside of the vertical projection along a lateral surface of the electronic device.

7 Claims, 44 Drawing Sheets

300J

(56) References Cited

U.S. PATENT DOCUMENTS

| 2018/0269122 A1* | 9/2018 | Kato | H01L 24/83 |
| 2018/0342466 A1* | 11/2018 | Lin | H01L 23/3737 |
| 2020/0203240 A1* | 6/2020 | Haehn | H01L 25/0655 |
| 2020/0395272 A1* | 12/2020 | Bang | H01L 23/49582 |
| 2021/0057297 A1* | 2/2021 | Chen | H01L 23/18 |
| 2021/0098318 A1* | 4/2021 | Wang | H01L 23/42 |
| 2022/0052009 A1* | 2/2022 | Huang | H01L 23/3135 |

* cited by examiner

PACKAGING STRUCTURE INCLUDING AN UNDERFILL OUTFLANKED BY A SUBSTRATE AND AN ELECTRONIC DEVICE

BACKGROUND

1. Field of the Disclosure

The present disclosure relates to a package structure and a manufacturing method, and to a semiconductor package structure including a substrate, a circuit structure, and an underfill disposed therebetween, and a method for manufacturing the package structure.

2. Description of the Related Art

Underfill material is normally used in a semiconductor package structure for protecting the interconnection between a substrate and a circuit structure. The amount or volume of the underfill material is a critical issue since excess or insufficient underfill material will adversely affect the yield rate of the semiconductor package structure.

SUMMARY

In some embodiments, a package structure includes a substrate, an electronic device, an underfill, and an underfill guide structure. The electronic device is disposed over the substrate. The underfill is outflanked by the substrate and the electronic device. The underfill guide structure is disposed outside of a vertical projection of the circuit structure and horizontally overlaps a gap between the substrate and the electronic device, and configured to reduce an extension of a portion of the underfill outside of the vertical projection along a lateral surface of the electronic device.

In some embodiments, a package structure includes a substrate, an electronic device, an underfill, and an underfill guide structure. The substrate has a first surface. The electronic device is disposed over a first surface of the substrate. The underfill is outflanked by the substrate and the electronic device. The underfill guide structure is disposed on the first surface of the substrate and outside of a vertical projection of the electronic device, and configured to increase a contact area between a portion of the underfill outside of the vertical projection and the first surface of the substrate.

In some embodiments, a package structure includes a first substrate, a second substrate, an underfill, and a first protrusion. The first substrate has a first top surface. The second substrate is disposed over the first top surface of the first substrate. The second substrate has a second bottom surface facing the first top surface of the first substrate. The first top surface of the first substrate and the second bottom surface of the second substrate collectively define a gap with an inconsistent height. The underfill is outflanked by the first substrate and the second substrate. The first protrusion disposed outside of the gap and horizontally overlapping the gap, and configured to provide a guiding surface to increase a flow of the underfill.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 2A-1 illustrates an enlarged view of an area "2A-1" of FIG. 2A.

FIG. 2A-2 illustrates an enlarged view of an area "2A-2" of FIG. 2A.

FIG. 2A-3 illustrates three conditions (a), (b), and (c) of an enlarged view of an area "2A-3" of FIG. 2A-1.

DETAILED DESCRIPTION

Figure 1A:
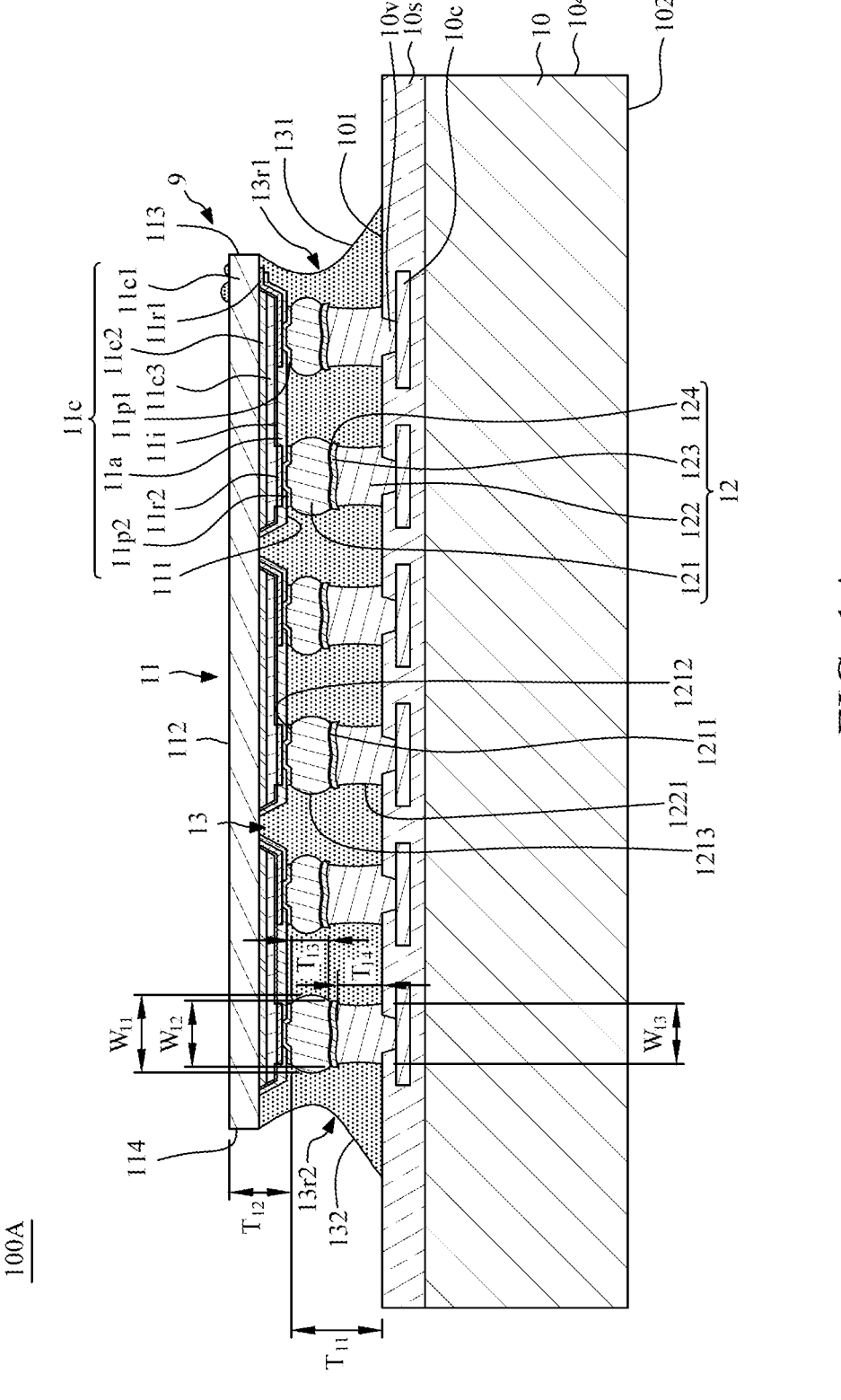
FIG. 1A illustrates a cross-sectional view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

FIG. 1A illustrates a cross-sectional view of a package structure 100A according to some embodiments of the present disclosure. The package structure 100A may include a substrate 10, an electronic device, a plurality of connection elements 12, and an underfill 13.

The substrate 10 may have a surface (or a first surface or an upper surface or a top surface) 101 facing the electronic device 11 and a surface (or a second surface or a lower surface or a bottom surface) 102 opposite to the surface 101. The substrate 10 may have a lateral surface 104 extending between the surfaces 101 and 102. The substrate 10 may include an interposer. The substrate 10 may include, for example, a printed circuit board, such as a paper-based copper foil laminate, a composite copper foil laminate, or a polymer-impregnated glass-fiber-based copper foil laminate.

The substrate 10 (e.g., a first substrate 10) may include a solder resist layer 10s at the upper surface (e.g., the surface 101) of the substrate 10 to fully expose or to expose at least a portion of the conductive pads for electrical connection. The substrate 10 may include a plurality of conductive vias 10v and a plurality of conductive layers 10c disposed in the solder resist layer 10s. One of the conductive vias 10v is connected to the corresponding conductive layer 10c. The connection elements 12 may be connected to the conductive layers 10c through the conductive vias 10v.

The electronic device 11 may include a circuit structure or a second substrate. The electronic device 11 may be disposed over the surface 101 of the substrate 10. The electronic device 11 may have a surface (or a lower surface or a bottom surface) 111 facing the upper surface (e.g., the surface 101) of the substrate 10 and a surface (or an upper surface or a top surface) 112 opposite to the surface 111. The electronic device 11 may include a plurality of semiconductor devices 11c, a plurality of redistribution layers (RDL) 11r1 and 11r2, and a plurality of conductive pads (or pads) 11p1 and 11p2. In some embodiments, the electronic device 11 may include a semiconductor die and an RDL disposed at the surface 111 and connected to the semiconductor die.

The number of semiconductor devices 11c may be three, as shown in FIG. 1A. In some embodiments, the number of semiconductor devices 11c may be less or more than three. The semiconductor devices 11c may form an array, e.g., 3*3, 4*4, . . . N*M array, where N and M are positive integers. The semiconductor devices 11c may be configured to emit an optical signal (or light) from the surface 112. The semiconductor devices 11c may include LEDs. The semiconductor devices 11c may include a semiconductor doped layer 11c1 with a first type of dopant, an intermediate layer 11c2, and a semiconductor doped layer 11c3 with a second type of dopant that differs from the first type of dopant. The semiconductor doped layer 11c1, the intermediate layer 11c2, and the semiconductor doped layer 11c3 are stacked together. The semiconductor doped layer 11c1 may be an N-type doped layer, e.g., an N-type GaN layer. The semiconductor doped layer 11c3 may be a P-type doped layer, e.g., a P-type GaN layer. The intermediate layer 11c2 may be referred to as an active region. The intermediate layer 11c2 may include one or more quantum wells. In some embodiments, the intermediate layer 11c2 may include one or more barrier layers interlaced with the quantum wells. In some embodiments, when a voltage is applied to the semiconductor device 11c, electrons (from the semiconductor doped layer 11c1) and holes (from the semiconductor doped layer 11c3) are injected into the quantum wells of the intermediate layer 11c2 and recombine, emitting light.

The RDL 11r1 may extend along tilted sidewalls of the intermediate layer 11c2 and the semiconductor doped layer 11c3. An isolation layer 11i may be disposed between the RDL 11r1 and the intermediate layer 11c2 and the semiconductor doped layer 11c3, such that the RDL 11r1 is isolated from the intermediate layer 11c2 and the semiconductor doped layer 11c3. The semiconductor doped layer 11c1 may be electrically connected to one of the connection elements 12 through the RDL 11r1. The semiconductor doped layer 11c3 may be electrically connected to one of the connection elements 12 through the RDL 11r2. The semiconductor doped layers 11c1 and 11c3 may be applied with different potentials. The substrate 10 may be configured to apply voltages to the semiconductor devices 11c through the connection elements 12, to control the semiconductor devices 11c (e.g., turn on or off of the semiconductor devices 11c or adjust the light intensity of the semiconductor devices 11c).

The semiconductor device 11c may include a passivation layer 11a disposed over the RDL 11r1 and 11r2. The passivation layer 11a may be disposed at the surface 111 of the electronic device 11. The passivation layer 11a may define a plurality of openings for accommodating the conductive pads 11p1 and 11p2. The RDL 11r1 may be electrically connected to one of the connection elements 12 through the conductive pad 11p1. The RDL 11r2 may be electrically connected to one of the connection elements 12 through the conductive pad 11p2. The conductive pads 11p1 and 11p2 may each include Under Bump Metallurgy (UBM).

The connection elements 12 may be disposed between the electronic device 11 and the substrate 10. The connection elements 12 may be disposed over the surface 101 of the substrate 10. The connection elements 12 may be electrically connected to the substrate 10 (or the conductive vias 10v and/or the conductive layer 10c). The connection elements 12 may be electrically connected to the electronic device 11 (or the conductive pads 11p1 and 11p2). A thickness $T_{11}$ of the connection elements 12 is greater than a thickness $T_{12}$ of the electronic device 11 in a direction perpendicular to the surface 101 of the substrate 10. The connection elements 12 may each include a solder 121 and a conductive pillar 122 connected to the solder 121. The thickness of the conductive pads 11p1 and 11p2 may be smaller than the thickness of the solder 121 of the connection elements 12. The solder 121 is closer to the electronic device 11 than the conductive pillar 122 is. The solder 121 is farther away from the substrate 10 than the conductive pillar 122 is. The solder 121 may have a surface 1211 connected to the conductive pillar 122 and a surface 1212 connected to the conductive pad 11p1 or 11p2, and a curved lateral surface 1213 connected between the surfaces 1211 and 1212. There may be an intermetallic structure formed along the boundary between the conductive pad 11p1 (or 11p2) and the solder 121. The conductive pillar 122 is farther away from the electronic device 11 than the solder 121 is. The conductive pillar 122 may have a curved lateral surface 1221. The curved lateral surface 1221 of the conductive pillar 122 may be concave, i.e., the width of a middle part of the conductive pillar 122 is smaller than that of a bottom part/upper part of the conductive pillar 122. The conductive pillar 122 and the conductive via 10v may be formed in the same process and integrally as a monolithic structure.

The solders 121 of the connection elements 12 may have different thicknesses $T_{13}$ in a direction perpendicular to the surface 101 of the substrate 10. The solders 121 of the connection elements 12 may have different widths $W_{11}$ in a direction parallel to the surface 101 of the substrate 10. The width $W_{11}$ of one of the solders 121 is larger than the thickness $T_{13}$ of that solder 121. The conductive pillars 122 of the connection elements 12 may have different thicknesses $T_{14}$ in a direction perpendicular to the surface 101 of the substrate 10.

The connection elements 12 may each include a first portion 123 and a second portion 124 disposed between the solder 121 and the conductive pillar 122. The first portion 123 may be disposed on the conductive pillar 122, and may include a first metal such as nickel. The second portion 124 may be disposed on the first portion 123, and may include a second metal such as SnAg alloy or Ni, Sn. In some embodiments, the solder 121 may have Ag. The conductive pillar 122 may include a third metal such as copper. The solder 121 may include a fourth metal such as Sn. A width $W_{12}$ of the first portion 123 is greater than a width $W_{13}$ of the conductive pillar 122.

The underfill 13 may be outflanked by the substrate 10 and the electronic device 11. The underfill 13 may be disposed between the substrate 10 and the electronic device 11. In other words, the underfill 13 may be disposed in the space between the substrate 10 and the electronic device 11 so as to cover and protect the joints formed by the conductive pads 11p1, 11p2, and the solders 121, and the joints formed by the solders 121 and the conductive pillars 122. The underfill 13 may be in contact with the passivation layer 11a and/or the solder resist layer 10s. In some embodiments, the underfill 13 may include an epoxy resin including fillers, a molding compound (e.g., an epoxy molding compound or other molding compound), polyimide, a phenolic compound or material, a material including silicone dispersed therein, or a combination thereof.

The underfill 13 may have a lateral surface 131 and a lateral surface 132 opposite to the lateral surface 131. The lateral surface 131 may define a recess portion 13r1 and the lateral surface 132 may define a recess portion 13r2. The shape/size/curvature of the recess portions 13r1 and 13r2 may be different.

In some cases, semiconductor devices may be fabricated on a wafer with a relatively small size (e.g., 4-inch wafer). The bumping process encounters difficulties since the equipment thereof is incompatible with the small wafer. In the present disclosure, instead of handling the small wafer of the semiconductor devices in the bumping process, the connection element 12 is formed (thus being disposed) on the substrate 10 and, subsequently, the electronic device 11 with the plurality of semiconductor devices 11c may be attached to the connection element 12 with a flip-chip bonding technique. The conductive pillars 122 of the connection element 12 are farther away from the semiconductor devices 11c, such that the conductive pillars 122 can be referred to as "inverted conductive pillars" with respect to those formed on a larger wafer. That is to say, the "inverted conductive pillars" 122 can solve the issue of the small wafer not being compatible with the bumping process.

In some embodiments, a residue 9 of an adhesive material may be disposed over the surface 112 of the electronic device 11. The residue 9 may be at the edge of the surface 112. The residue 9 may be formed during a de-carrier process of a temporary carrier.

Figure 1B:
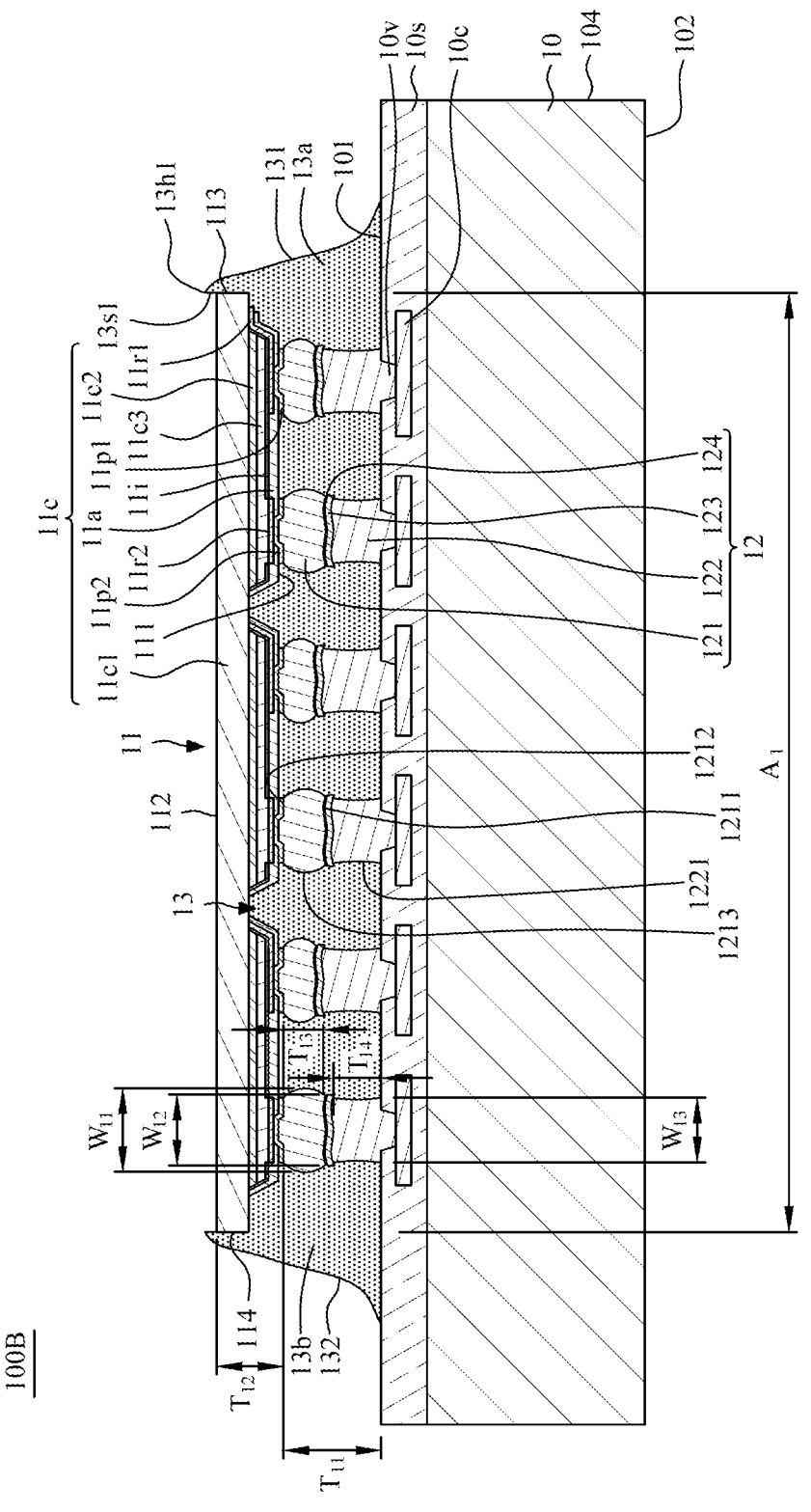
FIG. 1B illustrates a cross-sectional view of a package structure according to some embodiments of the present disclosure.

FIG. 1B illustrates a cross-sectional view of a package structure 100B according to some embodiments of the present disclosure. The package structure 100B in FIG. 1B is similar to the package structure 100A in FIG. 1A. Therefore, some detailed descriptions may refer to corresponding preceding paragraphs and are not repeated hereinafter for conciseness, with differences therebetween as follows.

As shown in FIG. 1B, the amount or volume of the underfill 13 is larger than that in FIG. 1A. As such, the underfill 13 may have portions 13a and 13b disposed outside of a projection area A1 of the electronic device 11 on the surface 101 of the substrate 10. The portion 13a of the underfill 13 may creep onto lateral surfaces 113 and 114 of the electronic device 11. A highest end 13h1 of the portion 13a may be higher than the surface 112 of the electronic device 11. The portion 13a may have a ruptured surface 13s1 formed during the de-carrier process of a temporary carrier. The excessive portion 13a of the underfill 13 may hook the temporary carrier, which would cause a problem during the de-carrier process.

Figure 1C:
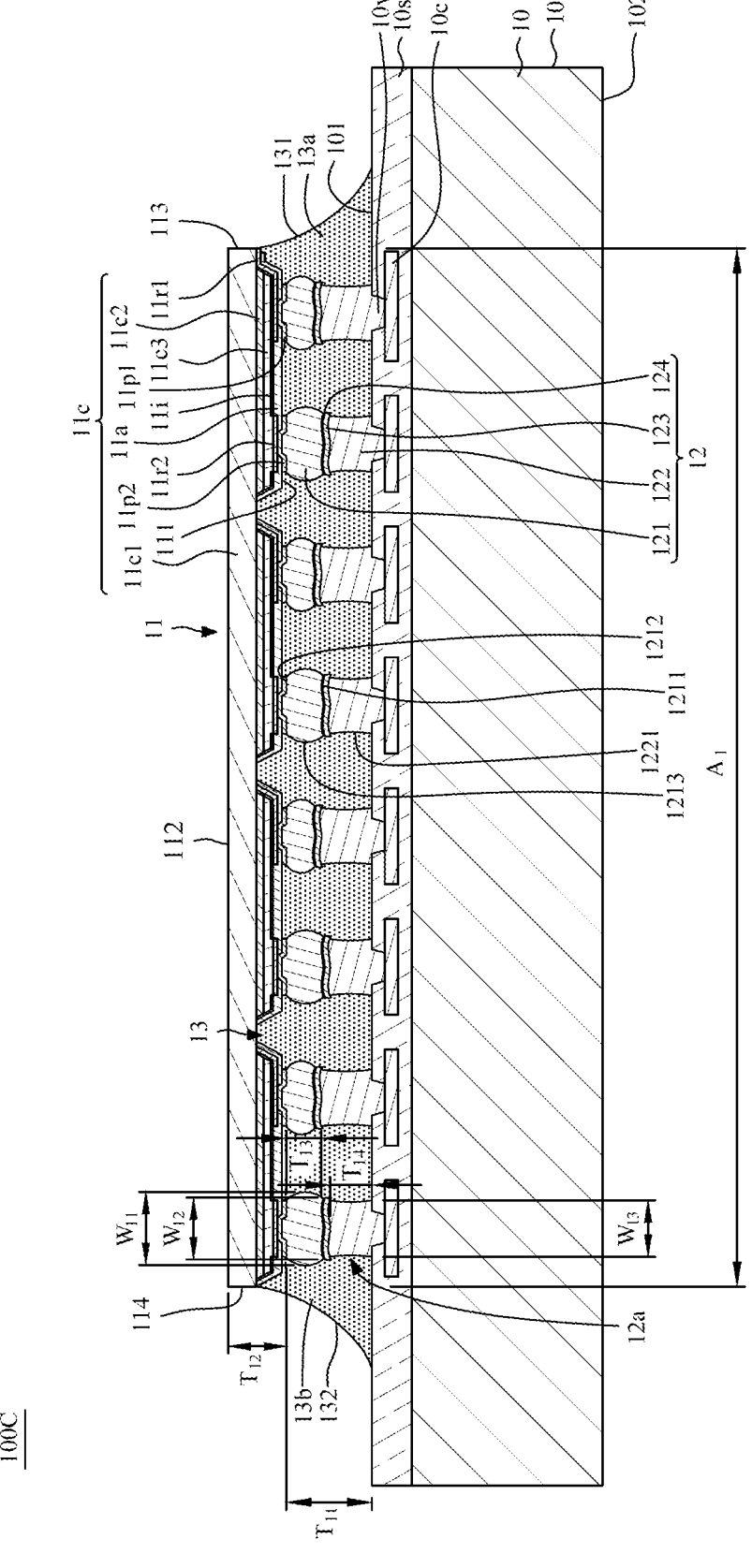
FIG. 1C illustrates a cross-sectional view of a package structure according to some embodiments of the present disclosure.

FIG. 1C illustrates a cross-sectional view of a package structure 100C according to some embodiments of the present disclosure. The package structure 100C in FIG. 1C is similar to the package structure 100A in FIG. 1A. Therefore, some detailed descriptions may refer to corresponding preceding paragraphs and are not repeated hereinafter for conciseness, with differences therebetween as follows.

As shown in FIG. 1C, the package structure 100C may include more semiconductor devices 11c than the package structure 100A. A group 12a of the connection elements 12 may be disposed close to the lateral surfaces 113 and 114 of the electronic device 11. Such an arrangement of the connection elements 12 of the package structure 100C may alter the shape of the portion 13a of the underfill 13 by the capillary effect between the group 12a of the connection elements 12. For example, the capillary effect may suppress the flow of the underfill 13 in a direction perpendicular to the surface 101 of the substrate 10 and guide the flow along the surface 101 of the substrate 10. Thus, the portion 13a of the package structure 100C may be lower than the surface 112 of the electronic device 11. The group 12a of the connection elements 12 close to (or having a sidewall coplanar with) the lateral surfaces 113 and 114. In some embodiments, there may be multiple materials disposed close to the lateral surfaces 113 and 114 and may result in a multiple-material issue in a singulation process.

FIG. 1D through FIG. 1J illustrates a method for manufacturing a semiconductor package structure according to some embodiments of the present disclosure. In some embodiments, the method is for manufacturing the package structure 100A shown in FIG. 1A.

Figure 1D:
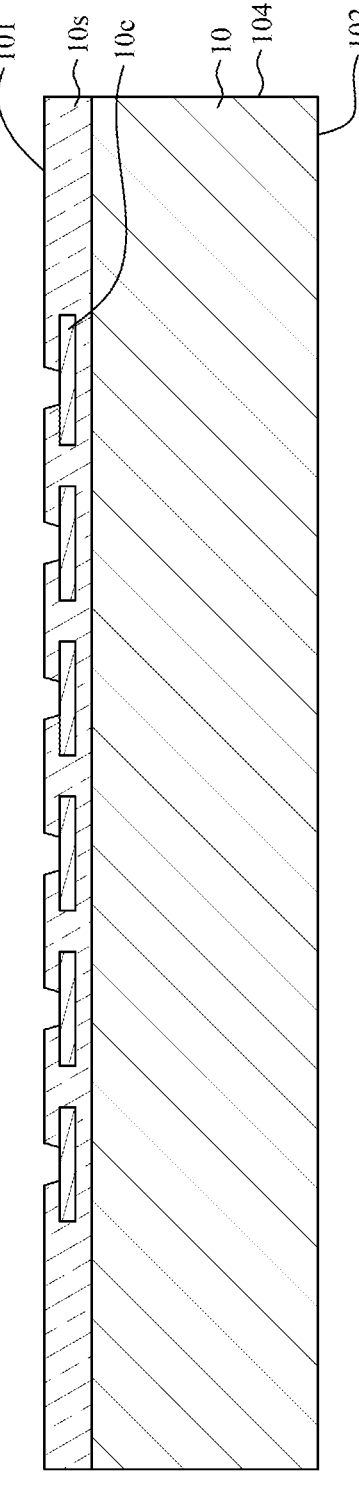
FIG. 1D illustrates one or more stages of an example of a method for manufacturing a package structure according to some embodiments of the present disclosure.
Figure 1E:
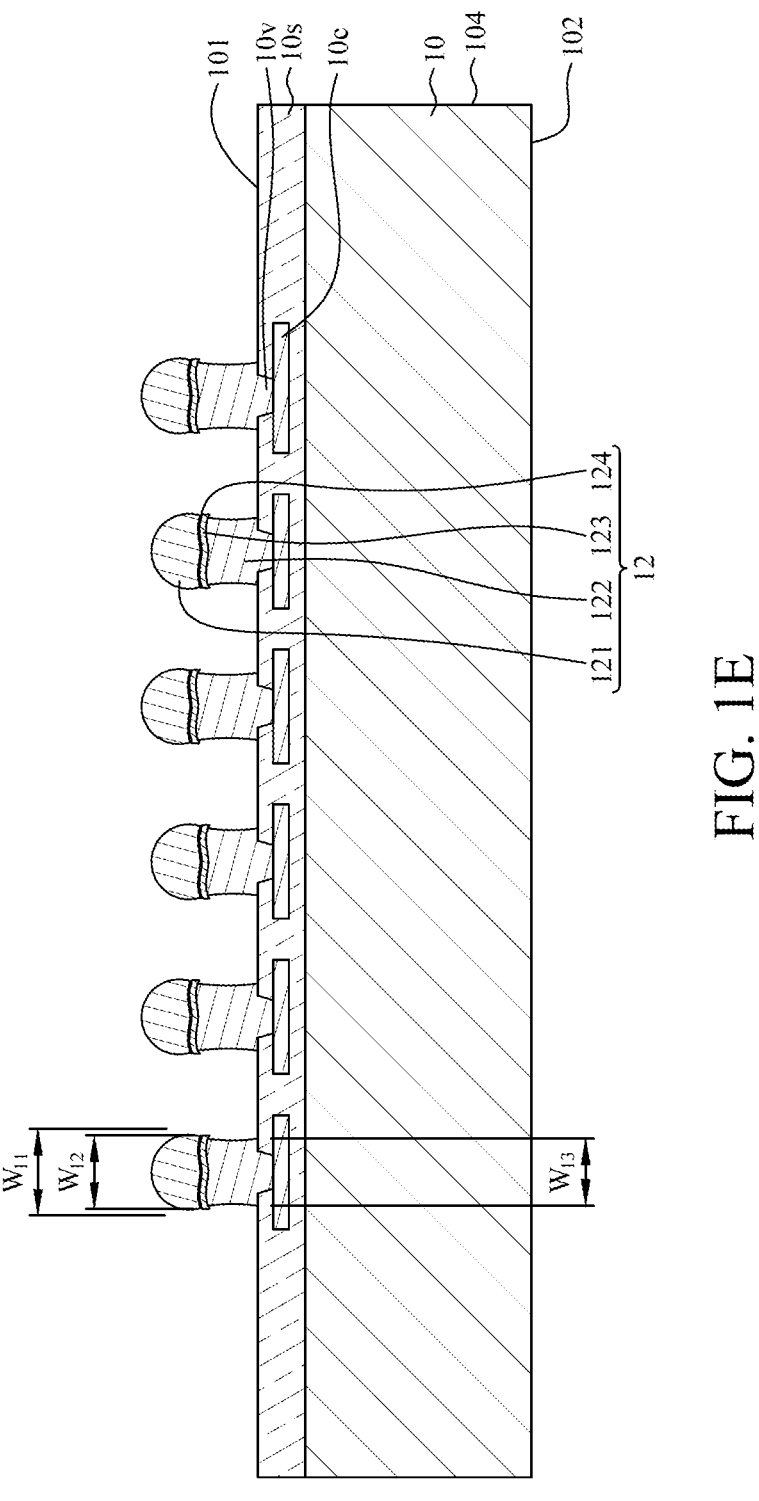
FIG. 1E illustrates one or more stages of an example of a method for manufacturing a package structure according to some embodiments of the present disclosure.

Referring to FIG. 1D, a carrier (or a substrate) 10 is provided. The substrate 10 may be in a wafer type or strip type. The substrate 10 may include a solder resist layer 10s, a plurality of conductive vias 10v, and a plurality of conductive layers 10c as discussed in the relevant paragraphs of FIG. 1A Referring to FIG. 1E, a plurality of connection elements 12 may be formed over the conductive vias 10v. The formation of the connection elements 12 may include forming a plurality of conductive pillars 122 on the conductive vias 10v, forming a first portion 123 and a second portion 124 on the corresponding one of the conductive pillars, and forming a plurality of solder 121 on the second portions 124. In an alternative embodiment, the conductive pillar 122 and the conductive via 10v may be formed in the same process and integrally as a monolithic structure.

Figure 1F:
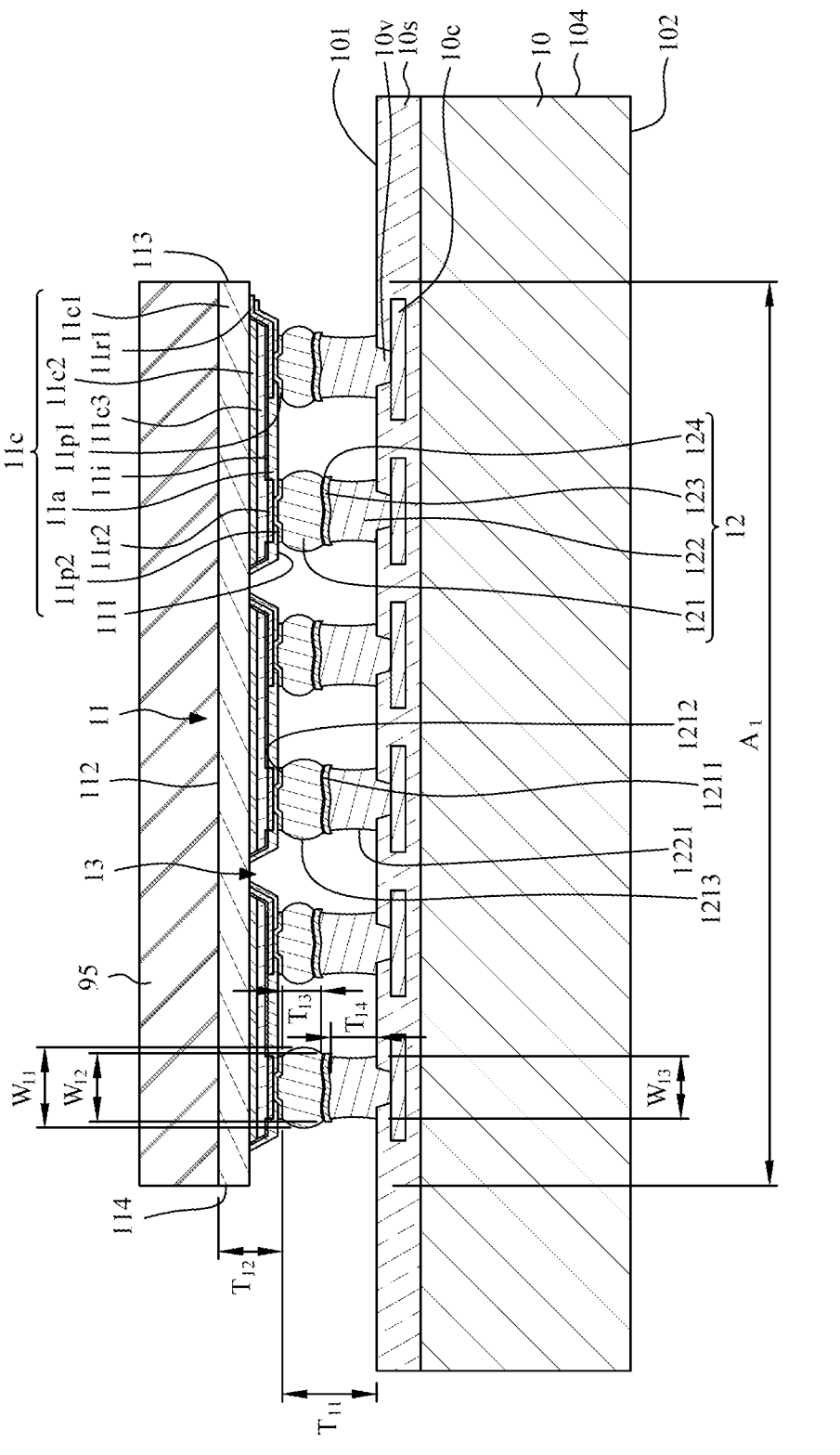
FIG. 1F illustrates one or more stages of an example of a method for manufacturing a package structure according to some embodiments of the present disclosure.

Referring to FIG. 1F, an electronic device 11 may be attached to the connection elements 12. In some embodiments, before the step of attaching the electronic device 11 to the connection elements 12, the method further includes:

forming the electronic device 11 on a carrier 95. The electronic device 11 may have a surface 111 and a surface 112 opposite to the surface 111. The surface 112 may be in contact with the carrier 95.

Figure 1G:
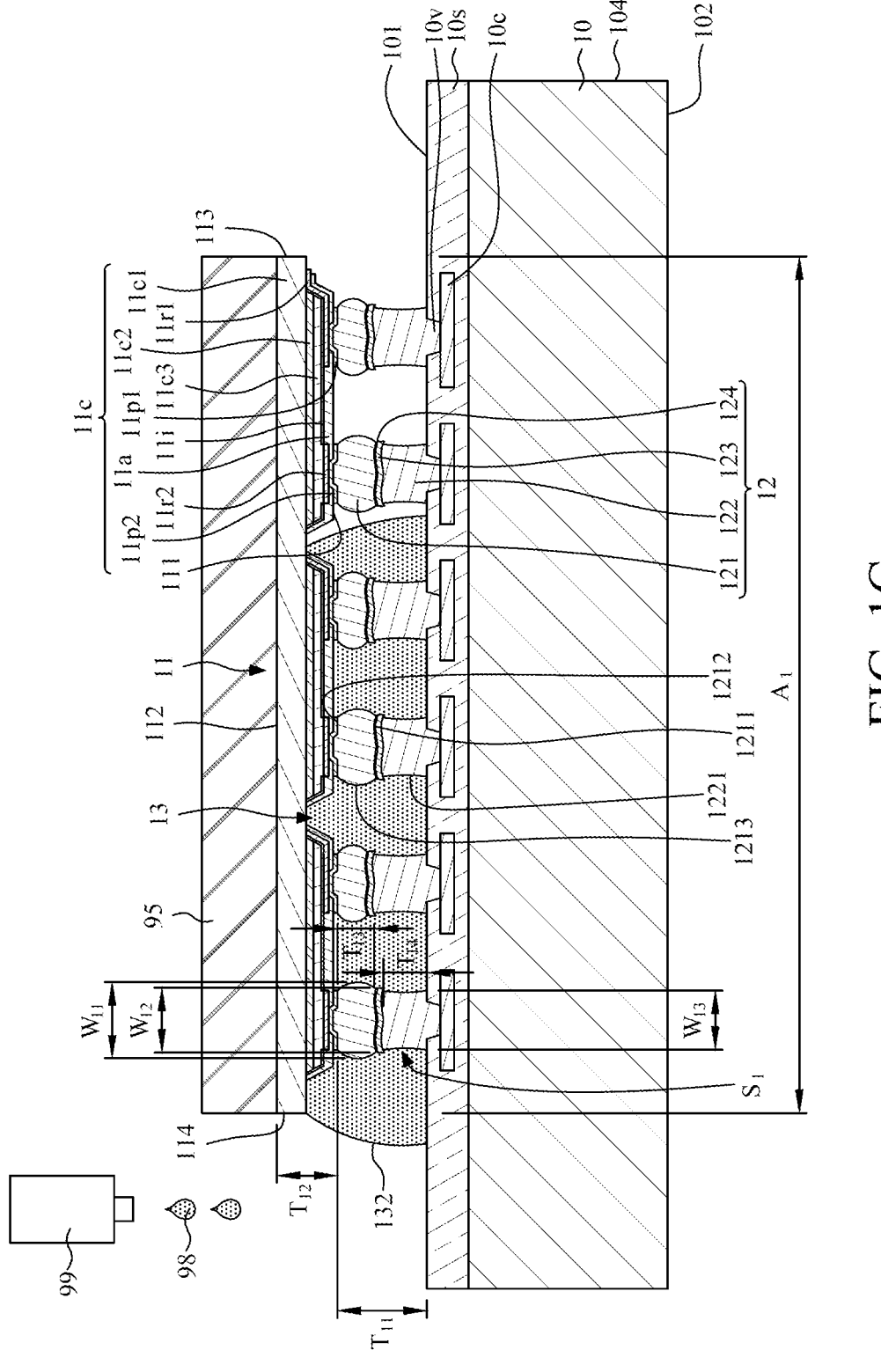
FIG. 1G illustrates one or more stages of an example of a method for manufacturing a package structure according to some embodiments of the present disclosure.

Referring to FIG. 1G, an underfill 13 is applied to a space $S_1$ between the substrate 10 and the electronic device 11 by, e.g., jetting, spray, or auger pump. The application of the underfill 13 may be performed by the droplets 98 produced from equipment 99. The equipment 99 may be jetting equipment, spray equipment, or an auger pump. The application of the underfill 13 to the space $S_1$ between the substrate 10 and the electronic device 11 includes: dispensing the underfill 13 outside the space $S_1$. The underfill 13 flows through a portion of the surface 101 outside the space $S_1$ to enter the space $S_1$ between the substrate 10 and the electronic device 11 by capillary effect.

Figure 1H:
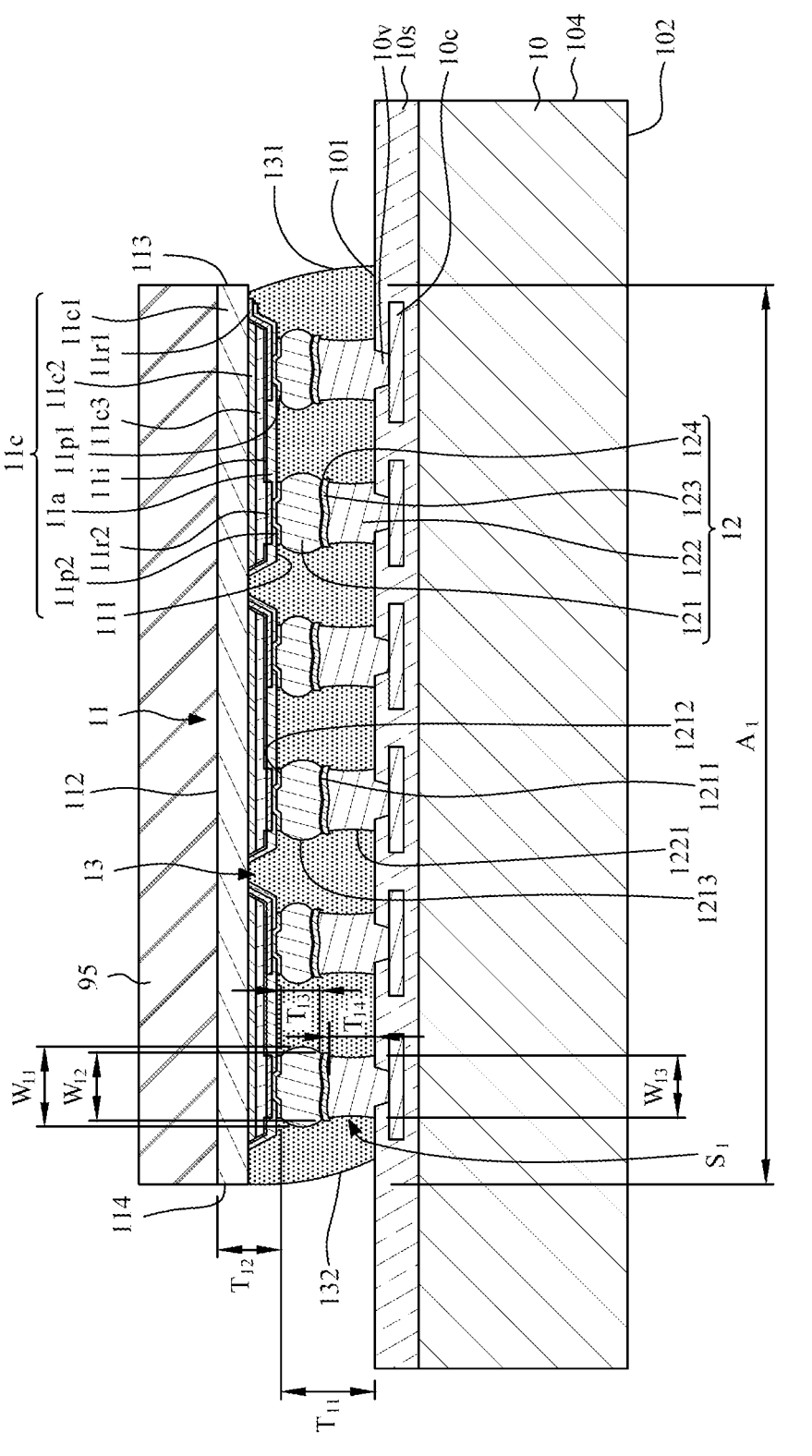
FIG. 1H illustrates one or more stages of an example of a method for manufacturing a package structure according to some embodiments of the present disclosure.

Referring to FIG. 1H, the application of the underfill 13 may be finished and the underfill 13 is flowable or at the flow stage. The highest end of the underfill 13 may be lower than the surface 111 of the electronic device 11 with respect to the surface 101 of the substrate 10.

Figure 1I:
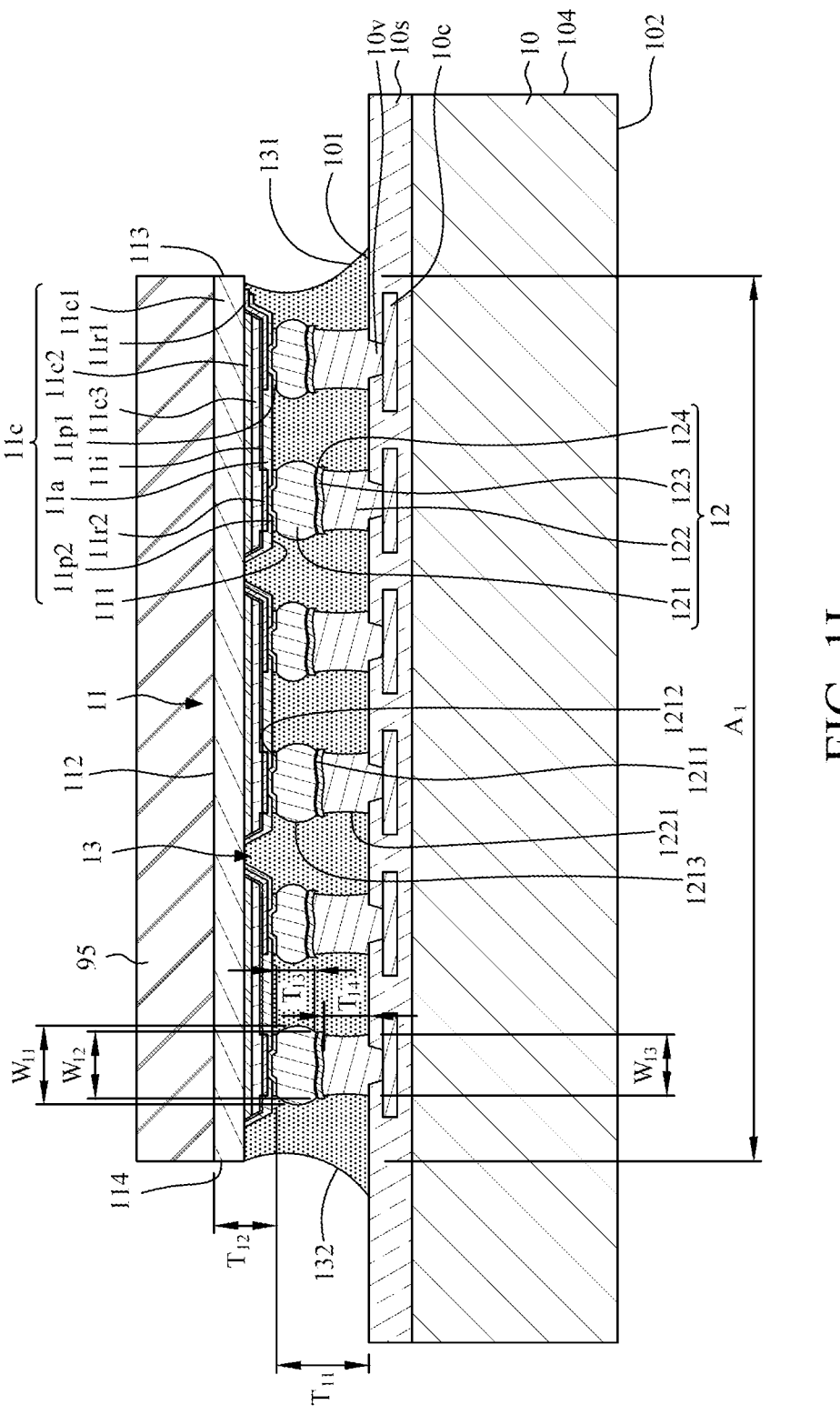
FIG. 1I illustrates one or more stages of an example of a method for manufacturing a package structure according to some embodiments of the present disclosure.

Referring to FIG. 1I, the underfill 13 is cured in a thermal process. The shape of the underfill 13 may be altered because of the reflow happening in the curing process. In other words, the underfill 13 may shrink because of the thermal process. Therefore, recess portions 13r1 and 13r2 may be formed in lateral surfaces 131 and 132 of the underfill 13.

Figure 1J:
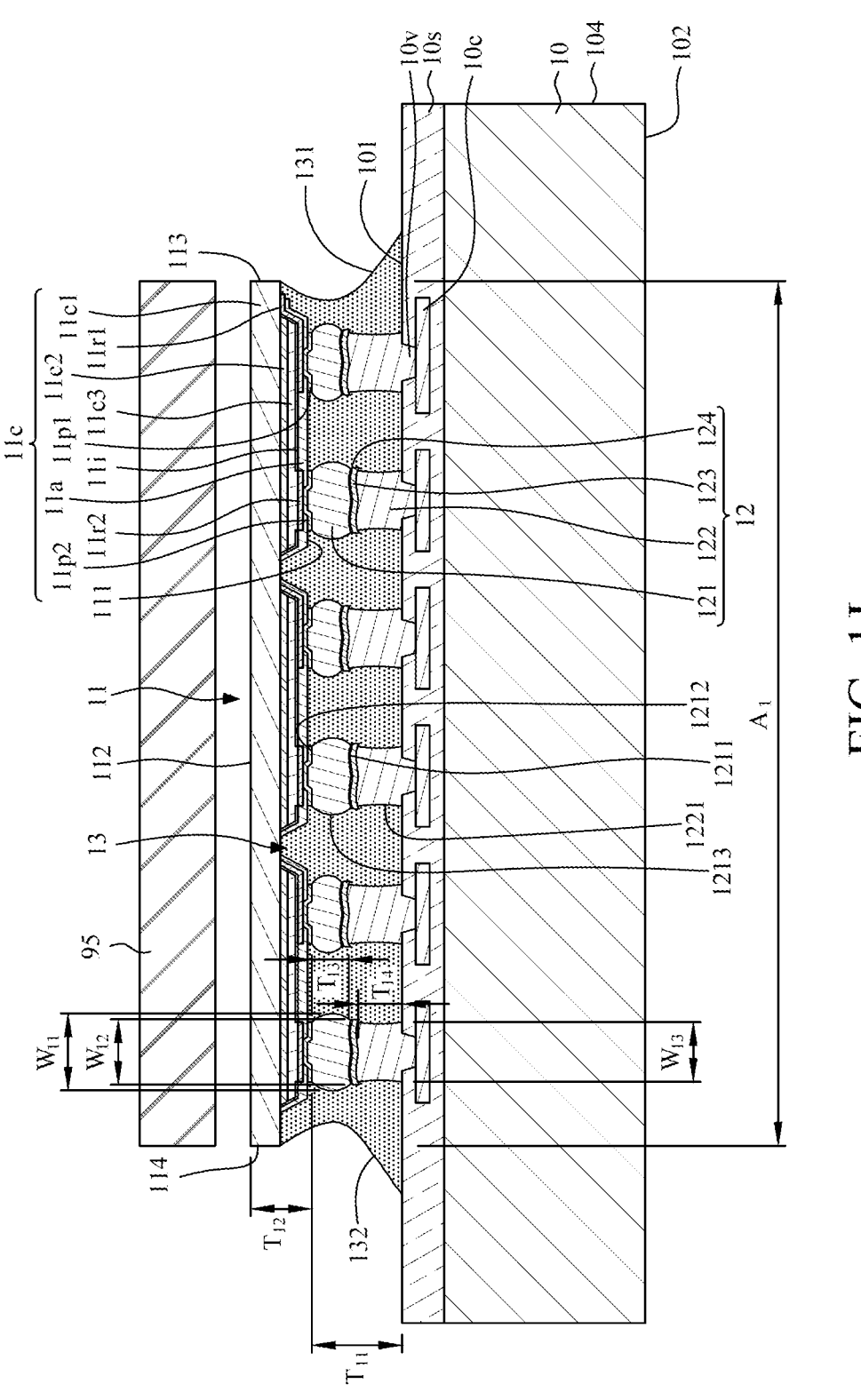
FIG. 1J illustrates one or more stages of an example of a method for manufacturing a package structure according to some embodiments of the present disclosure.

Referring to FIG. 1J, the carrier 95 is removed from the electronic device 11. The carrier 95 may be removed with a de-carrier process, e.g., a laser lift-off process. A singulation of the substrate 10 may follow to form the package structure 100A shown in FIG. 1A. During the removal of the carrier 95, if the volume of the underfill 13 is not sufficient to secure the electronic device 11, the electronic device 11 may be peeled off from a weak point (normally at the edge of the circuit structure) between the underfill 13 and the electronic device 11.

Figure 1K:
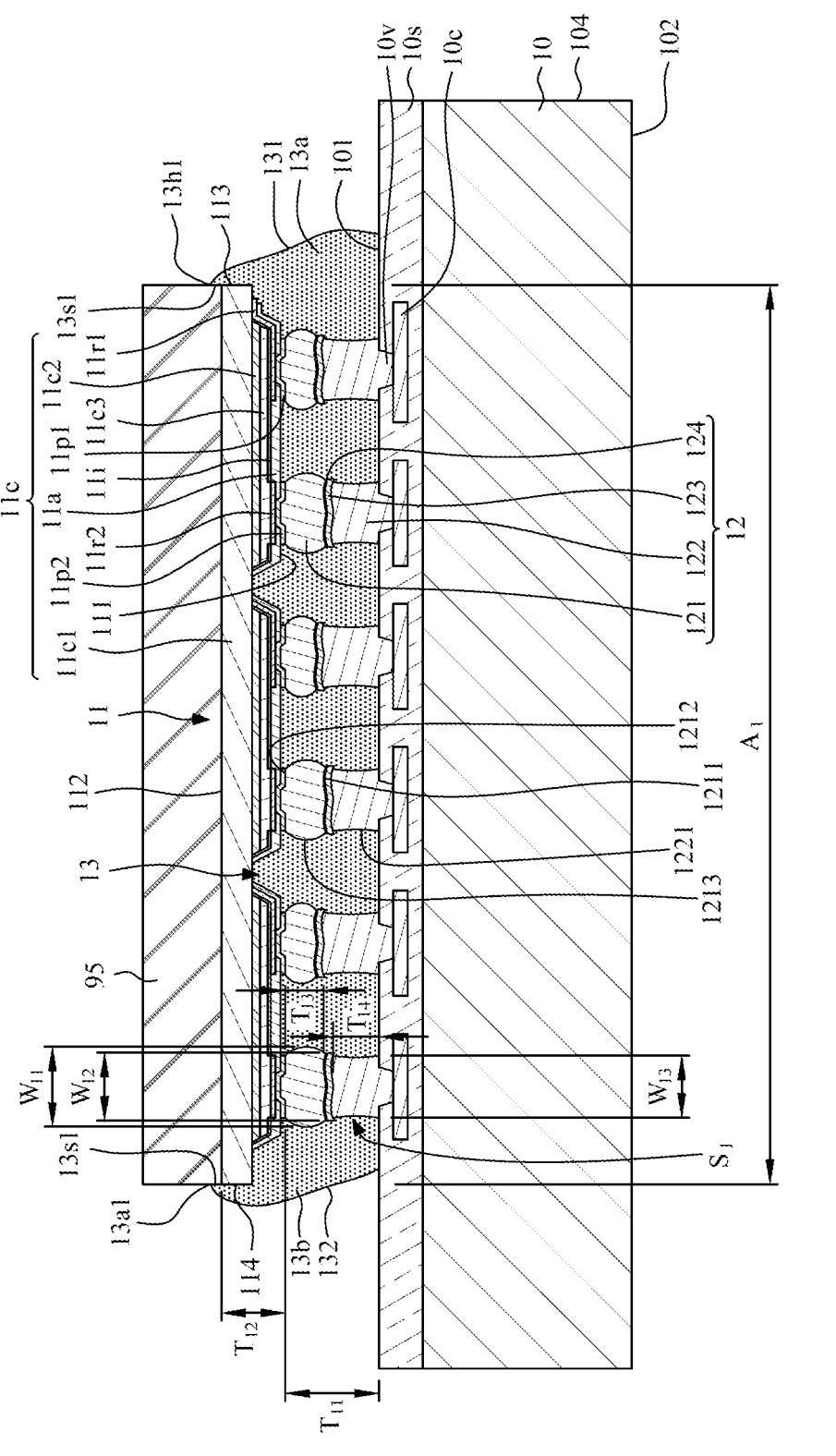
FIG. 1K illustrates one or more stages of an example of a method for manufacturing a package structure according to some embodiments of the present disclosure.
Figure 1L:
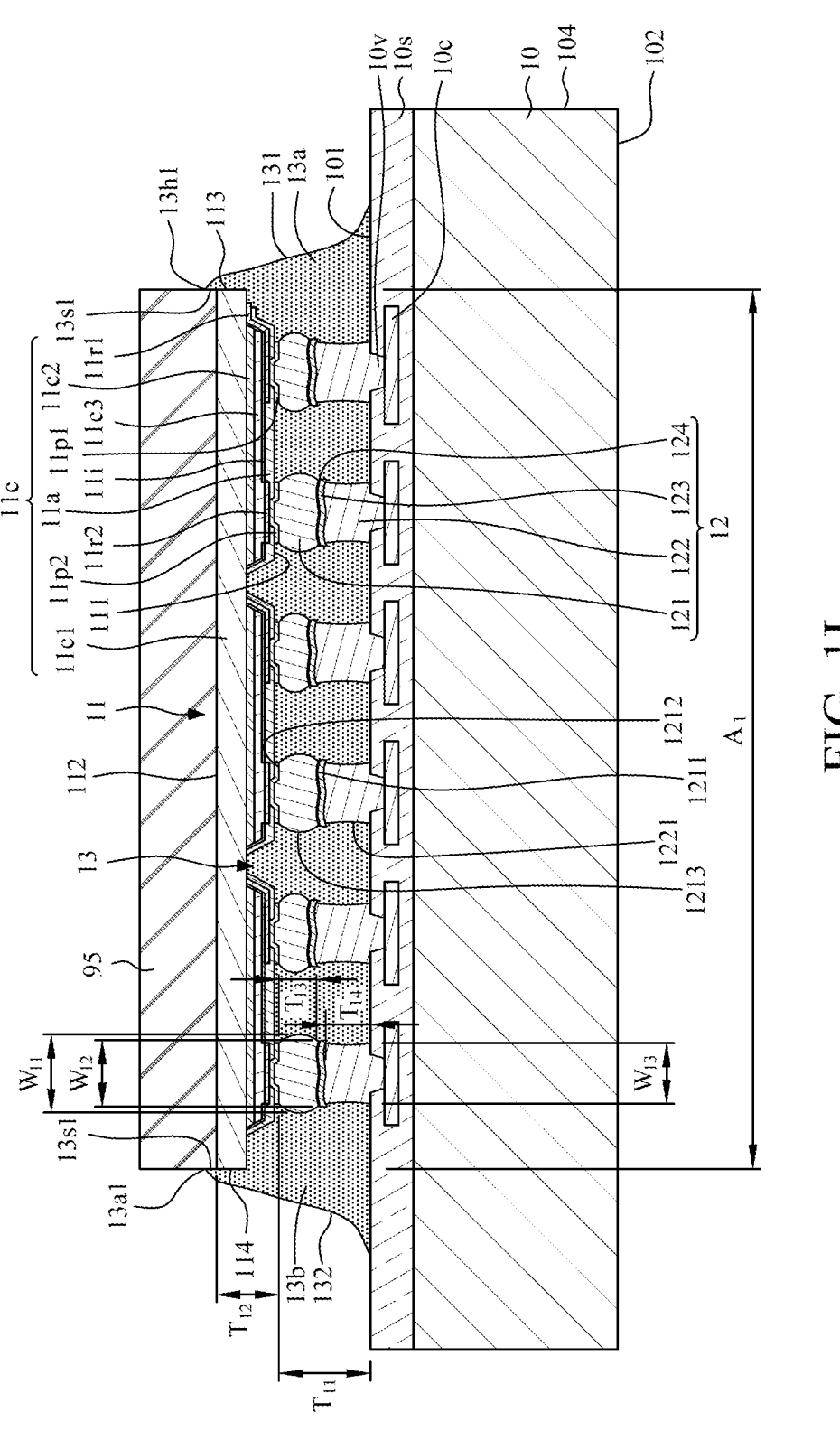
FIG. 1L illustrates one or more stages of an example of a method for manufacturing a package structure according to some embodiments of the present disclosure.
Figure 1M:
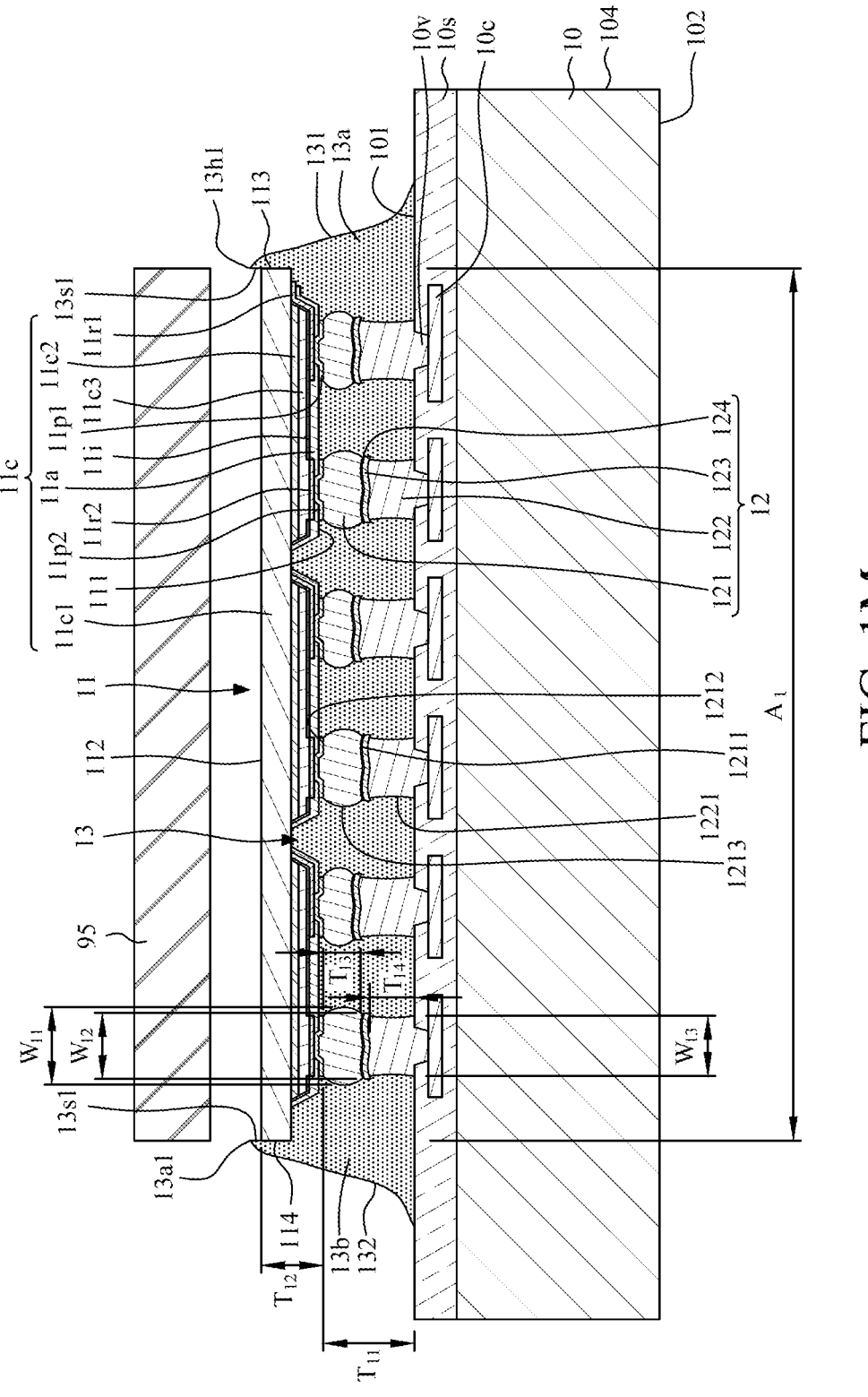
FIG. 1M illustrates one or more stages of an example of a method for manufacturing a package structure according to some embodiments of the present disclosure.

FIG. 1K through FIG. 1M illustrates a method for manufacturing a semiconductor package structure according to some embodiments of the present disclosure. The initial several stages of the method corresponding to FIG. 1K through FIG. 1M are the same as, or at least similar to, the stages illustrated in FIG. 1D through FIG. 1G. FIG. 1K depicts a stage subsequent to that depicted in FIG. 1D. In some embodiments, the method is for manufacturing the package structure 100B shown in FIG. 1B.

Referring to FIG. 1K, the application of the underfill 13 may be finished and the underfill 13 is flowable or at the flow stage. The highest end of the underfill 13 may be higher than the surface 112 of the electronic device 11 with respect to the surface 101 of the substrate 10.

Referring to FIG. 1L, the underfill 13 is cured in a thermal process. The shape of the underfill 13 may be altered because of the reflow happening in the curing process. In other words, the underfill 13 may shrink because of the thermal process. In other words, the underfill 13 may shrink because of the thermal process. The underfill 13 may have a portion 13a outside of a projection area A1 of the electronic device 11 on the surface 101 of the substrate 10. The portion 13a of the underfill 13 may creep onto the lateral surfaces 113 and 114 of the electronic device 11. A highest end 13h1 of the portion 13a may be higher than the surface 112 of the electronic device 11.

Referring to FIG. 1M, the carrier 95 is removed from the electronic device 11. A singulation of the substrate 10 may follow to form the package structure 100B shown in FIG.

1B. During the removal of the carrier 95, the excessive portion 13a of the underfill 13 may hook the carrier 95, which would cause a problem during the de-carrier process. The portion 13a may have a ruptured surface 13s1 formed during the de-carrier process of a temporary carrier.

Figure 2A:
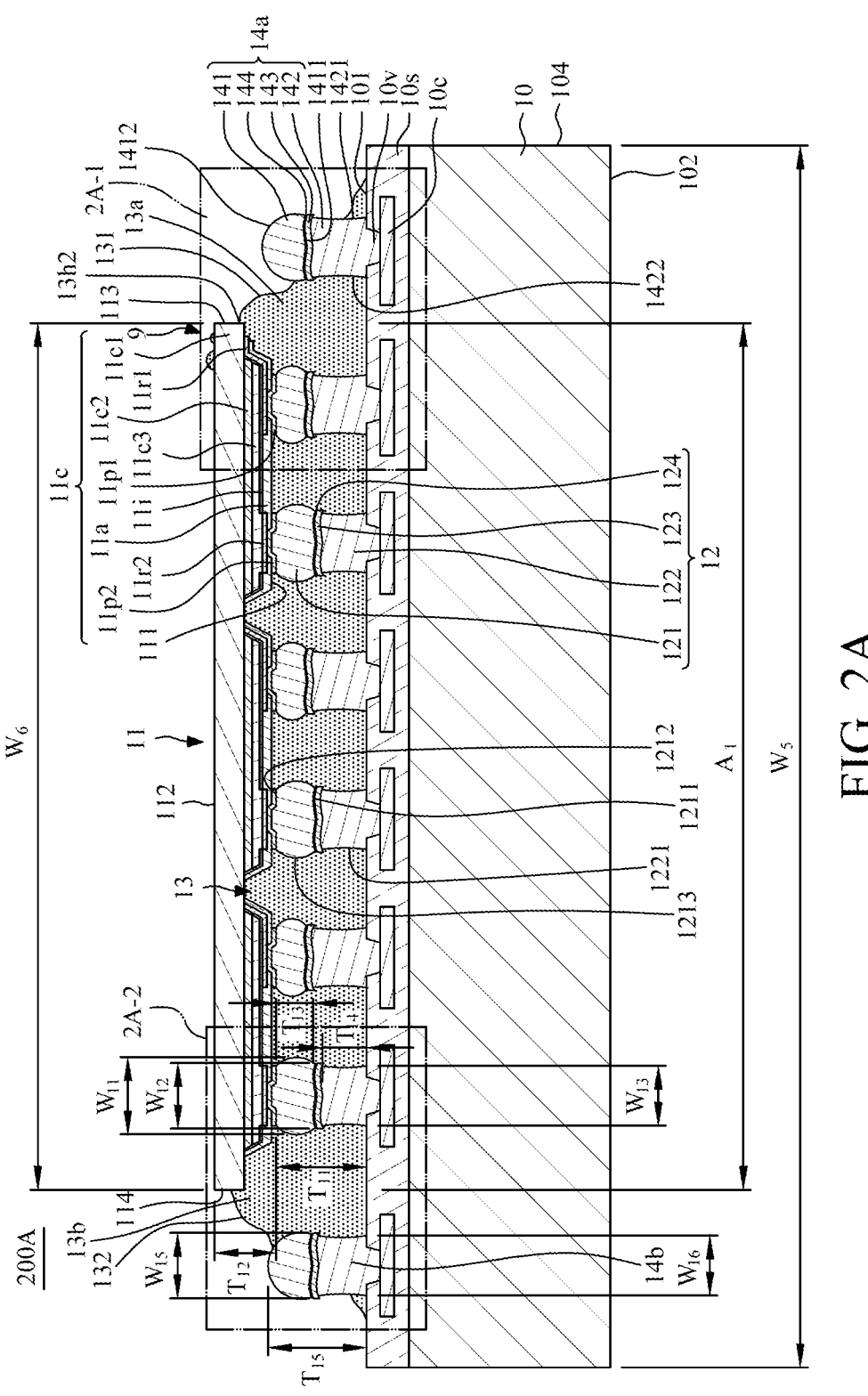
FIG. 2A illustrates a cross-sectional view of a package structure according to some embodiments of the present disclosure.

FIG. 2A illustrates a cross-sectional view of a package structure 200A according to some embodiments of the present disclosure. FIG. 2B illustrates a top view of the package structure 200A of FIG. 2A. The cross-sectional view of the package structure 200A of FIG. 2A is taken along the line 2A-2A' of FIG. 2B.

The package structure 200A may include a substrate 10, an electronic device 11, a plurality of connection elements 12, an underfill 13, an underfill guide structure 14a, and an underfill guide structure 14b. The underfill guide structure 14a may be a first underfill guide structure 14a, and may include a first protrusion 14a or a first pillar 14a. The underfill guide structure 14b may be a second underfill guide structure 14b, and may include a second protrusion 14b or a second pillar 14b. Alternatively, an underfill guide structure may include the underfill guide structure 14a and the underfill guide structure 14b.

The substrate 10 may have a surface (or an upper surface) 101 facing the electronic device 11 and a surface (or a bottom surface) 102 opposite to the surface 101. The substrate 10 may have a lateral surface 104 extending between the surfaces 101 and 102. The substrate 10 may include an interposer. The substrate 10 of the package structure 200A may be similar or identical to the substrate 10 of the package structure 100A.

The electronic device 11 may be disposed over the surface 101 of the substrate 10. The electronic device 11 may have a surface (or a lower surface) 111 facing the substrate 10 and a surface (or an upper surface) 112 opposite to the surface 111. The electronic device 11 of the package structure 200A may be similar or identical to the electronic device 11 of the package structure 100A, as including a plurality of semiconductor devices 11c, a plurality of redistribution layers (RDL) 11r1 and 11r2, and a plurality of conductive pads 11p1 and 11p2. The surface 111 of the electronic device 11 and the surface 101 of the substrate 10 may collectively define a gap G11 therebetween. A width W5 of the substrate 10 is greater than a width W6 of the electronic device 11.

The connection elements 12 may be disposed between the electronic device 11 and the substrate 10. The connection elements 12 may be disposed over the surface 101 of the substrate 10. The connection elements 12 may be electrically connected to the substrate 10 (or the conductive vias 10v and/or the conductive layer 10c). The connection elements 12 of the package structure 200A may be similar or identical to the connection elements 12 of the package structure 100A, as including the solder 121, the conductive pillar 122, the first portion 123, and the second portion 124.

As shown in FIG. 2B, the connection elements 12 may form an array. The connection elements 12 may each have a width (or diameter) $W_1$. The connection elements 12 may have a pitch $P_1$, which can be defined by a first edge of one connection element 12 to a second edge of the most-adjacent connection element 12, and the second edge faces away from the first edge.

The underfill 13 may be disposed between the substrate 10 and the electronic device 11. The underfill 13 of the package structure 200A may be similar or identical to the underfill 13 of the package structure 100A.

The conductive pillars 122 of the connection element 12 is farther away from the semiconductor devices 11c, such that the conductive pillars 122 can be referred to as "inverted conductive pillars" with respect to those formed on a larger wafer. That is to say, the "inverted conductive pillars" 122 can solve the issue of the small wafer not being compatible with the bumping process.

In some embodiments, a residue 9 of adhesive material may be disposed over the surface 112 of the electronic device 11. The residue may be at the edge of the surface 112. The residue may be formed during a de-carrier process of a temporary carrier. In some embodiments, there is no residue over the surface 112.

The underfill guide structure 14a may be disposed on the surface 101 of the substrate 10. The underfill guide structure 14a is disposed outside of a projection area (e.g., a vertical projection) A1 of the electronic device 11 on the surface 101 of the substrate 10. The underfill guide structure 14a is closer to the lateral surface 113 of the electronic device 11 than the lateral surface 114 of the circuit structure. The underfill guide structure 14a may be disposed over the surface 101 of the substrate 10. The underfill guide structure 14a may horizontally overlap the gap G11 between the substrate 10 and the electronic device 11.

In some embodiments, the underfill guide structure 14a may be a dummy. That is, the underfill guide structure 14a may have no electrical function, and may not be used for transmitting signals. In addition, the size and structure of the underfill guide structure 14a may be similar to or the same as the size and structure of the connection elements 12, and they may be formed in the same process. The underfill guide structure 14a and the connection elements 12 may differ in that a solder 141 of the underfill guide structure 14a is not connected to a conductive pad, resulting in the solder 141 having a round upper part.

A thickness $T_{15}$ of the underfill guide structure 14a in a direction perpendicular to the surface 101 is greater than a thickness $T_{12}$ of the electronic device 11 in the direction perpendicular to the surface 101. Furthermore, thickness $T_{15}$ is greater than a thickness of the pad 11p1 of the electronic device 11. The thickness $T_{15}$ may be greater than the gap G11 between the substrate 10 and the electronic device 11. The thickness $T_{15}$ may be greater than a thickness $T_{11}$ of the connection elements 12 in the direction perpendicular to the surface 101. The underfill guide structure 14a may include a solder 141 and a conductive pillar 142 (e.g., a first metal) connected to the solder 141. The conductive pillar 142 may be disposed over the substrate 10. The solder 141 is farther away from the substrate 10 than the conductive pillar 142 is. The solder 141 may have a surface 1411 connected to the conductor pillar 142 and a round surface 1412 opposite to the surface 1411 and exposed by the underfill 13. The conductive pillar 142 is closer to the substrate 10 than the solder 141 is. The conductive pillar 142 may have a curved lateral surface (or a first sidewall) 1421. The curved lateral surface 1421 of the conductive pillar 142 may be concave, i.e., the width of a middle part of the conductive pillar 142 is smaller than that of a bottom part/upper part of the conductive pillar 142. The conductive pillar 142 and the conductive via 10v may be formed in the same process and integrally as a monolithic structure.

The thickness $T_{11}$ may be larger than or equal to 10 μm, 15 μm, 20 μm, 25 μm, 30 μm, or more. The thickness $T_{12}$ may be in a range from 5 μm to 10 μm.

The underfill guide structure 14a may further include a first portion 143 (e.g., a second metal) and a second portion 144 disposed between the solder 141 and the conductive pillar 142. The underfill guide structure 14a may include a pillar that includes a first metal (e.g., the conductive pillar 142) and the second metal (e.g., the first portion 143)

disposed on the first metal. A lateral surface 1421 of the first metal (e.g., the conductive pillar 142) is recessed from a lateral surface of the second metal (e.g., the first portion 143). The first portion 143 may be disposed on the conductive pillar 142, and may include a first metal such as nickel. The second portion 144 may be disposed on the first portion 143, and may include a second metal such as SnAg alloy. The conductive pillar 142 may include a third metal such as copper. The solder 141 may include a fourth metal such as Sn. A width $W_{15}$ of the first portion 143 is greater than a width $W_{16}$ of the conductive pillar 142.

The underfill guide structure 14a may be configured to reduce an extension of the portion 13a of the underfill 13 along the lateral surface 113 of the electronic device 11. The underfill guide structure 14a may be configured to increase a contact area between the portion 13a and the surface 101 of the substrate 10. The underfill 13 may be in contact with the underfill guide structure 14a. The underfill 13 may extend beyond the underfill guide structure 14a along a direction substantially parallel with the surface 101 of the substrate 10. The underfill guide structure 14a is configured to enlarge a contact area between the underfill 13 and the substrate 10. The underfill guide structure 14a is configured to increase or facilitate a horizontal distribution (or horizontal extension) of the portion 13a of the underfill 13 on the surface 101 of the substrate 10 and suppress a vertical distribution (or vertical extension) of the underfill 13 on the lateral surface 113 of the electronic device 11.

Figure 3A:
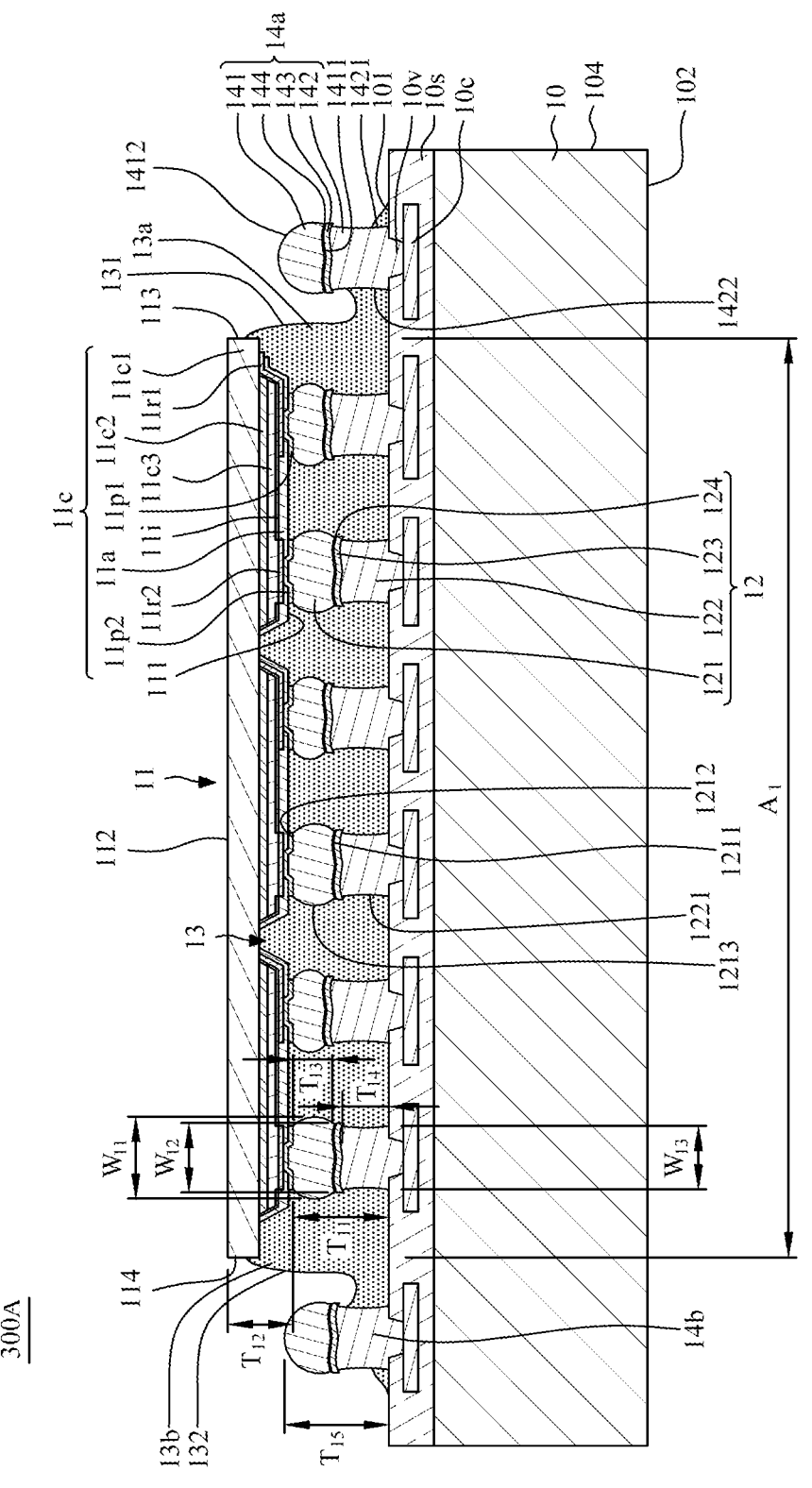
FIG. 3A illustrates a cross-sectional view of a package structure according to some embodiments of the present disclosure.
Figure 3B:
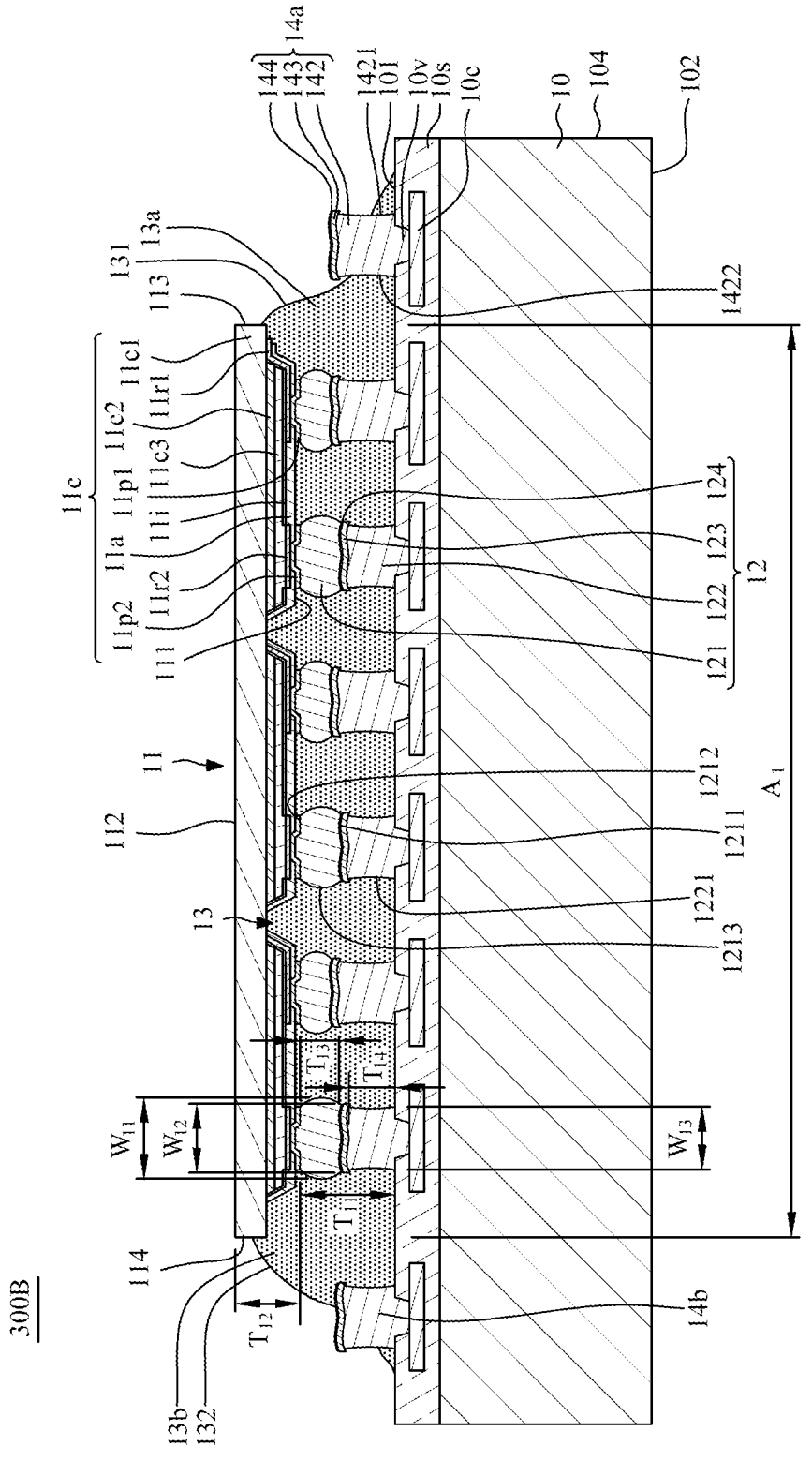
FIG. 3B illustrates a cross-sectional view of a package structure according to some embodiments of the present disclosure.
Figure 3C:
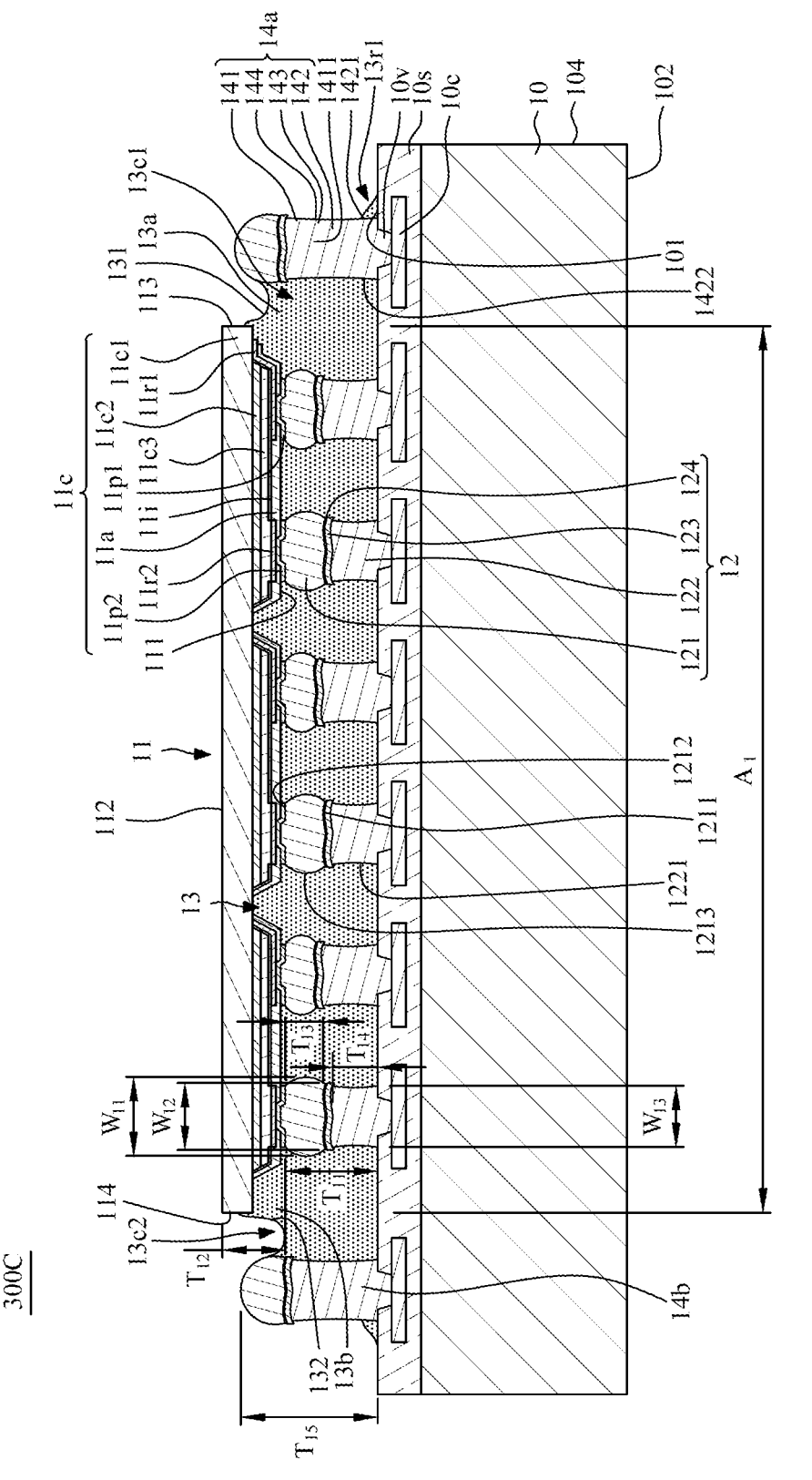
FIG. 3C illustrates a cross-sectional view of a package structure according to some embodiments of the present disclosure.
Figure 3D:
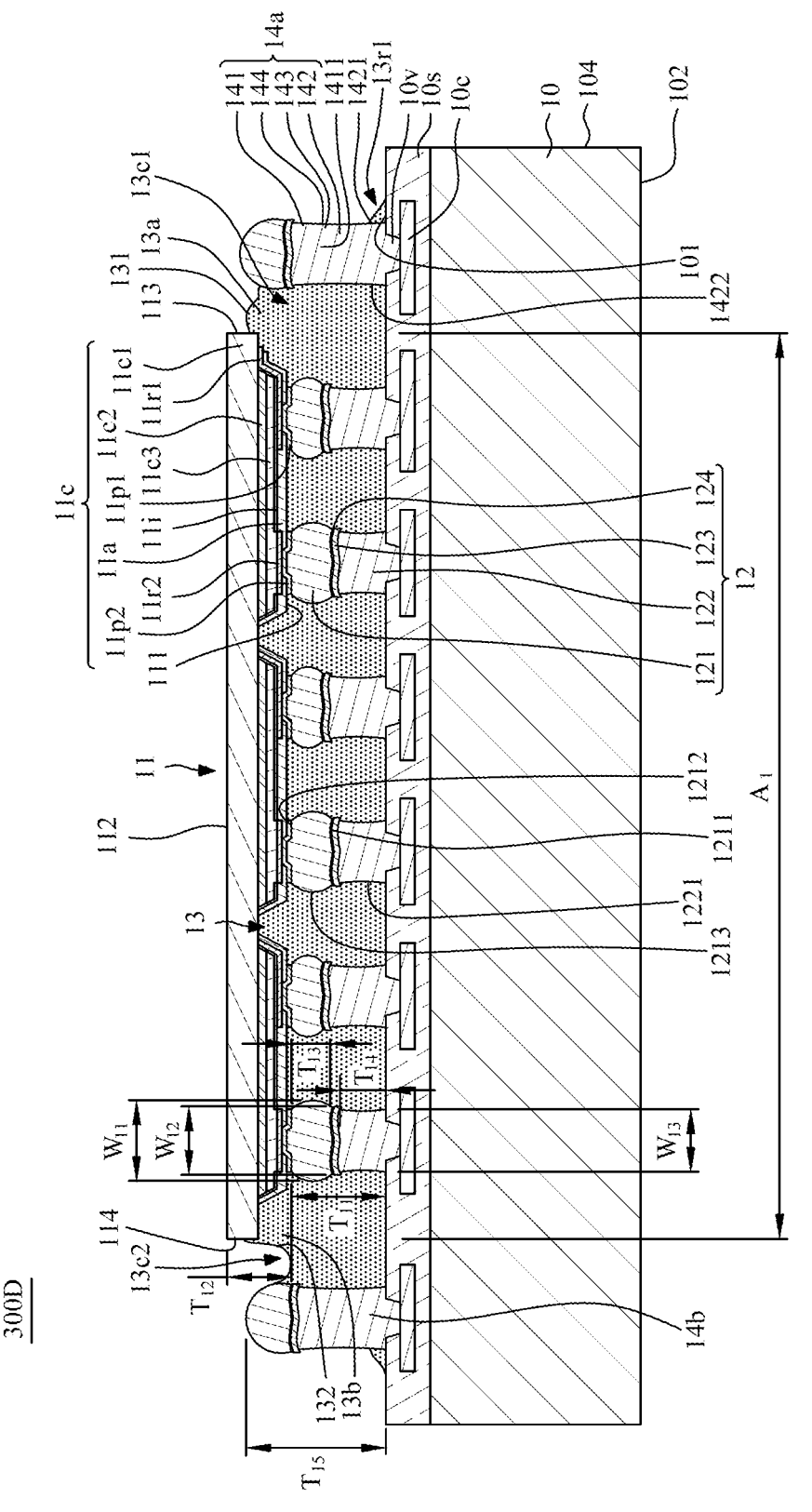
FIG. 3D illustrates a cross-sectional view of a package structure according to some embodiments of the present disclosure.
Figure 3E:
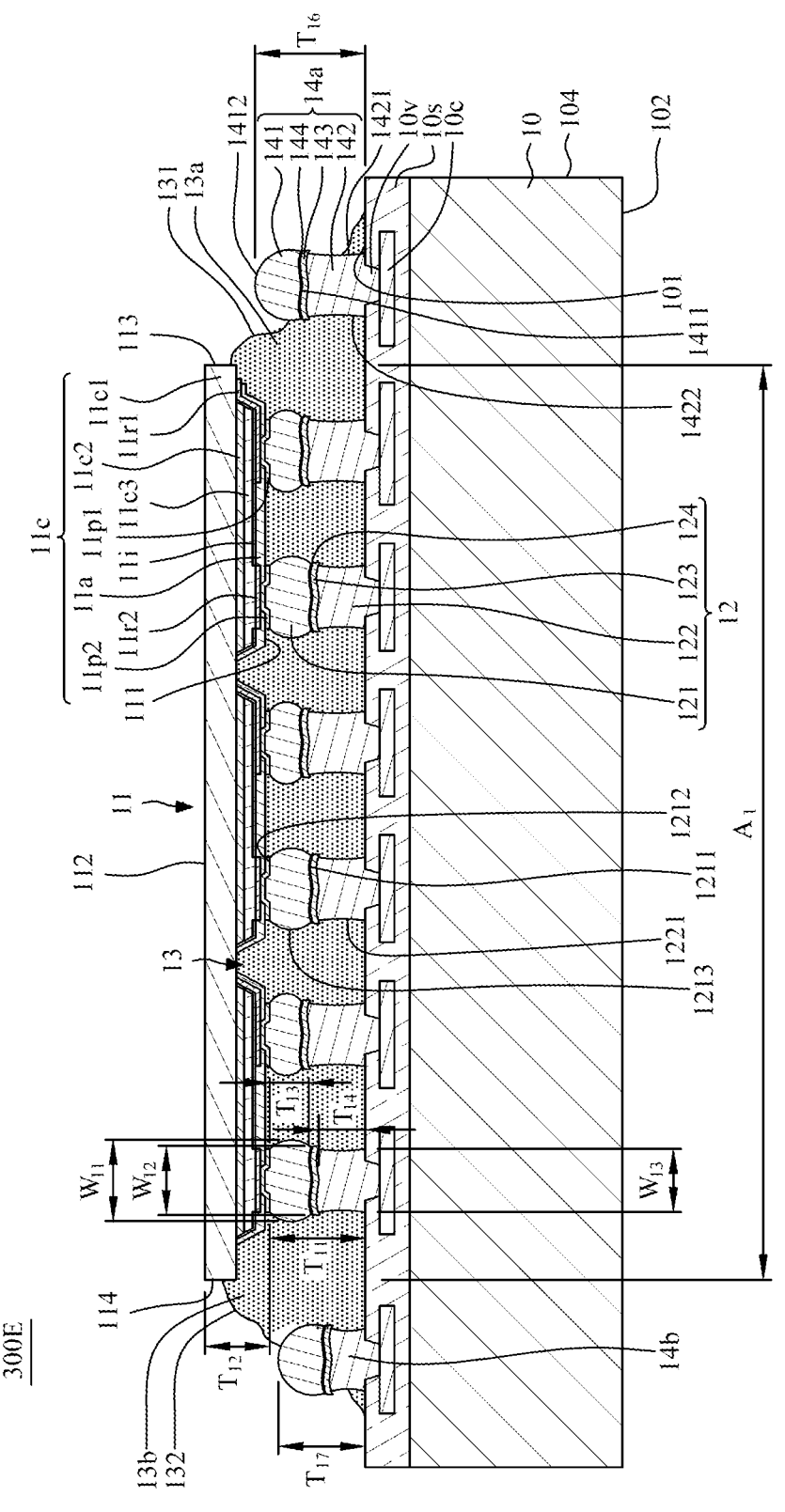
FIG. 3E illustrates a cross-sectional view of a package structure according to some embodiments of the present disclosure.
Figure 3F:
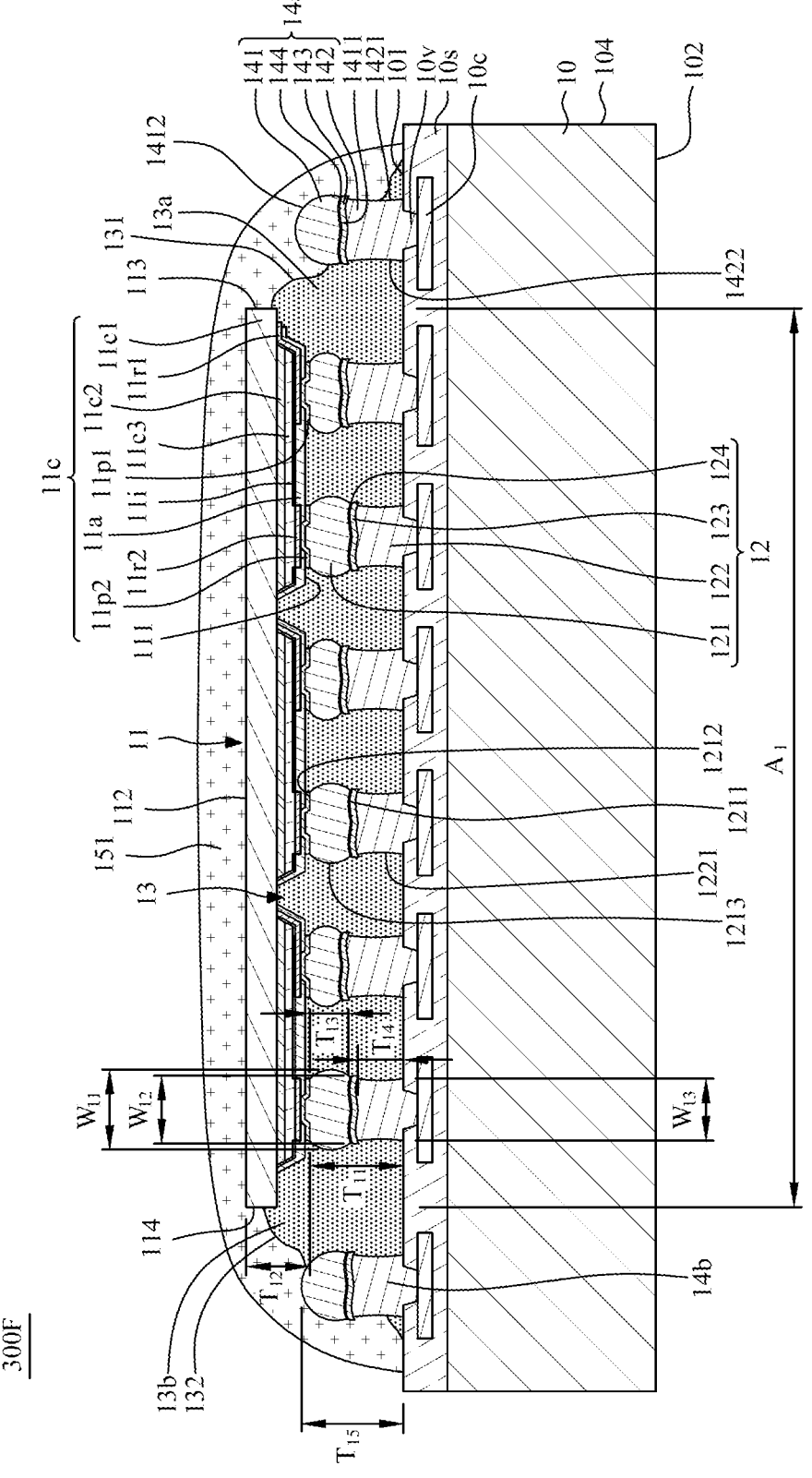
FIG. 3F illustrates a cross-sectional view of a package structure according to some embodiments of the present disclosure.
Figure 3G:
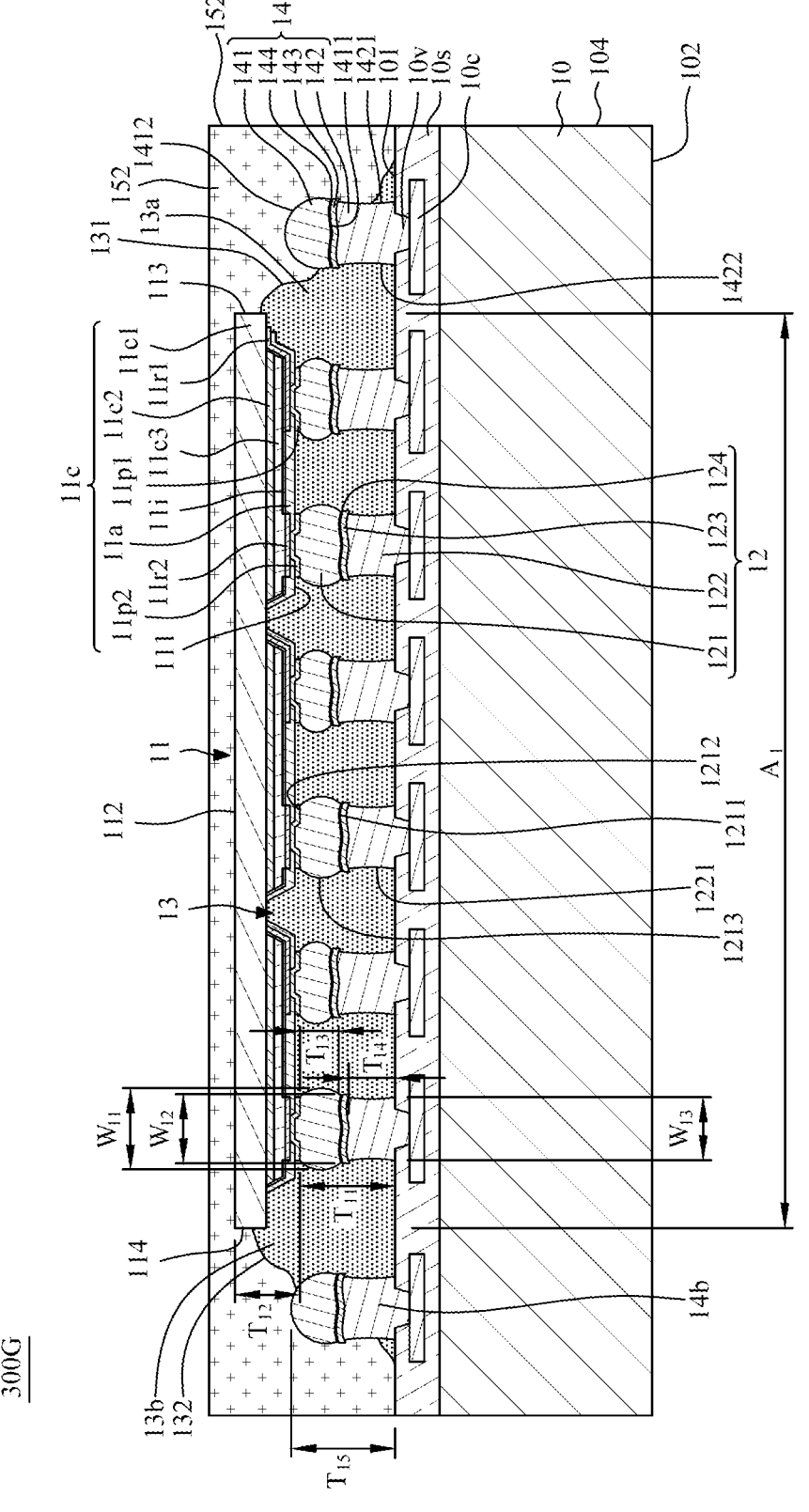
FIG. 3G illustrates a cross-sectional view of a package structure according to some embodiments of the present disclosure.
Figure 3H:
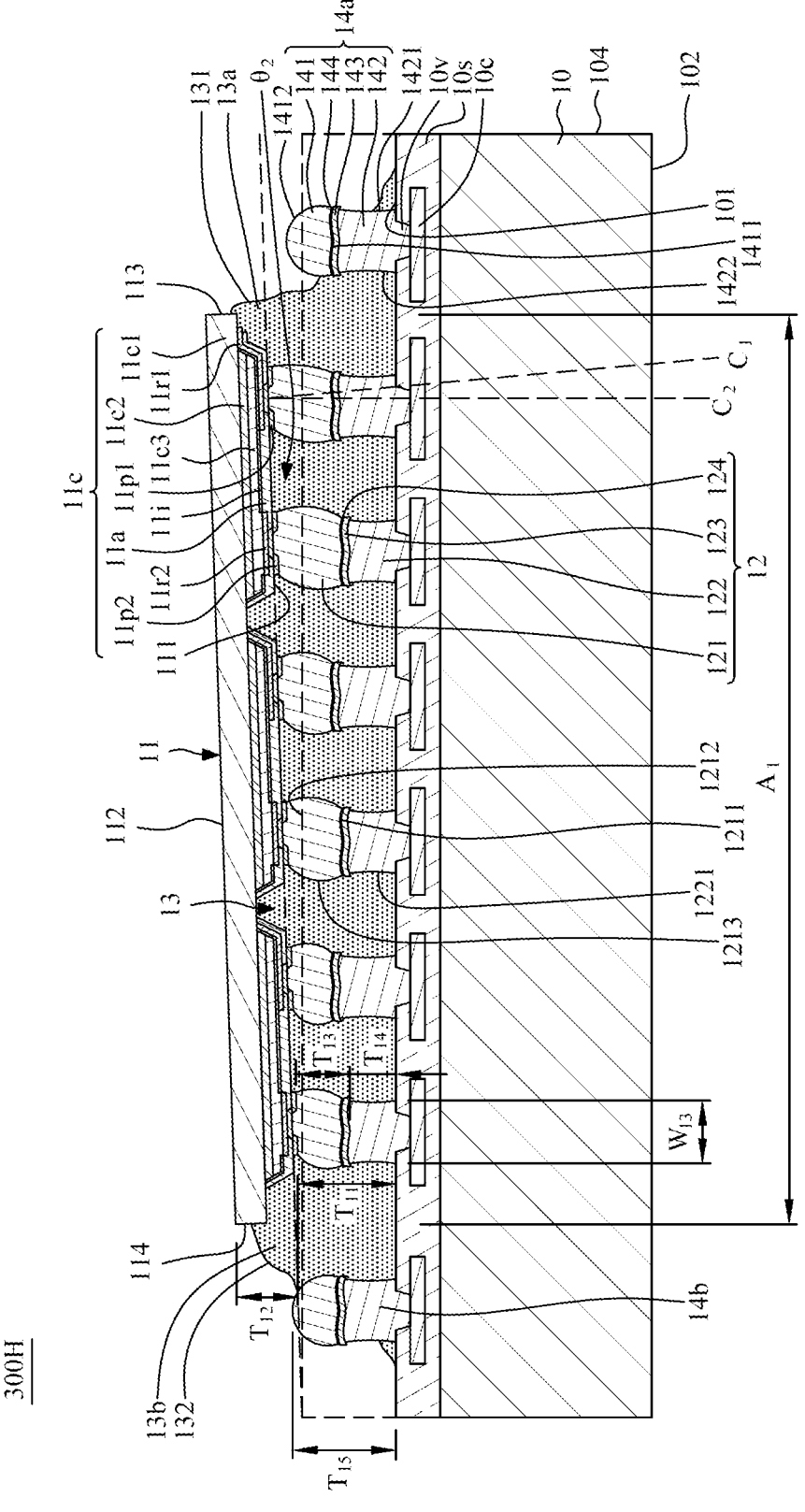
FIG. 3H illustrates a cross-sectional view of a package structure according to some embodiments of the present disclosure.
Figure 3I:
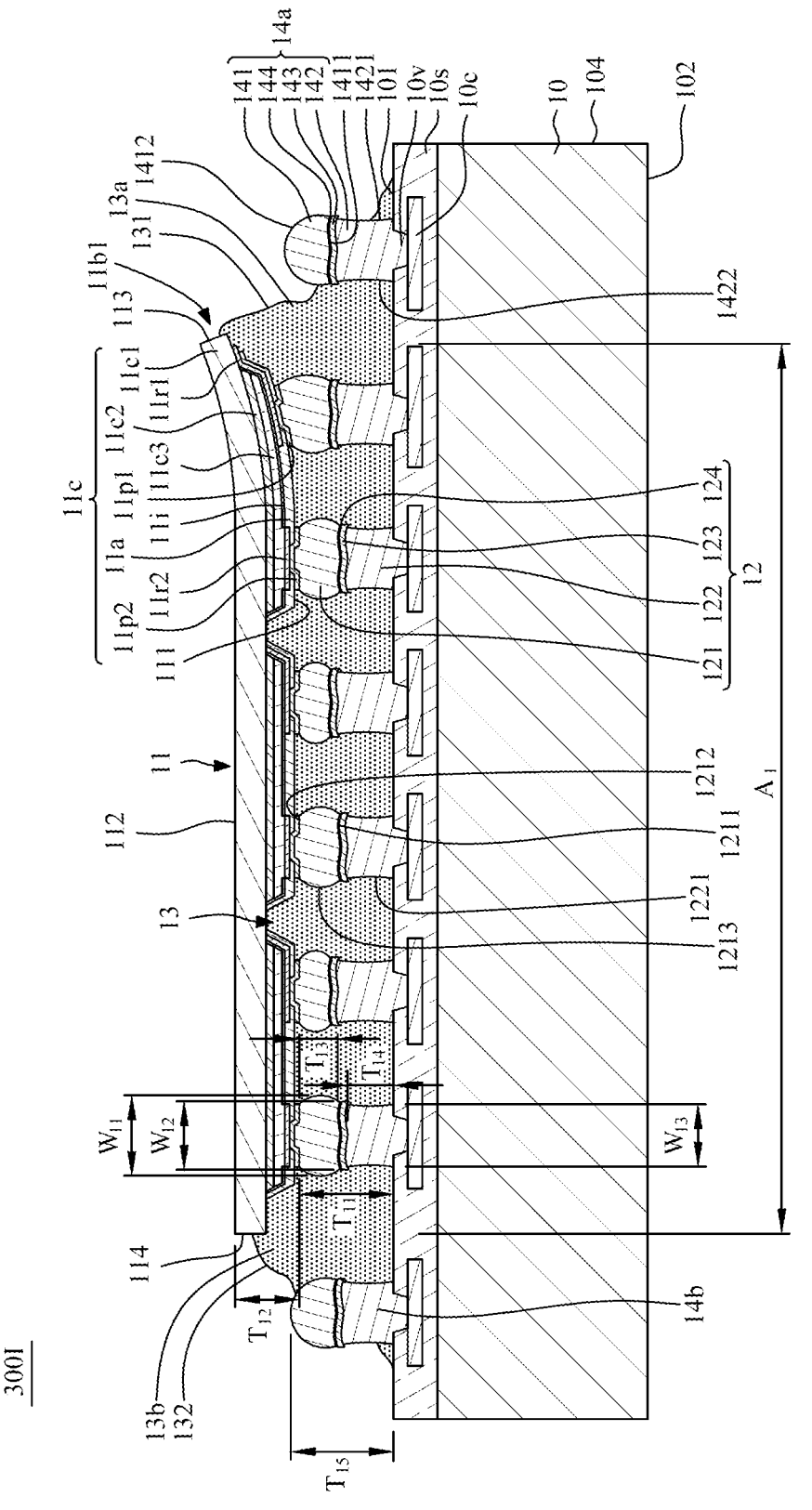
FIG. 3I illustrates a cross-sectional view of a package structure according to some embodiments of the present disclosure.
Figure 3J:
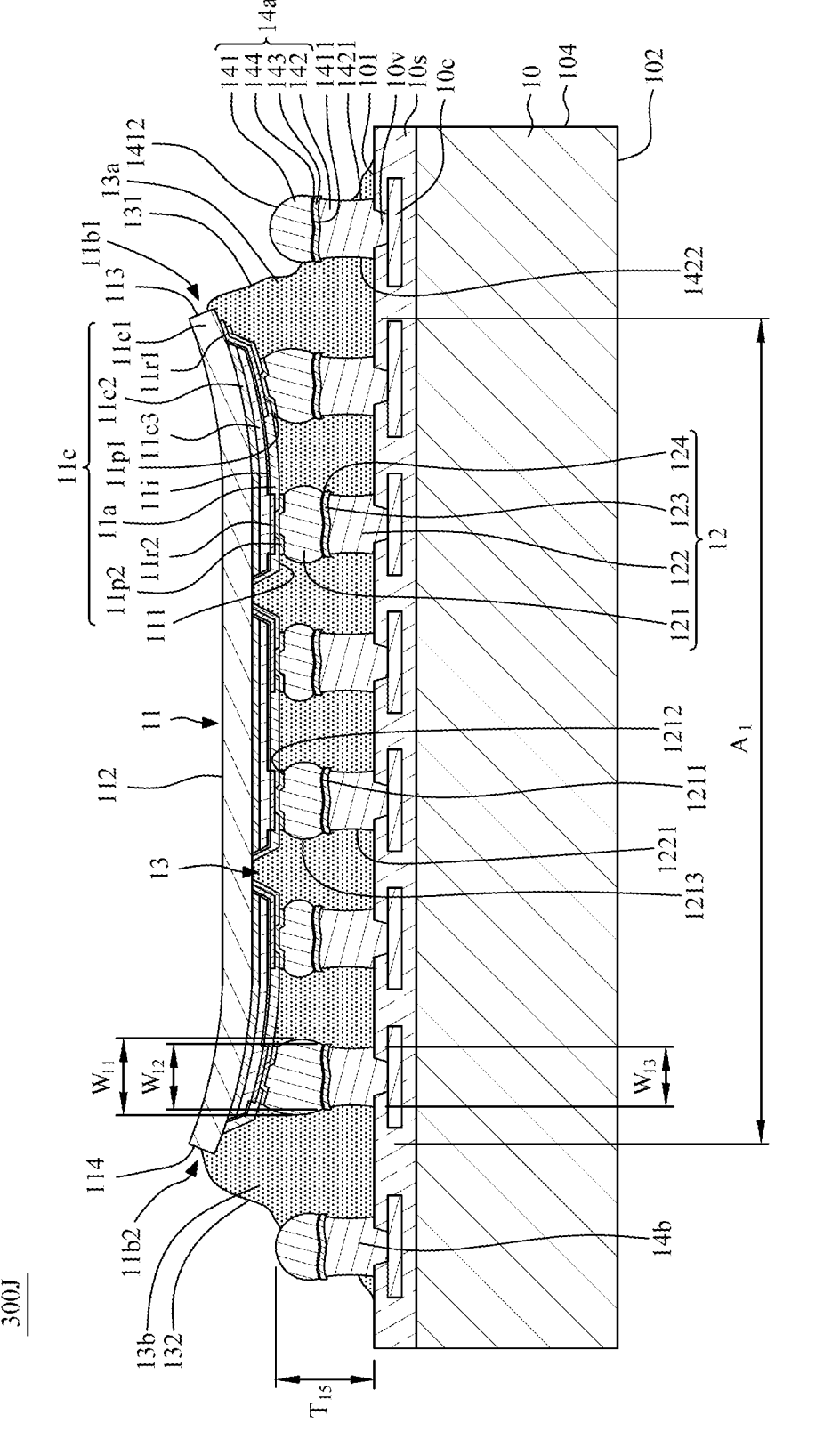
FIG. 3J illustrates a cross-sectional view of a package structure according to some embodiments of the present disclosure.

Furthermore, the electronic device 11 may have a warpage (shown in FIG. 3J). That is, the gap G11 may have an inconsistent height or may have varied heights. During the formation of the underfill 13, the uneven heights of the gap G11 may hinder the control of the flow of the underfill 13. The underfill guiding structure 14a may be configured to provide a guiding surface to increase a flow of the underfill 13. As such, the extension of the underfill 13 along the lateral surface 113 of the electronic device 11 can be suppressed.

Figures 1, 2A:
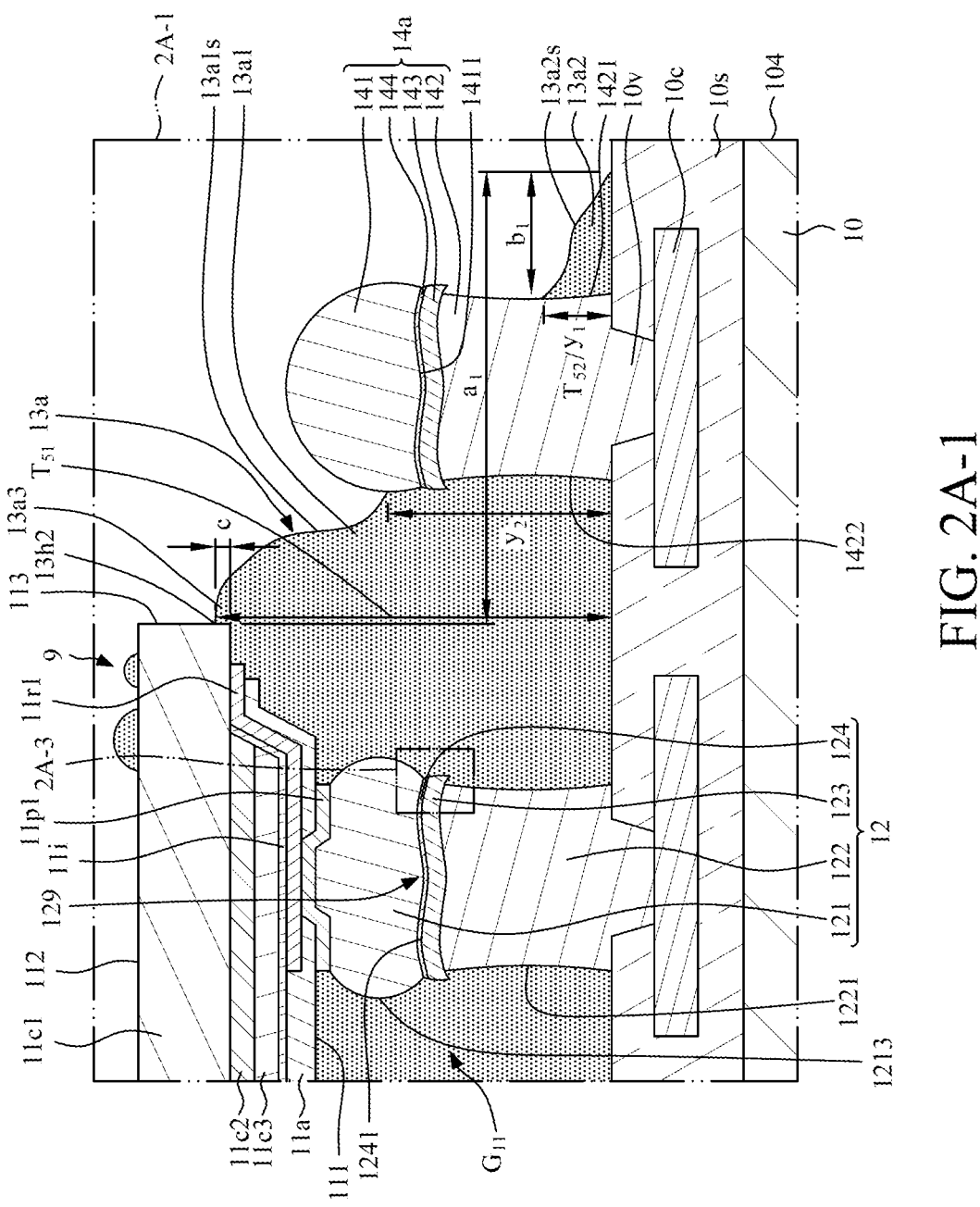

FIG. 2A-1 illustrates an enlarged view of an area "2A-1" of FIG. 2A. FIG. 2A-1 illustrates more details about a portion 13a of the underfill 13 and the underfill guide structure 14a.

The portion 13a of the underfill 13 may be also referred to as "a first portion 13a of the underfill 13". The first portion 13a of the underfill 13 may be disposed outside of the projection area (or the vertical projection) A1 of the electronic device 11 on the surface 101 of the substrate 10. In a cross section, a first length a1 of the first portion 13a along the surface 101 of the substrate 10 is greater than a second length c of the first portion 13a in contact with the lateral surface 113 of the electronic device 11. The first portion 13a of the underfill 13 may include a first inner part (or a first part) 13a1 and a first outer part (or a second part) 13a2 separated from the first inner part 13a1 by the underfill guide structure 14a. A curvature of a surface 13a1s of the first inner part 13a1 may be discontinuous with a curvature of a surface 13a2s of the first outer part 13a2. The portion 13a may have the surface (or a top surface) 13a1s and the surface 13a2s. The first inner part 13a1 is disposed between the electronic device 11 and the underfill guide structure 14a. In the cross-sectional view, a length b1 of a contact surface between the first outer part 13a2 and the substrate 10 is greater than the second length c of the first portion 13a in contact with the lateral surface 113 of the electronic device 11.

In some embodiments, the first portion 13a of the underfill 13 may have a top portion 13a3 disposed between the surface 111 (e.g., top surface) and the surface 112 (e.g., bottom surface) of the electronic device 11.

In some embodiments, in a cross section, the underfill guide structure 14a has a second sidewall 1422 opposite to the first sidewall 1421. In a cross section, a first contact length y1 of the first outer part 13a2 of the underfill 13 at the first sidewall 1421 is different from a second contact length y2 of the first inner part 13a1 of the underfill 13 at the second sidewall 1422. The first contact length y2 may be greater than the second contact length y1. In some embodiments, a first height (e.g., the second contact length y2) of a first contact surface between the first part 13a1 and the protrusion 14a is greater than a second height (e.g., the first contact length y1) of a second contact surface between the second part 13a2 and the first protrusion 14a.

In addition, an upper surface 1241 of the second portion 124 may define a recess 129, and the solder 121 may extend into the recess 129.

Referring back to FIG. 2A, the underfill guide structure 14b (e.g., the second protrusion 14b) is disposed outside of a projection area (or a vertical projection) A1 of the electronic device 11 on the surface 101 of the substrate 10. The underfill guide structure 14b may horizontally overlap the gap G11 between the substrate 10 and the electronic device 11. The underfill 13 may extend between the first protrusion 14a and the second protrusion 14b. The underfill guide structure 14b is closer to the lateral surface 114 of the electronic device 11 than the lateral surface 113 of the circuit structure. The underfill guide structure 14b may be disposed over the surface 101 of the substrate 10. The underfill guide structure 14b is opposite to the underfill guide structure 14a with respect to the electronic device 11. The size and structure of the underfill guide structure 14b may be similar to or the same as the size and structure of the underfill guide structure 14a, and they may be formed in the same process. For example, the underfill guide structure 14b may include the solder 141, the conductive pillar 142, the first portion 143, and the second portion 144. The underfill guide structure 14b may have the surfaces 1411 and 1412, and the sidewalls 1421 and 1422.

In some embodiments, the underfill guide structure 14b may be a dummy. That is, the underfill guide structure 14b may have no electrical function, and may not be used for transmitting signals. In addition, the size and structure of the underfill guide structure 14b may be similar to or the same as the size and structure of the connection elements 12, and they may be formed in the same process. The underfill guide structure 14b and the connection elements 12 may differ in that the solder 141 of the underfill guide structure 14b is not connected to a conductive pad, resulting in the solder having a round upper part.

The underfill guide structure 14b may be configured to reduce an extension of the portion 13b of the underfill along the lateral surface 114 of the electronic device 11. The underfill guide structure 14b may be configured to increase a contact area between the portion 13b and the surface 101 of the substrate 10. The underfill 13 may be in contact with the underfill guide structure 14b. The underfill guide structure 14b may be configured to affect the distribution of the underfill 13 in a similar way to the underfill guide structure 14a. The underfill 13 may extend beyond the underfill guide structure 14b along a direction substantially parallel with the surface 101 of the substrate 10. The underfill guide structure 14b is configured to enlarge a contact area between the underfill 13 and the substrate 10. The underfill guide structure 14b is configured to increase or facilitate a horizontal distribution (or horizontal extension) of the portion 13b of the underfill 13 on the surface 101 of the substrate 10 and suppress a vertical distribution (or vertical extension) of the underfill 13 on the lateral surface 114 of the electronic device 11.

Figures 2, 2A:
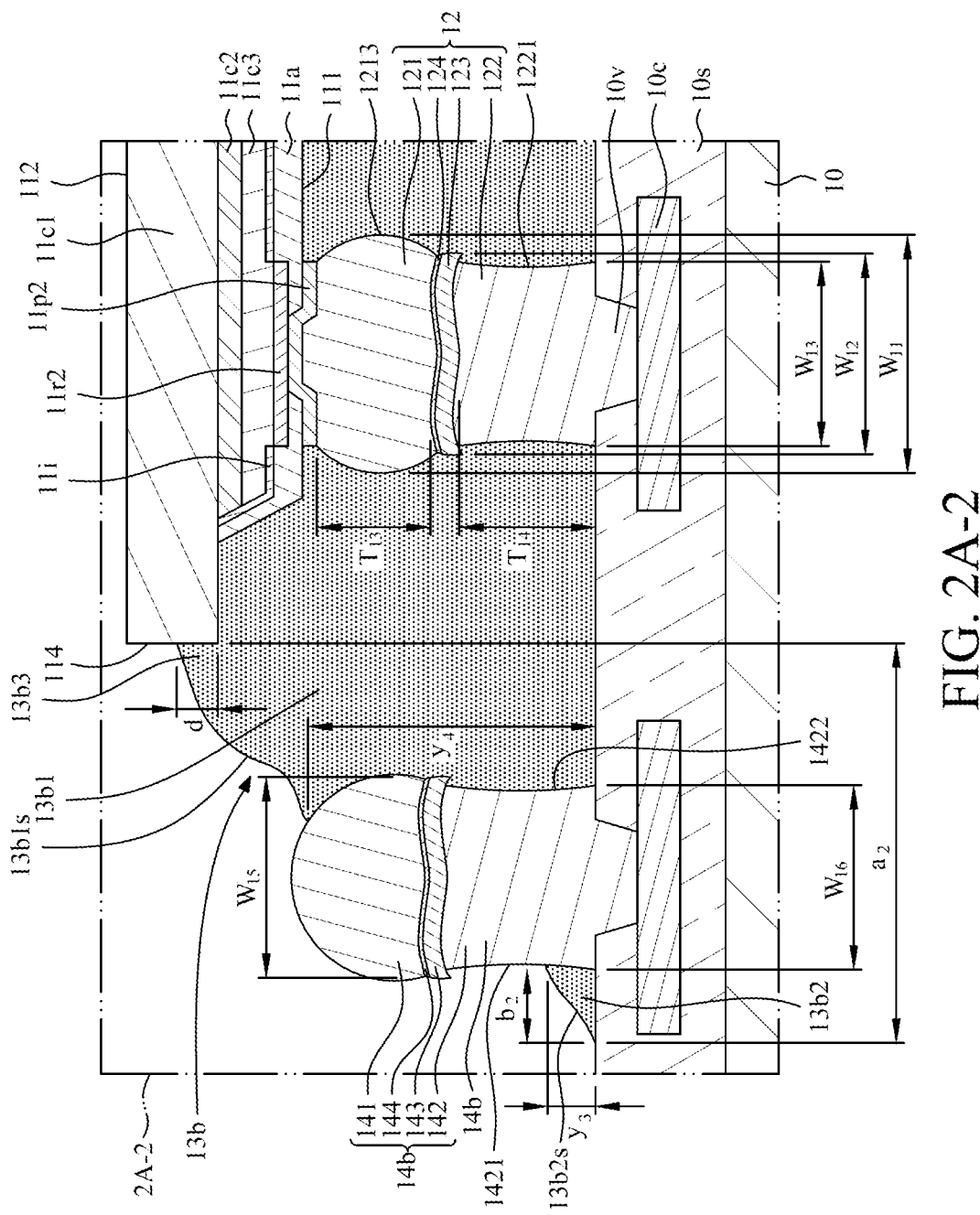

FIG. 2A-2 illustrates an enlarged view of an area "2A-2" of FIG. 2A. FIG. 2A-2 illustrates more details about a portion 13*b* of the underfill 13 and the underfill guide structure 14*b*.

The portion 13*b* of the underfill 13 may be also referred to as "a second portion 13*b* of the underfill 13". The second portion 13*b* of the underfill 13 may be disposed outside of the projection area A1 of the electronic device 11 on the surface 101 of the substrate 10. In a cross section, a first length a2 of the second portion 13*b* along the surface 101 of the substrate 10 is greater than a fourth length d of the second portion 13*b* in contact with the lateral surface 114 of the electronic device 11. The second portion 13*b* of the underfill 13 may include a second inner part 13*b*1 and a second outer part 13*b*2 separated from the second inner part 13*b*1 by the underfill guide structure 14*b*. A curvature of a surface 13*b*1*s* of the second inner part 13*b*1 may be discontinuous with a curvature of a surface 13*b*2*s* of the second outer part 13*b*2. The second inner part 13*b*1 is disposed between the electronic device 11 and the underfill guide structure 14*b*. In the cross-sectional view, a length b2 of a contact surface between the second outer part 13*b*2 of the second portion 13*b* and the substrate 10 is greater than the fourth length d of the second inner part 13*b*1 of the second portion 13*b* in contact with the lateral surface 114 of the electronic device 11.

In some embodiments, the second length c of the first portion 13*a* in contact with the lateral surface 113 of the electronic device 11 is different from the fourth length d of the second portion 13*b* in contact with the lateral surface 114 of the electronic device 11.

The portions 13*a* and 13*b* of the underfill 13 of package structure 300A may be asymmetrical. For example, the highest point of the portions 13*a* and 13*b* may be at different elevations with respect to the surface 101 of the substrate 10. The length a1 of the first portion 13*a* along the surface 101 of the substrate 10 is different from the length a2 of the second portion 13*b* along the surface 101 of the substrate 10. A curvature of the surface 13*a*1*s* is different from that of the surface 13*b*1*s*.

In some embodiments, the second portion 13*b* of the underfill 13 may have a top portion 13*b*3 disposed between the surface 111 (e.g., a top surface) and the surface 112 (e.g., a bottom surface) of the electronic device 11.

In some embodiments, in a cross section, the underfill guide structure 14*b* has a second sidewall 1422 opposite to the first sidewall 1421. In a cross section, a first contact length y3 of the underfill 13 at the first sidewall 1421 is different from a second contact length y4 of the underfill 13 at the second sidewall 1422. The first contact length y4 may be greater than the second contact length y3. In some embodiments, a first height (e.g., the second contact length y4) of a first contact surface between the first part 13*b*1 and the protrusion 14*b* is greater than a second height (e.g., the first contact length y3) of a second contact surface between the second part 13*b*2 and the protrusion 14*b*.

As shown in FIG. 2B, the underfill guide structures 14*a* and 14*b* may collectively include a plurality of protrusions 14 disposed around the electronic device 11. Each of the protrusions 14 may be outflanked by the underfill 13. Each of the protrusions 14 may include the solder 141, the conductive pillar 142, the first portion 143, and the second portion 144. The underfill 13 may extend between a first protrusion and a second protrusion of the protrusions 14. The underfill 13 may extend through a gap between at least two of the plurality of protrusions 14. The protrusions 14 may have a width (or diameter) $W_2$ in the top view. The protrusions 14 may have a pitch $P_2$. The width $W_2$ of the protrusions 14 may be substantially the same as the width $W_1$ of the connection elements 12. The pitch $P_1$ of the connection elements 12 may be substantially the same as the pitch $P_2$ of the protrusions 14.

Referring back to FIG. 2A-1, the first part 13*a*1 may be closer to the gap G11 than the second part 13*a*2 is. A thickness (or the height) $T_{51}$ of the first part 13*a*1 is greater than a thickness (or the height) $T_{52}$ of the second part 13*a*2. The thickness $T_{51}$ of the first part 13*a*1 is greater than a height of the gap G11 between the substrate 10 and the electronic device 11. An elevation of the top surface 13*a*1*s* of the first part 13*a*1 is lower than the top surface 112 of the electronic device 11.

Referring back to FIG. 2A, the cross-sectional view shows one protrusion of the underfill guide structure 14*a*, and said protrusion is referred to using the same numeral 14*a*, for brevity. The protrusion 14*a* may be disposed over the surface 101 of the substrate 10. The protrusion 14*a* may be spaced apart from the electronic device 11. The underfill 13 may be in contact with the protrusion 14*a*. The underfill 13 may define a first concave portion 13*a* outside the projection region A1 of the electronic device 11 on the surface 101 of the substrate 10. The first concave portion 13*a* is recessed from a space between a top portion (e.g., the solder 141) of the protrusion 14*a* and a top portion (e.g., the semiconductor doped layer 11*c*1) of the electronic device 11. In some embodiments, the first concave portion 13*a* opens toward a space between the top portion of the protrusion 14*a* and the top portion of the electronic device 11. In some embodiments, the first concave portion 13*a* may open substantially upward. An outer surface 131 of the first concave portion 13*a* is concave toward a space between the top portion of the protrusion 14 and a top edge (e.g., the lateral surface 113) of the electronic device 11. In some embodiments, the outer surface (or lateral surface) 131 of the first concave portion 13*a* is concave upward. In some embodiments, a central axis of the first concave portion 13*a* extends through a space between the top portion of the protrusion 14 and the top edge of the electronic device 11.

In some embodiments, an elevation of a highest end 13*h*2 (or a highest point) that the first concave portion 13*a* contacts the lateral surface 113 of the electronic device 11 is between the surface 112 of the electronic device 11 and the surface 111 of the electronic device 11.

In some cases, an underfill is filled and cured in a space defined by a carrier and a circuit structure prior to a temporary carrier being removed from the circuit structure. However, the process window for volume control of the underfill may have a limited margin during the underfill dispensing process. For example, a shortage of the volume of the underfill could result in the circuit structure being peeled off from a weak point (normally at the edge of the circuit structure) between the underfill and the circuit structure. For example, the excessive volume of the underfill could creep over the lateral surface of the temporary carrier and thus form fillets (the part of the underfill that adheres the lateral surface of the temporary carrier). The fillets could hook the temporary carrier in the de-carrier process and thus hinder said process. For an instance, it requires more momentum to de-carrier the temporary carrier, which results in pulling the circuit structure into a position with an unacceptable tilting angle.

In the present disclosure, the package structure 200A includes the underfill guide structure 14$a$ and/or 14$b$ disposed outside the projection area A1 of the electronic device 11 on the surface 101 of the substrate 10. The guide structure (or underfill spreading structure) 14$a$ and/or 14$b$ is configured to increase or facilitate a horizontal distribution (or horizontal extension) of the underfill 13 on the surface 101 of the substrate 10 and suppress a vertical distribution (or vertical extension) of the underfill 13 on the lateral surfaces 113 and 114 of the electronic device 11. The underfill guide structure 14$a$ and/or 14$b$ can direct the underfill with the relatively small volume toward the edge (defined by an imaginary line that is aligned with and below the lateral surface 113 or 114) of the electronic device 11 by capillary effect. The underfill guide structure 14$a$ and/or 14$b$ ensures that the portions 13$a$ and 13$b$ of the underfill 13 stay outside the projection area A1. The underfill guide structure 14$a$ and/or 14$b$ alters the distribution of the underfill 13 to support or secure the thin electronic device 11 during the de-carrier process, thus achieving an arrangement of the thin electronic device 11 (the thickness $T_{12}$) with the relatively thick (or taller) connection elements 12 (the thickness $T_{11}$).

In addition, an elevation of the highest points that the portions 13$a$ and 13$b$, in contact with the lateral surfaces 113 and 114 of the electronic device 11, can be between the upper surface 112 and the lower surface 111 of the electronic device 11. Thus, the underfill 13 with the relatively large volume (hindering the de-carrier process if there is no guide structure) would not reach the lateral surface of a temporary carrier. The underfill guide structure 14$a$ and/or 14$b$ enables the process window to be wider because a slightly higher volume of the underfill 13 can be dispensed without the underfill overflowing toward the temporary carrier. The underfill guide structure 14$a$ and/or 14$b$ can hold the underfill 13 in case there is too much fillet, which can jeopardize the de-carrier process. The underfill guide structure 14$a$ and/or 14$b$ ensures good underfill support for the flip-chip bonding process.

Figures 2, 2A, 3:
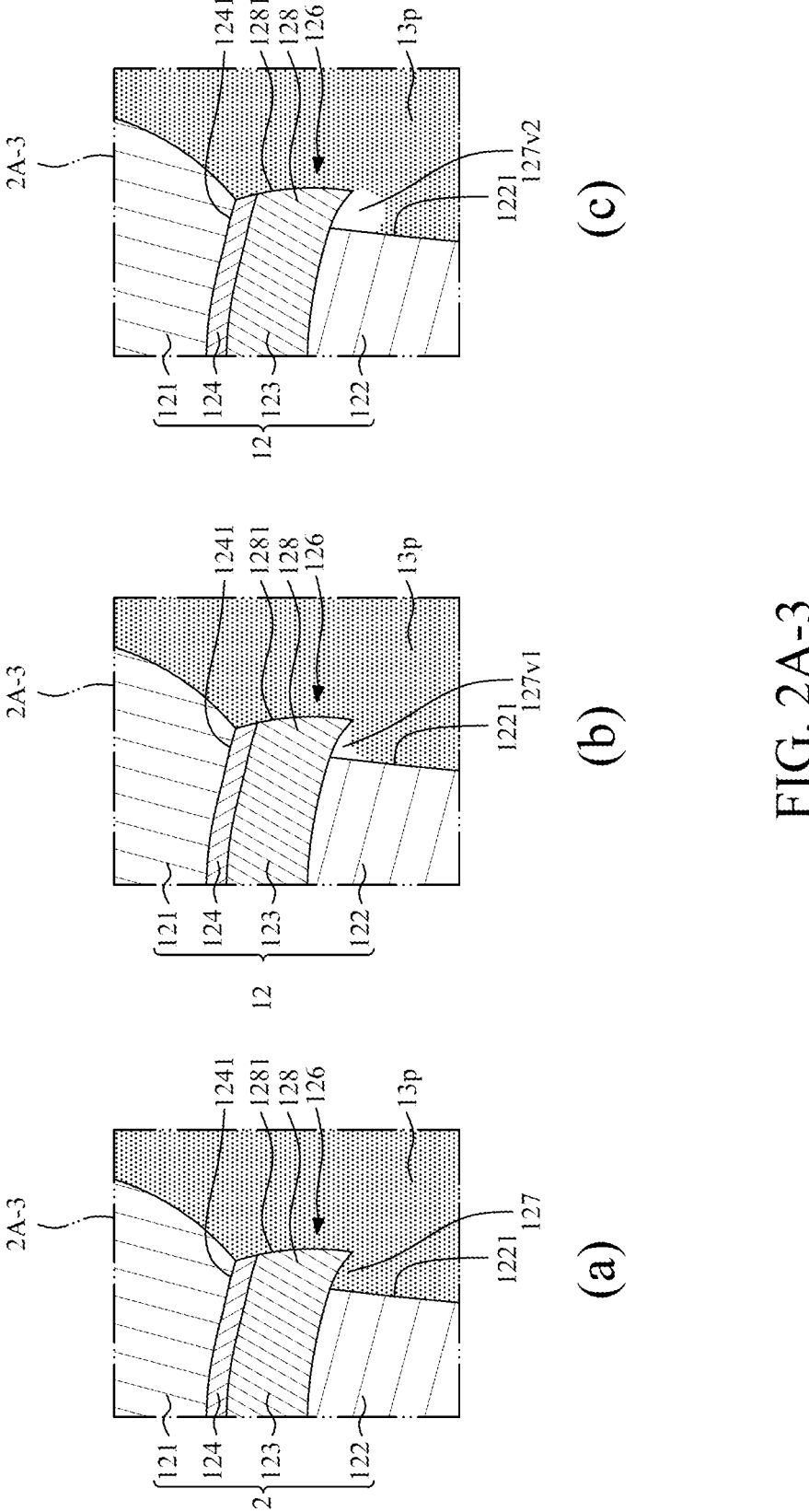
Figure 2B:
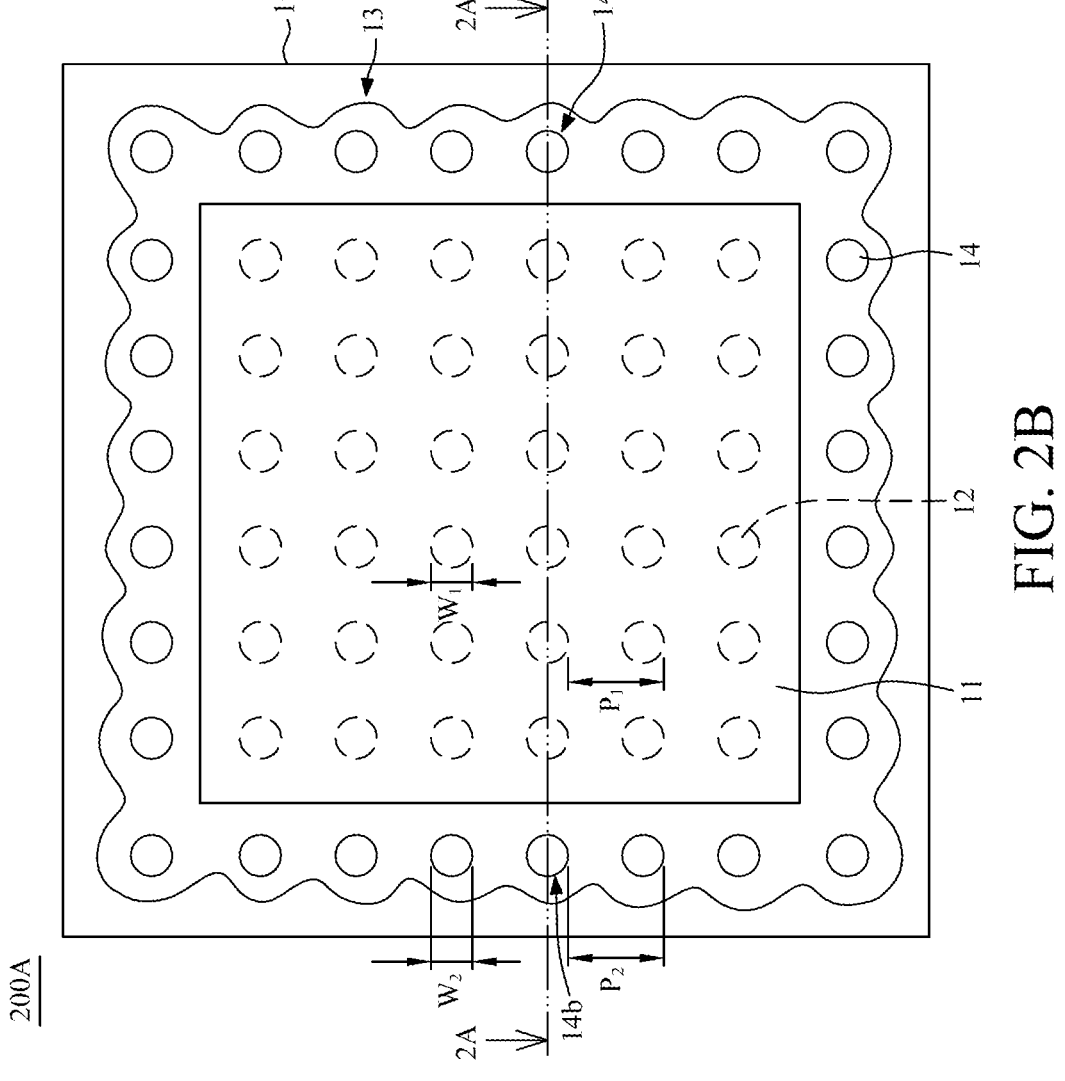
FIG. 2B illustrates a top view of a package structure according to some embodiments of the present disclosure.

FIG. 2A-3 illustrates three types of cross-sectional views (a), (b), and (c) of an enlarged view of an area "2A-3" of FIG. 2A-1. FIG. 2A-3 illustrates more details about the connection elements 12.

The underfill 13 may have a portion (or clamping portion) 13$p$ which contacts a step structure 126 of the connection element 12. The step structure 126 may be formed due to the difference between the width $W_{12}$ of the first portion 123 and the width $W_{13}$ of the conductive pillar 122 after an etching process. The lateral surface 1221 of the conductive pillar 122 and the edge of the first portion 123 may define a slot portion 127 recessed toward the solder 121. Thus, the step structure 126 may include a hook 128. A lower surface of the hook 128 is an extension of the interface between the first portion 123 and the conductive pillar 122. The hook 128 has a lateral surface 1281 recessed from the lateral surface 1221 of the conductive pillar 122.

The slot portion 127 and the hook 128 may be configured to secure the portion 13$p$ of the underfill 13, such that the adhesion between the connection elements 12 and the underfill 13 can be improved. The protection of the joints formed by the solder 121 and the conductive pillar 122 can be improved. In the cross-sectional view (a) of FIG. 2A-3, the slot portion 127 is filled with the portion 13$p$ of the underfill 13. In the cross-sectional view (b) of FIG. 2A-3, there is a void 127$v$1 in the slot portion 127. The lower surface of the hook 128 may be free from contacting the portion 13$p$ of the underfill 13. The void 127$v$1 may have a concave perimeter. In the cross-sectional view (c) of FIG. 2A-3, there is a void 127$v$2 in the slot portion 127. The lower surface of the hook 128 may be free from contacting the portion 13$p$ of the underfill 13. The void 127$v$2 may have a convex perimeter.

Figure 2C:
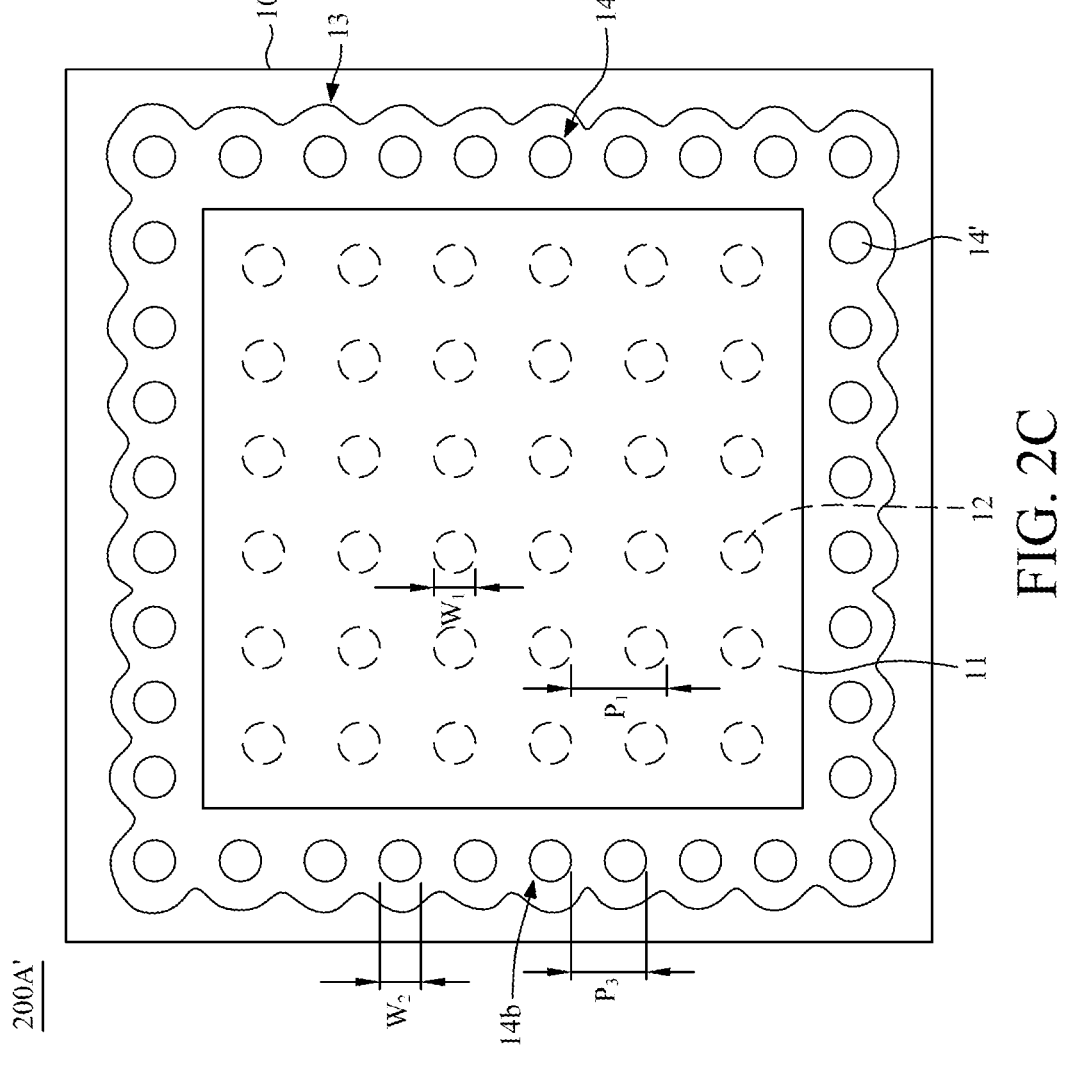
FIG. 2C illustrates a top view of a package structure according to some embodiments of the present disclosure.

FIG. 2C illustrates a top view of a package structure 200A' according to some embodiments of the present disclosure. The package structure 200A' in FIG. 2C is similar to the package structure 200A in FIG. 2B. Therefore, some detailed descriptions may refer to corresponding preceding paragraphs and are not repeated hereinafter for conciseness, with differences therebetween as follows.

As shown in FIG. 2C, the protrusions 14' of the package structure 200A' may be similar to the protrusions 14 of the package structure 200A, except that the protrusions 14' have a pitch $P_3$. The pitch $P_1$ between the connection elements 12 may be different from the pitch $P_3$ between the protrusions 14'. The pitch $P_3$ of the protrusions 14' may be less than the pitch $P_1$ of the connection elements 12, such that the capillary effect between the protrusions 14 is stronger than that between the connection elements 12. The stronger capillary effect may facilitate the distribution of the underfill 13 along the surface 101 of the substrate 10. The protrusions 14' may include pillars similar to those of the protrusions 14.

Figure 2D:
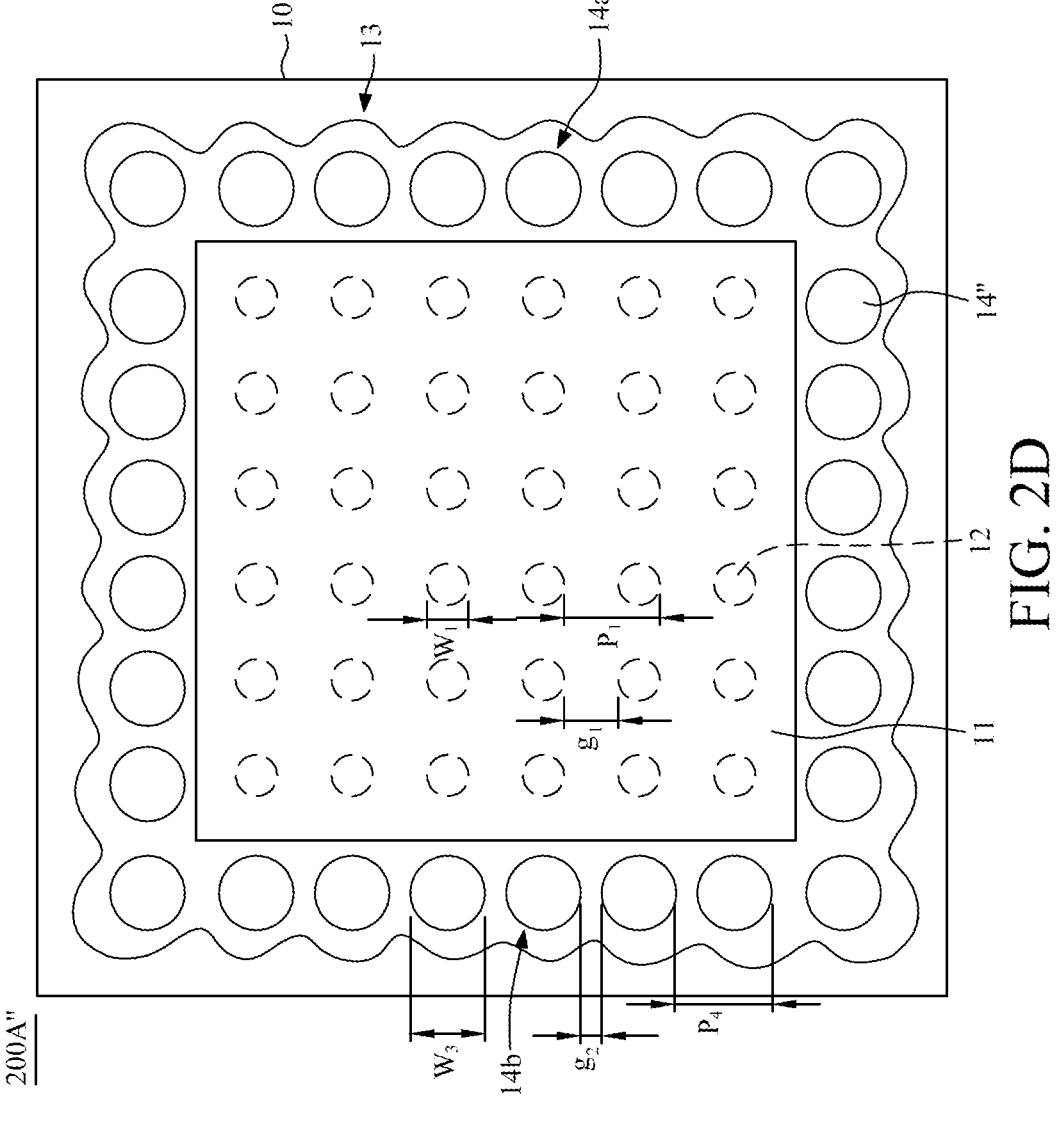
FIG. 2D illustrates a top view of a package structure according to some embodiments of the present disclosure.

FIG. 2D illustrates a top view of a package structure 200A" according to some embodiments of the present disclosure. The package structure 200A" in FIG. 2D is similar to the package structure 200A in FIG. 2B. Therefore, some detailed descriptions may refer to corresponding preceding paragraphs and are not repeated hereinafter for conciseness, with differences therebetween as follows.

As shown in FIG. 2D, the protrusions 14" of the package structure 200A" may be similar to the protrusions 14 of the package structure 200A, except that the protrusions 14" have a width (or diameter) $W_3$ different from the width $W_1$ of the protrusions 14. The width $W_3$ may be greater than the width $W_1$. The protrusions 14" have a pitch $P_4$. The pitch $P_1$ of the connection elements 12 may be different from the pitch $P_4$ of the protrusions 14". A gap $g_1$ between the protrusions 14" may be smaller than a gap $g_2$ between the connection elements 12, such that the capillary effect between the protrusions 14 is stronger than that between the connection elements 12. The stronger capillary effect may facilitate the distribution of the underfill 13 along the surface 101 of the substrate 10. The protrusions 14" may include pillars similar to those of the protrusions 14.

Figure 2E:
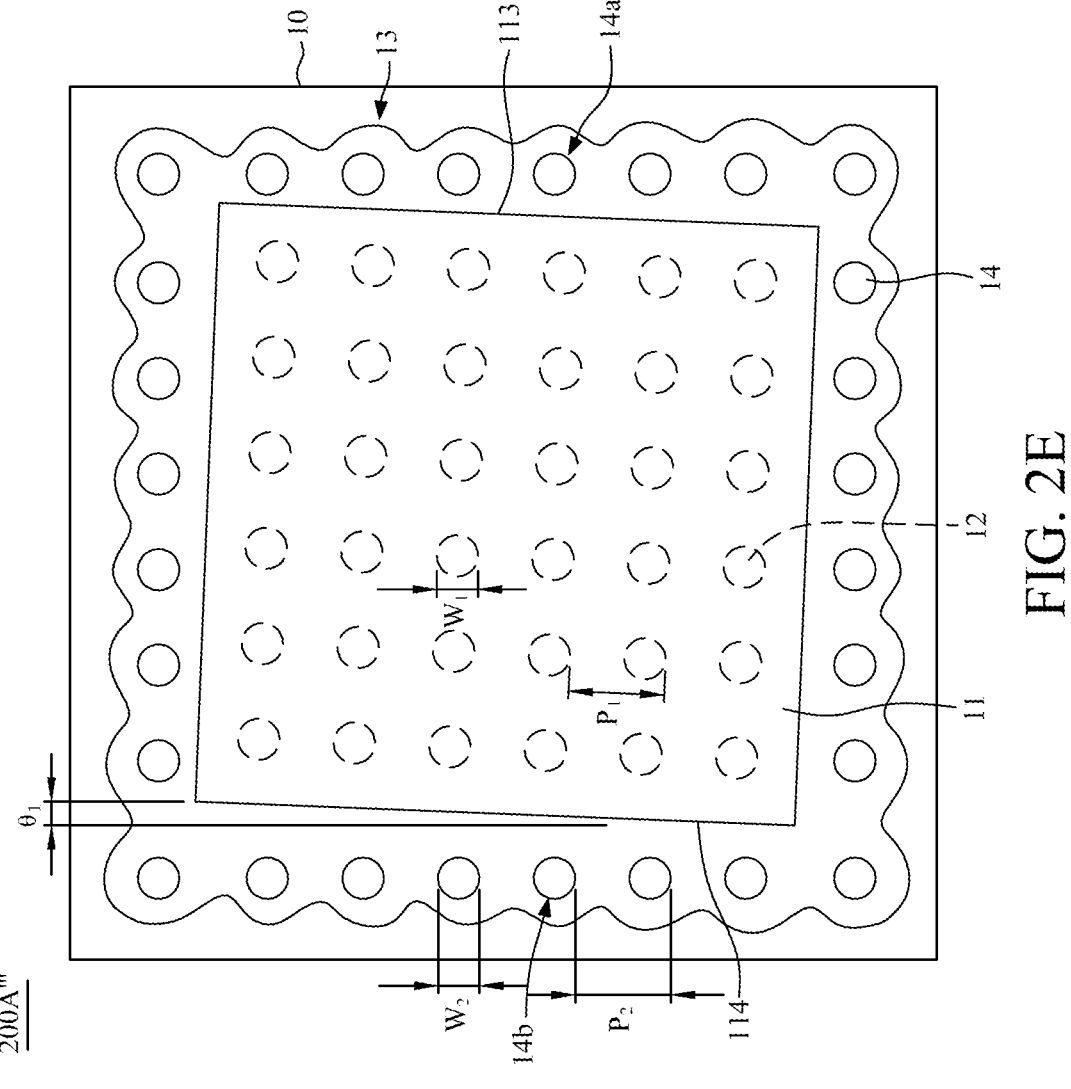
FIG. 2E illustrates a top view of a package structure according to some embodiments of the present disclosure.

FIG. 2E illustrates a top view of a package structure 200A''' according to some embodiments of the present disclosure. The package structure 200A''' in FIG. 2E is similar to the package structure 200A in FIG. 2B. Therefore, some detailed descriptions may refer to corresponding preceding paragraphs and are not repeated hereinafter for conciseness, with differences therebetween as follows.

The lateral surfaces 113 and 114 of the electronic device 11 of the package structure 200A''' may be non-parallel with a direction of the row of the protrusions 14. The lateral surface 114 and the direction of the row of the protrusions 14 may define an acute angle $\theta 1$.

Figure 2F:
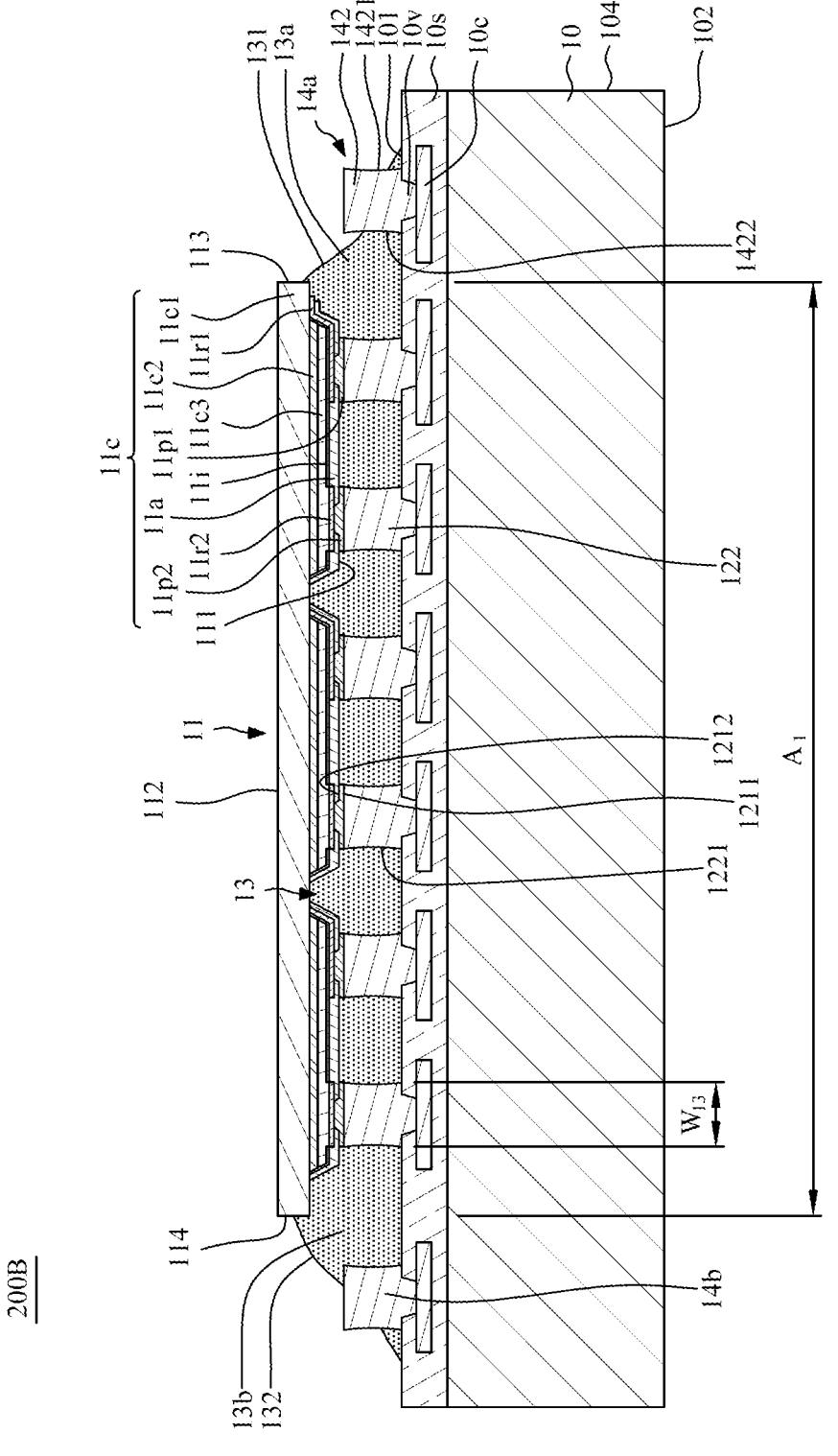
FIG. 2F illustrates a cross-sectional view of a package structure according to some embodiments of the present disclosure.

FIG. 2F illustrates a cross-sectional view of a package structure 200B according to some embodiments of the present disclosure. The package structure 200B in FIG. 2F is similar to the package structure 200A in FIG. 2A. Therefore, some detailed descriptions may refer to corresponding preceding paragraphs and are not repeated hereinafter for conciseness, with differences therebetween as follows.

The conductive pillars 122 of the connection elements 12 may be directly connected to the RDLs 11$r$1 and 11$r$2. In other words, the connection elements 12 of the package structure 200B may exclude the solder 121, the first portion 123, and the second portion 124.

The underfill guide structures 14a and 14b may only include the conductive pillar 142. In other words, the connection elements 12 of the package structure 200B may exclude the solder 141, the first portion 143, and the second portion 144.

FIG. 3A illustrates a cross-sectional view of a package structure 300A according to some embodiments of the present disclosure. The package structure 300A in FIG. 3A is similar to the package structure 200A in FIG. 2A. Therefore, some detailed descriptions may refer to corresponding preceding paragraphs and are not repeated hereinafter for conciseness, with differences therebetween as follows.

The portions 13a and 13b of the underfill 13 of package structure 300A may be symmetrical. For example, the highest point of the portions 13a and 13b may be at substantially the same elevation with respect to the surface 101 of the substrate 10. The length of the portion 13a along the surface 101 of the substrate 10 is substantially the same as that of the portion 13b along the surface 101 of the substrate 10. A curvature of the lateral surface 131 is substantially the same as that of the lateral surface 132.

FIG. 3B illustrates a cross-sectional view of a package structure according to some embodiments of the present disclosure. The package structure 300B in FIG. 3B is similar to the package structure 200A in FIG. 2A. Therefore, some detailed descriptions may refer to corresponding preceding paragraphs and are not repeated hereinafter for conciseness, with differences therebetween as follows.

The underfill guide structures 14a and 14b may exclude the solder 141.

FIG. 3C illustrates a cross-sectional view of a package structure 300C according to some embodiments of the present disclosure. The package structure 300C in FIG. 3C is similar to the package structure 200A in FIG. 2A. Therefore, some detailed descriptions may refer to corresponding preceding paragraphs and are not repeated hereinafter for conciseness, with differences therebetween as follows.

The underfill 13 of the package structure 300C defines a first concave portion (or recess) 13c1 outside the projection region A1 of the electronic device 11 on the surface 101 of the substrate 10. The first concave portion 13c1 is recessed from a space between a top portion (or the solder 141) of the underfill guide structure 14a and a top portion (or the semiconductor doped layer 11c1) of the electronic device 11. The portion 13a has the top surface 13a1s defining a recess (or the concave portion) 13c1 extending between the electronic device 11 and the pillar 14a. The underfill 13 may further define a first recess portion 13r1 opposite to the first concave portion 13c1 with respect to the underfill guide structure 14a. A curvature of a surface of the first recess portion 13r1 is different from a curvature of a surface of the first concave portion 13c1.

The underfill 13 of the package structure 300C defines a second concave portion 13c2 outside the projection region A1 of the electronic device 11 on the surface 101 of the substrate 10. The second concave portion 13c2 is recessed from a space between a top portion (or the solder 141) of the underfill guide structure 14b and a top portion (or the semiconductor doped layer 11c1) of the electronic device 11. A curvature of a surface of the second concave portion 13c2 is different from a curvature of a surface of the first concave portion 13c1. The direction of the opening of the first concave portion 13c1 is different from that of the second concave portion 13c2.

FIG. 3D illustrates a cross-sectional view of a package structure according to some embodiments of the present disclosure. The package structure 300D in FIG. 3D is similar to the package structure 300C in FIG. 3C. Therefore, some detailed descriptions may refer to corresponding preceding paragraphs and are not repeated hereinafter for conciseness, with differences therebetween as follows.

The underfill 13 of the package structure 300C defines a convex portion 13c3 outside the projection region A1 of the electronic device 11 on the surface 101 of the substrate 10. The convex portion 13c3 is between the underfill guide structure 14a and the electronic device 11. A curvature of a surface of the convex portion 13c3 is different from a curvature of a surface of the concave portion 13c2 (or the first concave portion 13c1 in FIG. 3C). The convex portion 13c3 protrudes from the peripheral part of the underfill 13.

FIG. 3E illustrates a cross-sectional view of a package structure 300E according to some embodiments of the present disclosure. The package structure 300E in FIG. 3E is similar to the package structure 200A in FIG. 2A. Therefore, some detailed descriptions may refer to corresponding preceding paragraphs and are not repeated hereinafter for conciseness, with differences therebetween as follows.

A height $T_{16}$ of the underfill guide structure (or the protrusion) 14a may be different from a height $T_{17}$ of the underfill guide structure (or the protrusion) 14b with respect to the surface 101 of the substrate 10.

FIG. 3F illustrates a cross-sectional view of a package structure according to some embodiments of the present disclosure. The package structure 300F in FIG. 3F is similar to the package structure 200A in FIG. 2A. Therefore, some detailed descriptions may refer to corresponding preceding paragraphs and are not repeated hereinafter for conciseness, with differences therebetween as follows.

The package structure 300F may further include a molding compound 151 to cover the electronic device 11. The molding compound 151 may be configured to protect the semiconductor devices 11c of the electronic device 11 and allow the passage of the light from the semiconductor devices 11c. The molding compound 151 may cover a portion of the surface 101 of the substrate 10 and another portion of the surface 101 may be exposed by the molding compound 151. The molding compound 151 may be transparent.

FIG. 3G illustrates a cross-sectional view of a package structure according to some embodiments of the present disclosure. The package structure 300G in FIG. 3G is similar to the package structure 200A in FIG. 2A. Therefore, some detailed descriptions may refer to corresponding preceding paragraphs and are not repeated hereinafter for conciseness, with differences therebetween as follows.

The package structure 300F may further include a molding compound 152 to cover the electronic device 11. The molding compound 152 may be configured to protect the semiconductor devices 11c of the electronic device 11 and allow the passage of the light from the semiconductor devices 11c. The molding compound 152 may cover a portion of the surface 101 of the substrate 10 outside of the underfill 13. The molding compound 152 may have a lateral surface 152s substantially aligned with the lateral surface 104 of the substrate 10. The molding compound 152 may be transparent.

FIG. 3H illustrates a cross-sectional view of a package structure 300H according to some embodiments of the present disclosure. The package structure 300H in FIG. 3H is similar to the package structure 200A in FIG. 2A. Therefore, some detailed descriptions may refer to corresponding preceding paragraphs and are not repeated hereinafter for conciseness, with differences therebetween as follows.

The lower surface 111 of the electronic device 11 is non-parallel with the surface 101 of the substrate 10. The conductive pads 11p1 and 11p2 may be tilted with respect to the connection elements 12. The lower surface 111 of the electronic device 11 and the surface 101 of the surface 101 define an acute angle θ2, illustrated with two dashed lines in FIG. 3H. A first side (e.g., the part closer to the lateral surface 113) of the electronic device 11 is higher than a second side (e.g., the part closer to the lateral surface 114) of the electronic device 11 relative to the surface 101 of the substrate 10.

A group of the conductive pads 11p1 may be misaligned with the corresponding connection element 12. The corresponding connection element 12 indicates that said connection element 12 is electrically connected to the group of the conductive pads 11p1. For example, a central axis C1 of one conductive pad 11p1 is misaligned with a central axis C2 of the corresponding connection element 12. A group of the conductive pads 11p2 may be misaligned with the corresponding connection element 12. The solder 121 of the corresponding connection element 12 that is connected to the tilted conductive pads 11p1 or 11p2 may have an asymmetrical shape. The portion 13b is in contact with the lateral surface 114 of the electronic device 11 and the portion 13a is in contact with the lateral surface 113 of the electronic device 11.

FIG. 3I illustrates a cross-sectional view of a package structure according to some embodiments of the present disclosure. The package structure 300I in FIG. 3I is similar to the package structure 200A in FIG. 2A. Therefore, some detailed descriptions may refer to corresponding preceding paragraphs and are not repeated hereinafter for conciseness, with differences therebetween as follows.

The electronic device 11 may have a raised end 11b1 induced by the momentum of the de-carrier process of the temporary carrier attached to the surface 112 of the electronic device 11. A group of the conductive pads 11p1 may be misaligned with the corresponding connection element 12. A group of the conductive pads 11p2 may be misaligned with the corresponding connection element 12. The solder 121 of the corresponding connection element 12 that is connected to the tilted conductive pads 11p1 or 11p2 may have an asymmetrical shape. The portion 13b is in contact with the lateral surface 114 of the electronic device 11 and the portion 13a is in contact with the lateral surface 113 of the electronic device 11.

A first side (e.g., the raised end 11b1) of the electronic device 11 is higher than a second side (e.g., the part closer to the lateral surface 114) of the electronic device 11 relative to the surface 101 of the substrate 10. The first side of the electronic device 11 may be curved.

FIG. 3J illustrates a cross-sectional view of a package structure according to some embodiments of the present disclosure. The package structure 300J in FIG. 3J is similar to the package structure 300I in FIG. 3I. Therefore, some detailed descriptions may refer to corresponding preceding paragraphs and are not repeated hereinafter for conciseness, with differences therebetween as follows.

The electronic device 11 may have a warpage. The electronic device 11 may further have a second raised end 11b2 opposite to the raised end 11b1. The raised end 11b1 may be at an elevation higher than the second raised end 11b2 with respect to the surface 101 of the substrate 10.

FIG. 4A through FIG. 4H illustrate a method for manufacturing a semiconductor package structure according to some embodiments of the present disclosure. In some embodiments, the method is for manufacturing the package structure 300F shown in FIG. 3F.

Figure 4A:
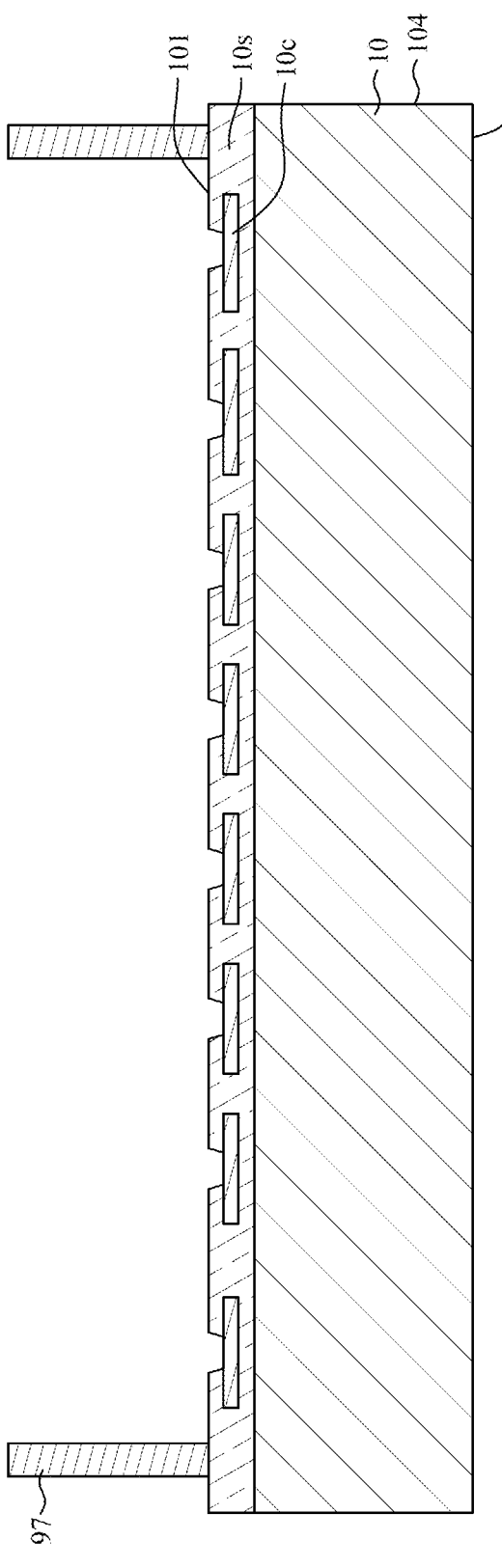
FIG. 4A illustrates one or more stages of an example of a method for manufacturing a package structure according to some embodiments of the present disclosure.

Referring to FIG. 4A, a carrier (or a substrate) 10 is provided. The steps of FIG. 4A may be similar or identical to those of FIG. 1D. A barrier 97 may be formed on the surface 101 of the substrate 10.

Figure 4B:
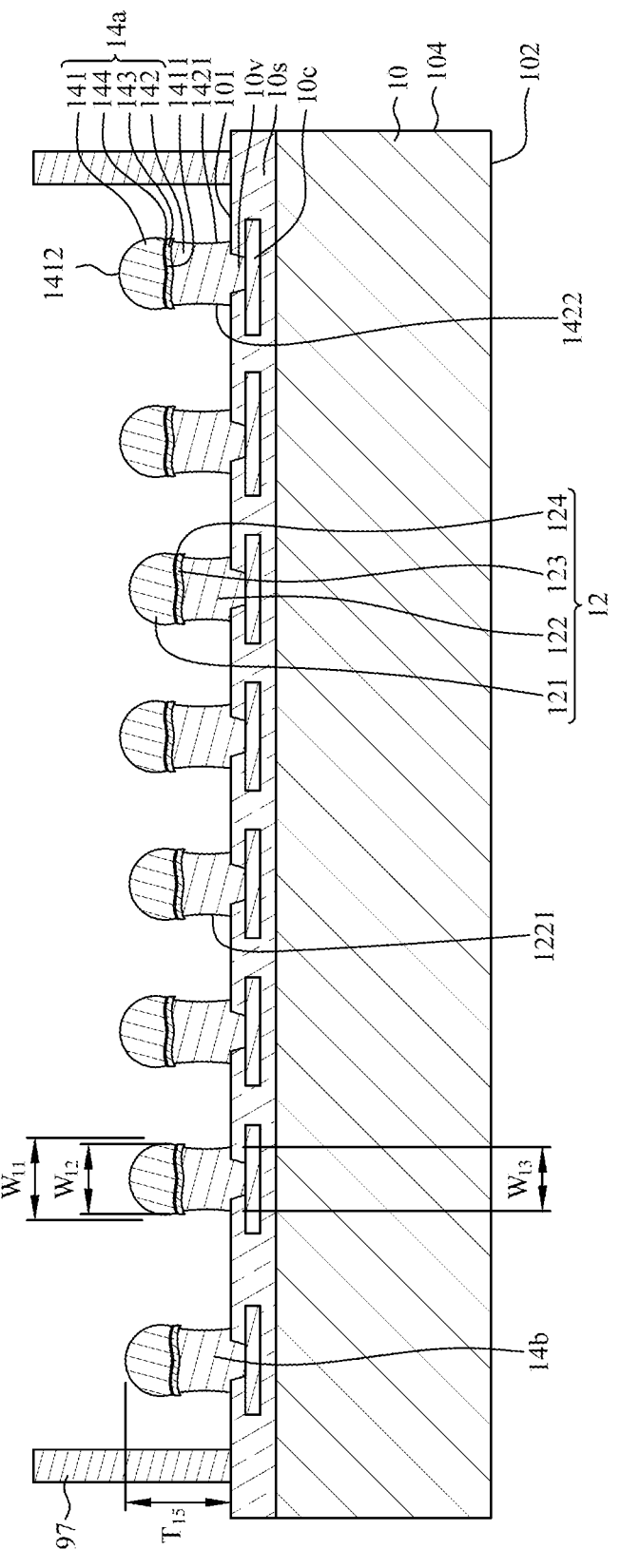
FIG. 4B illustrates one or more stages of an example of a method for manufacturing a package structure according to some embodiments of the present disclosure.

Referring to FIG. 4B, a plurality of connection elements 12 may be formed over the conductive vias 10v to define a flip-chip bonding region. The steps of FIG. 4B may be similar or identical to those of FIG. 1E.

As shown in FIG. 4B, underfill guide structures 14a and 14b may be formed over the surface 101 of the substrate 10. The underfill guide structures 14a and 14b may be around the connection elements 12. The underfill guide structures 14a and 14b may be outside of the flip-chip bonding region defined by the connection elements 12. The underfill guide structures 14a and 14b and the connection elements 12 may be formed in the same process.

Figure 4C:
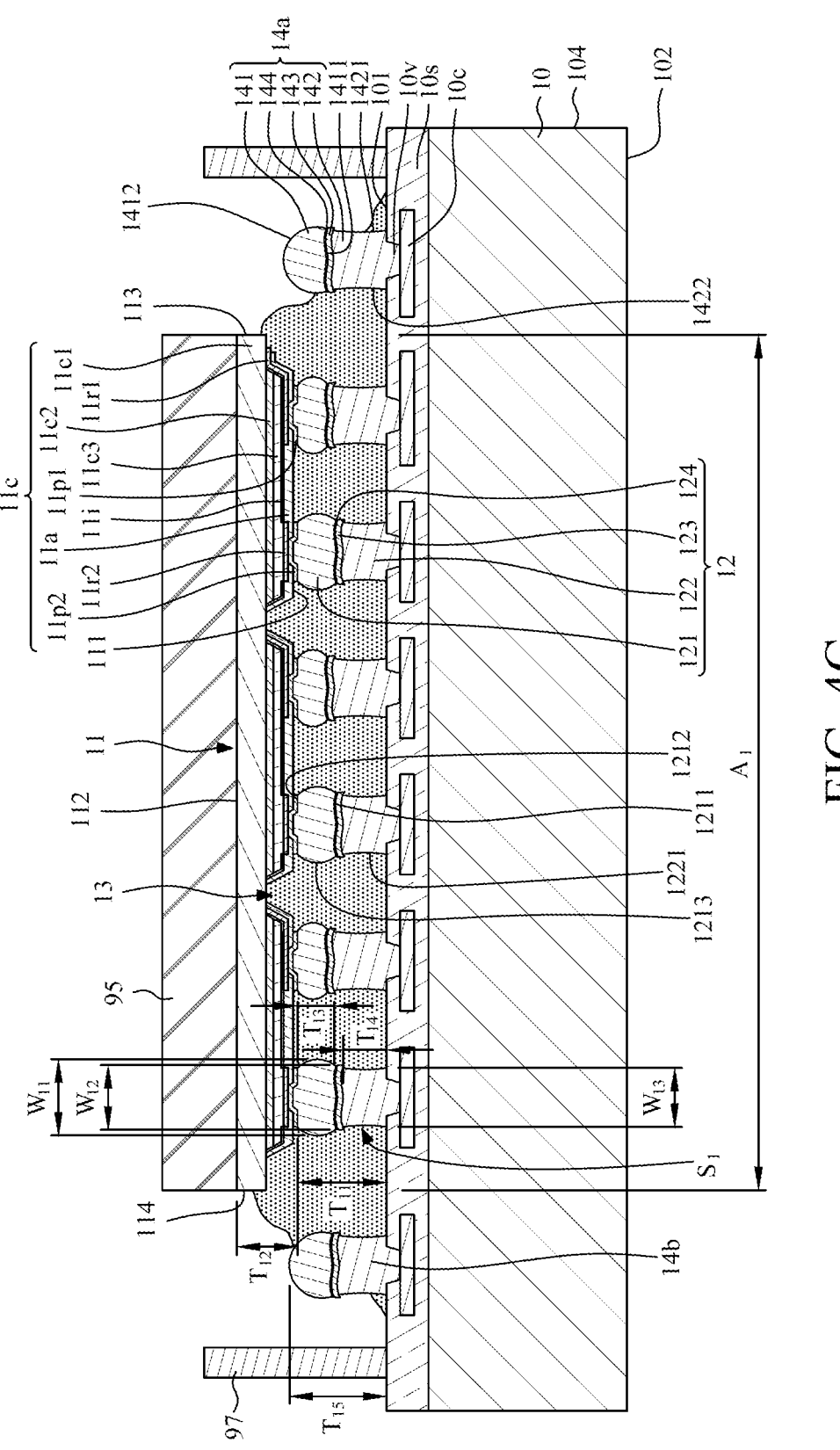
FIG. 4C illustrates one or more stages of an example of a method for manufacturing a package structure according to some embodiments of the present disclosure.

Referring to FIG. 4C, an electronic device 11 may be attached to the connection elements 12. The underfill guide structures 14a and 14b are non-overlapped with the electronic device 11. In some embodiments, before the step of attaching the electronic device 11 to the connection elements 12, the method further includes: forming the electronic device 11 on a carrier 95. The electronic device 11 may have a surface 111 and a surface 112 opposite to the surface 111. The surface 112 may be in contact with the carrier 95.

Figure 4D:
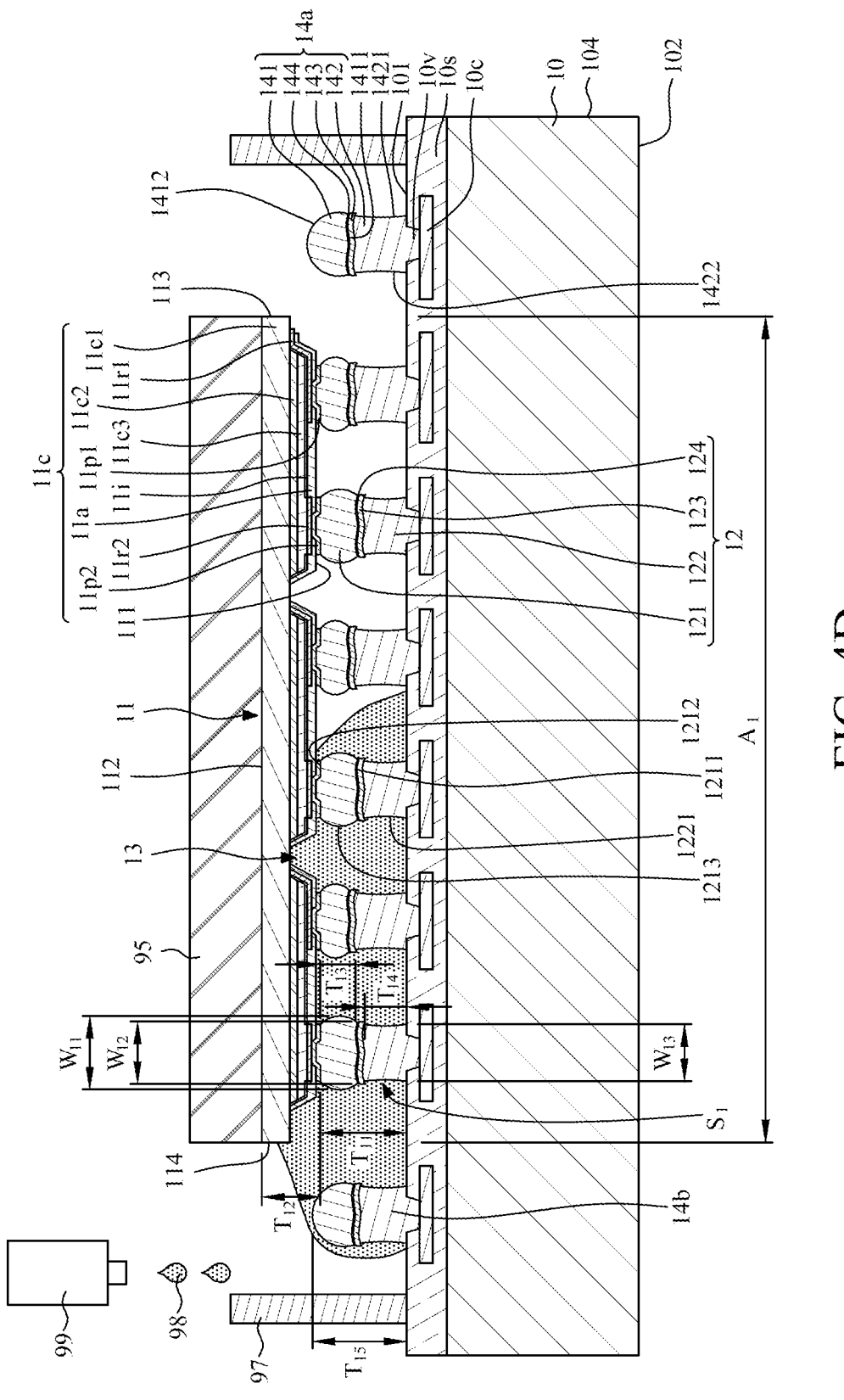
FIG. 4D illustrates one or more stages of an example of a method for manufacturing a package structure according to some embodiments of the present disclosure.

Referring to FIG. 4D, an underfill 13 is applied to a space S₁ between the substrate 10 and the electronic device 11 by, e.g., jetting, spray, or auger pump. The application of the underfill 13 may be performed by the droplets 98 produced from equipment 99. The application of the underfill 13 to the space S₁ between the substrate 10 and the electronic device 11 includes: dispensing the underfill 13 outside the underfill guide structure 14b (or 14a). The underfill 13 may be dispensed between the underfill guide structure 14b and the barrier 97. The underfill 13 flows through the underfill guide structure 14b (or 14a) to enter the space S₁ between the substrate 10 and the electronic device 11 by capillary effect. The underfill guide structures 14a and 14b facilitate a horizontal flow of the underfill 1313 and suppress a vertical flow of the underfill 13. The underfill guide structure 14a and/or 14b can direct the underfill with the relatively small volume toward the edge (defined by an imaginary line that is aligned with and below a lateral surface 113 of the electronic device 11) of the electronic device 11 by capillary effect. The underfill 13 may have portions 13a and 13b outside of a projection area A1 of the electronic device 11 on the surface 101 of the substrate 10.

Figure 4E:
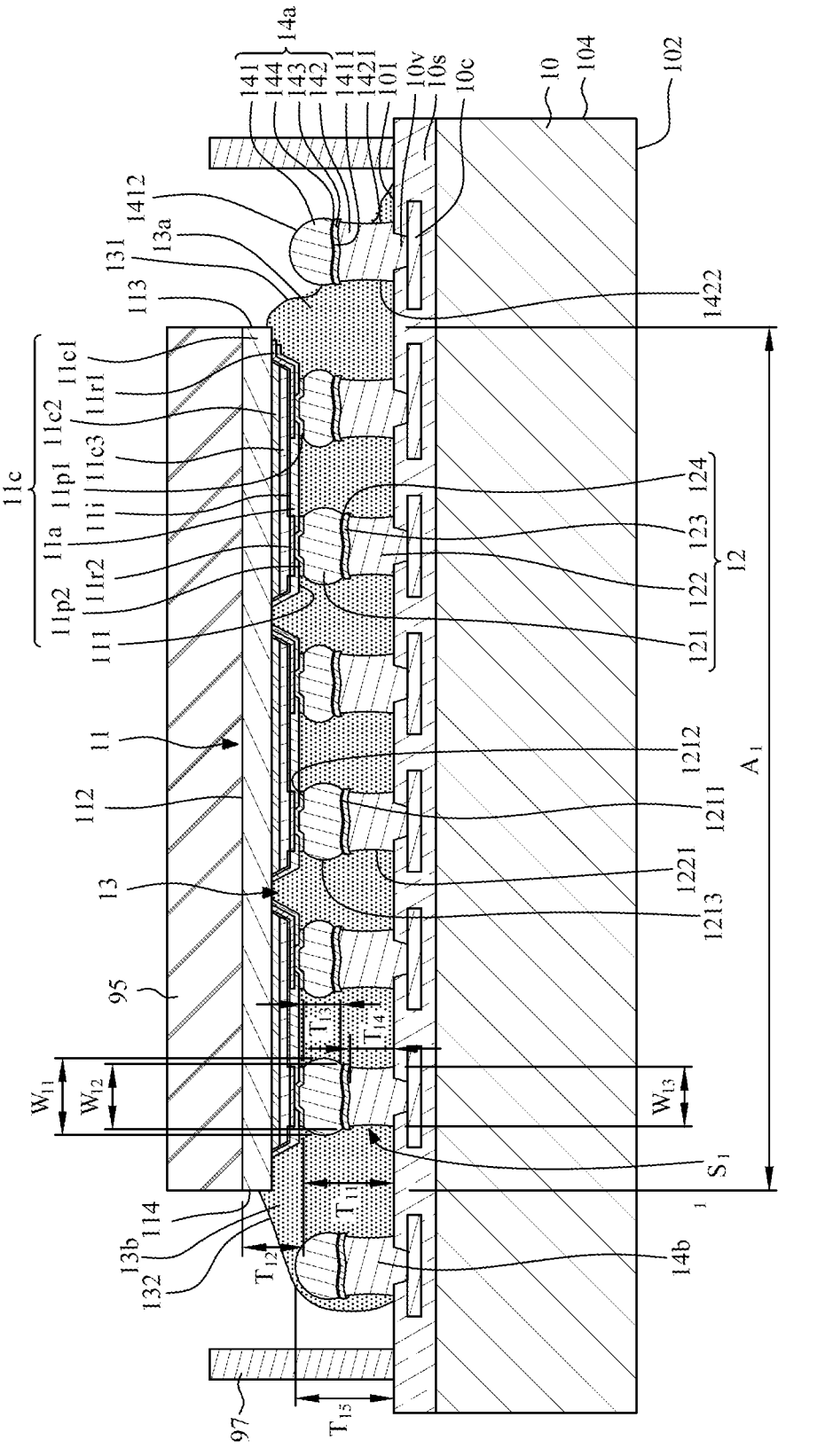
FIG. 4E illustrates one or more stages of an example of a method for manufacturing a package structure according to some embodiments of the present disclosure.

Referring to FIG. 4E, the application of the underfill 13 may be finished and the underfill 13 is flowable or at the flow stage. The highest end of the underfill 13 may be lower than the surface 112 of the electronic device 11 with respect to the surface 101 of the substrate 10.

Figure 4F:
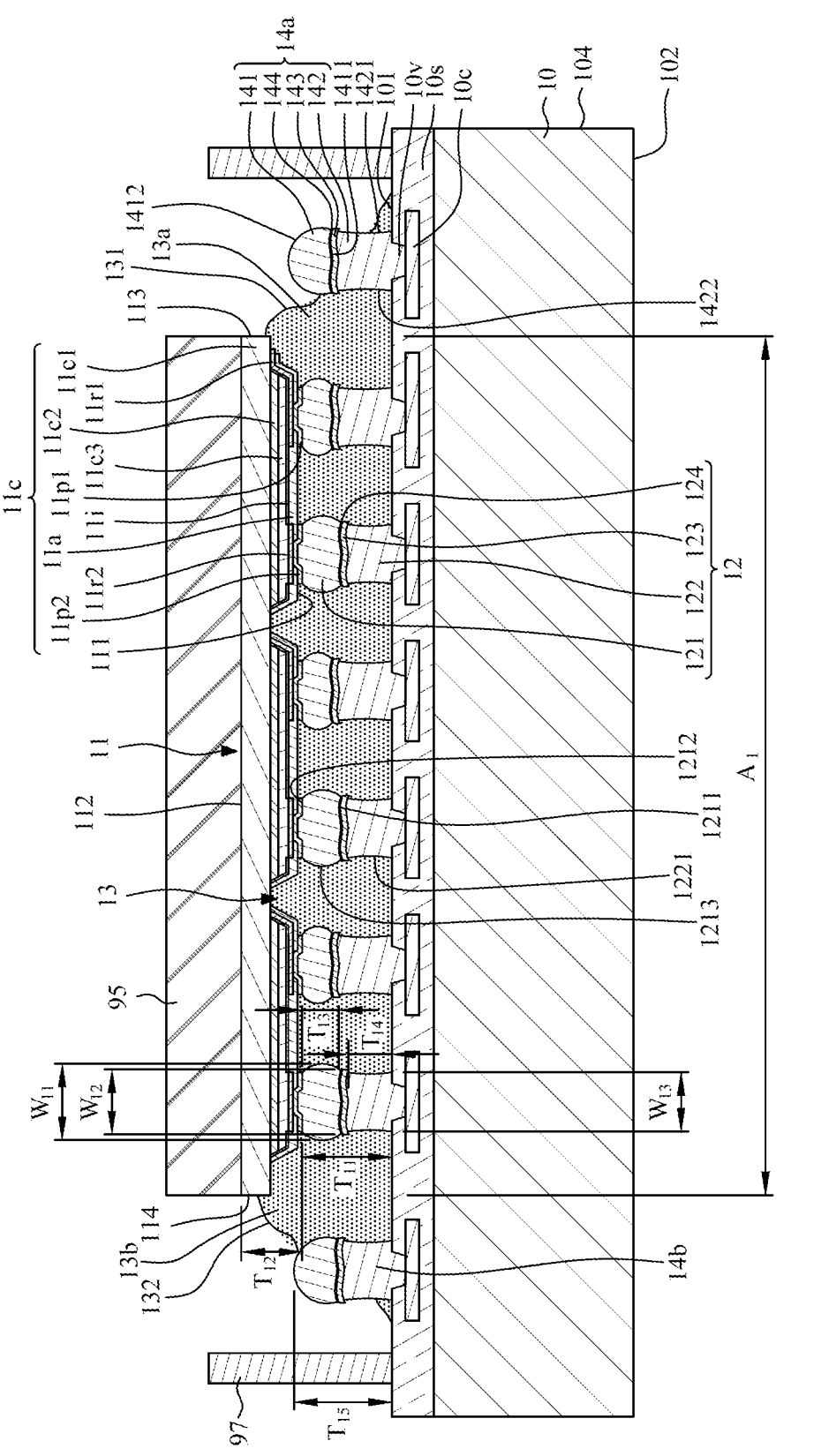
FIG. 4F illustrates one or more stages of an example of a method for manufacturing a package structure according to some embodiments of the present disclosure.

Referring to FIG. 4F, the underfill 13 is then cured in a thermal process. The shape of the underfill 13 may be altered because of the reflow happening in the curing process. The underfill guide structure 14a and/or 14b ensures that the portions 13a and 13b of the underfill 13 stay outside the projection area A1. In addition, an elevation of the highest points that the portions 13a and 13b, in contact with the lateral surfaces 113 and 114 of the electronic device 11, can be between the upper surface 112 and the lower surface 111 of the electronic device 11. Thus, the underfill 13 with the relatively large volume (hindering the de-carrier process if there is no guide structure) would not reach the lateral surface of the carrier 95. The underfill guide structure 14a and/or 14b enables the process window to be wider because a slightly higher volume of the underfill 13 can be dispensed without underfill overflowing toward the carrier 95. The underfill guide structure 14a and/or 14b can hold the under-fill 13 in the event of excessive fillet, which could jeopardize the subsequent de-carrier process. The underfill guide structure 14a and/or 14b ensures good underfill support for the flip-chip bonding process.

Figure 4G:
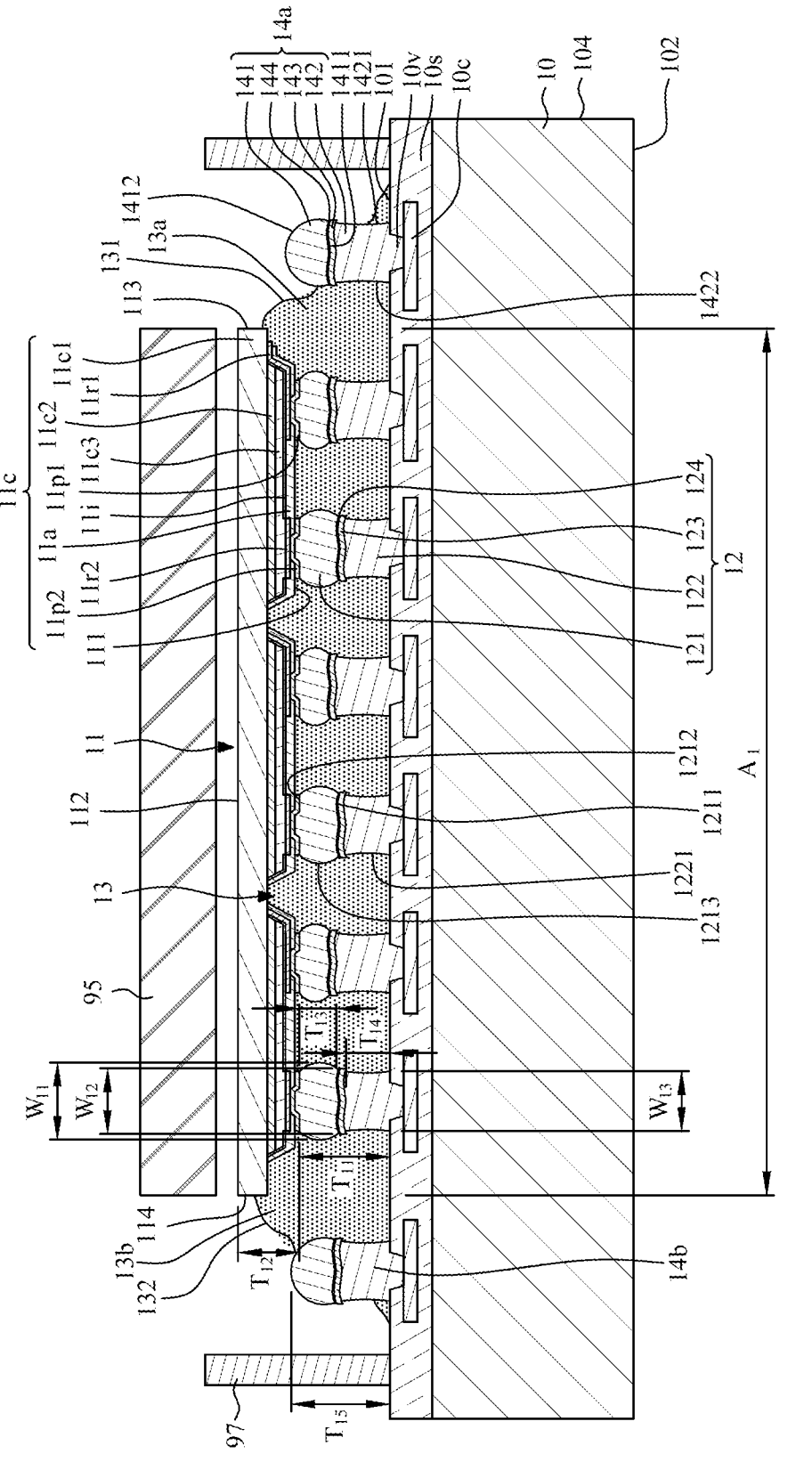
FIG. 4G illustrates one or more stages of an example of a method for manufacturing a package structure according to some embodiments of the present disclosure.

Referring to FIG. 4G, the carrier 95 is removed from the electronic device 11 to form the package structure 200A shown in FIG. 2A. The carrier 95 may be removed by a de-carrier process, e.g., a laser lift-off process. The underfill guide structure 14a and/or 14b alters the distribution of the underfill 13 to support or secure the thin electronic device 11 during the de-carrier process, and thus achieve an arrange-ment of the thin electronic device 11 (the thickness $T_{12}$) with the relatively thick (or taller) connection elements 12 (the thickness $T_{11}$).

Figure 4H:
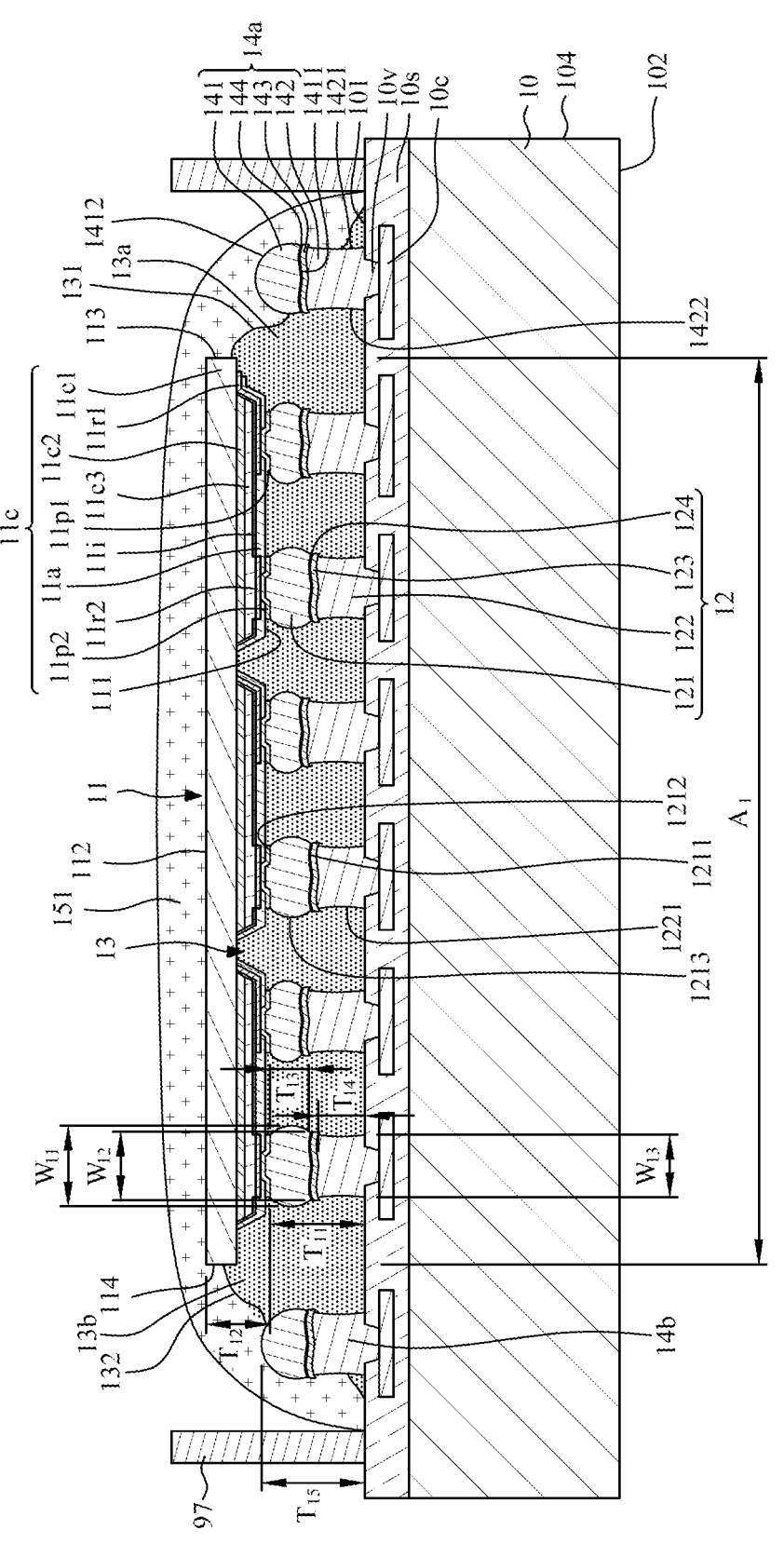
FIG. 4H illustrates one or more stages of an example of a method for manufacturing a package structure according to some embodiments of the present disclosure.

Referring to FIG. 4H, a molding compound 151 may be formed to cover the circuit structure. The molding com-pound 151 may be a transparent layer. The molding com-pound 151 may be configured to protect the semiconductor devices 11c of the electronic device 11 and allow the passage of the light from the semiconductor devices 11c.

As shown in FIG. 4H, the substrate 10 is singulated and the barrier 97 may be removed along with the removed part of the substrate 10, to thereby form the package structure 300F shown in FIG. 3F.

Figure 5A:
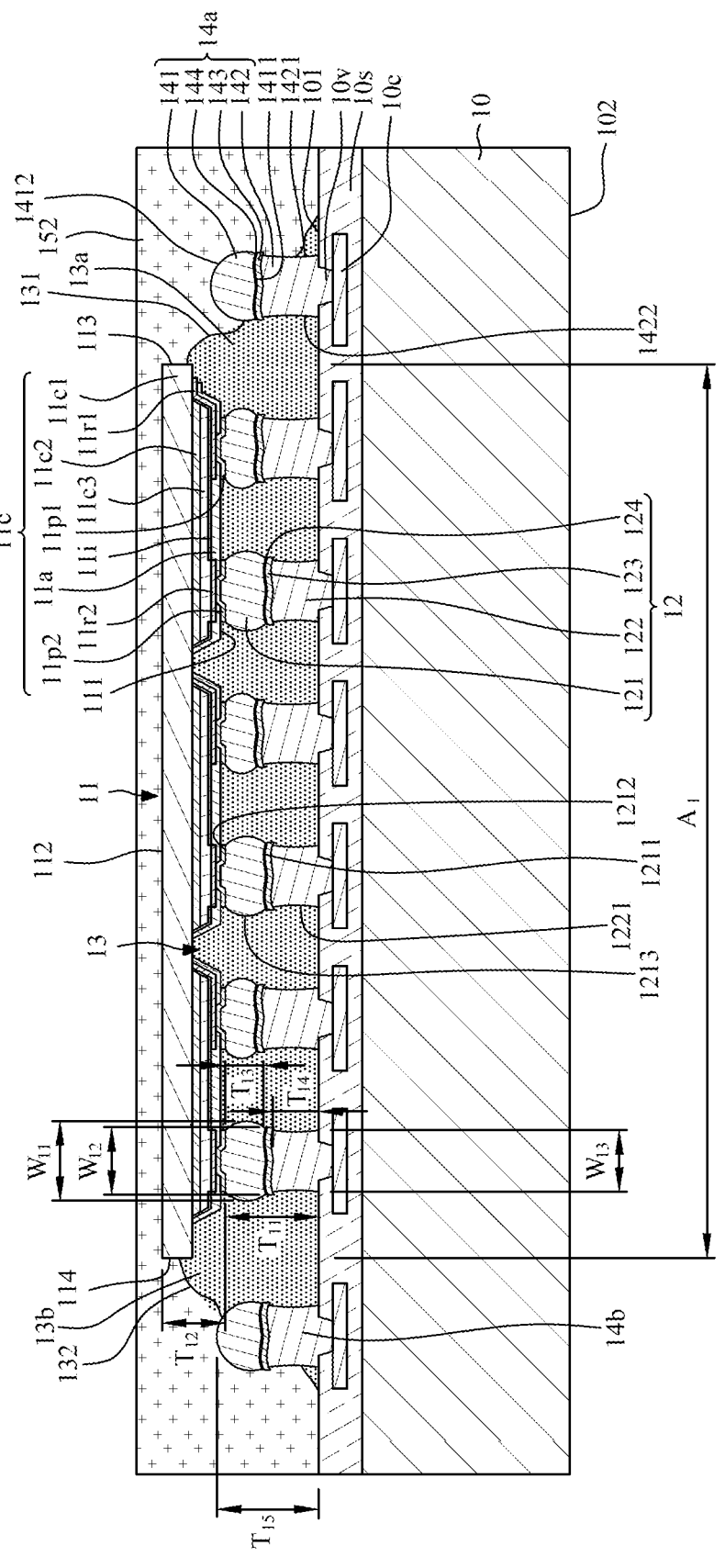
FIG. 5A illustrates one or more stages of an example of a method for manufacturing a package structure according to some embodiments of the present disclosure.
Figure 5B:
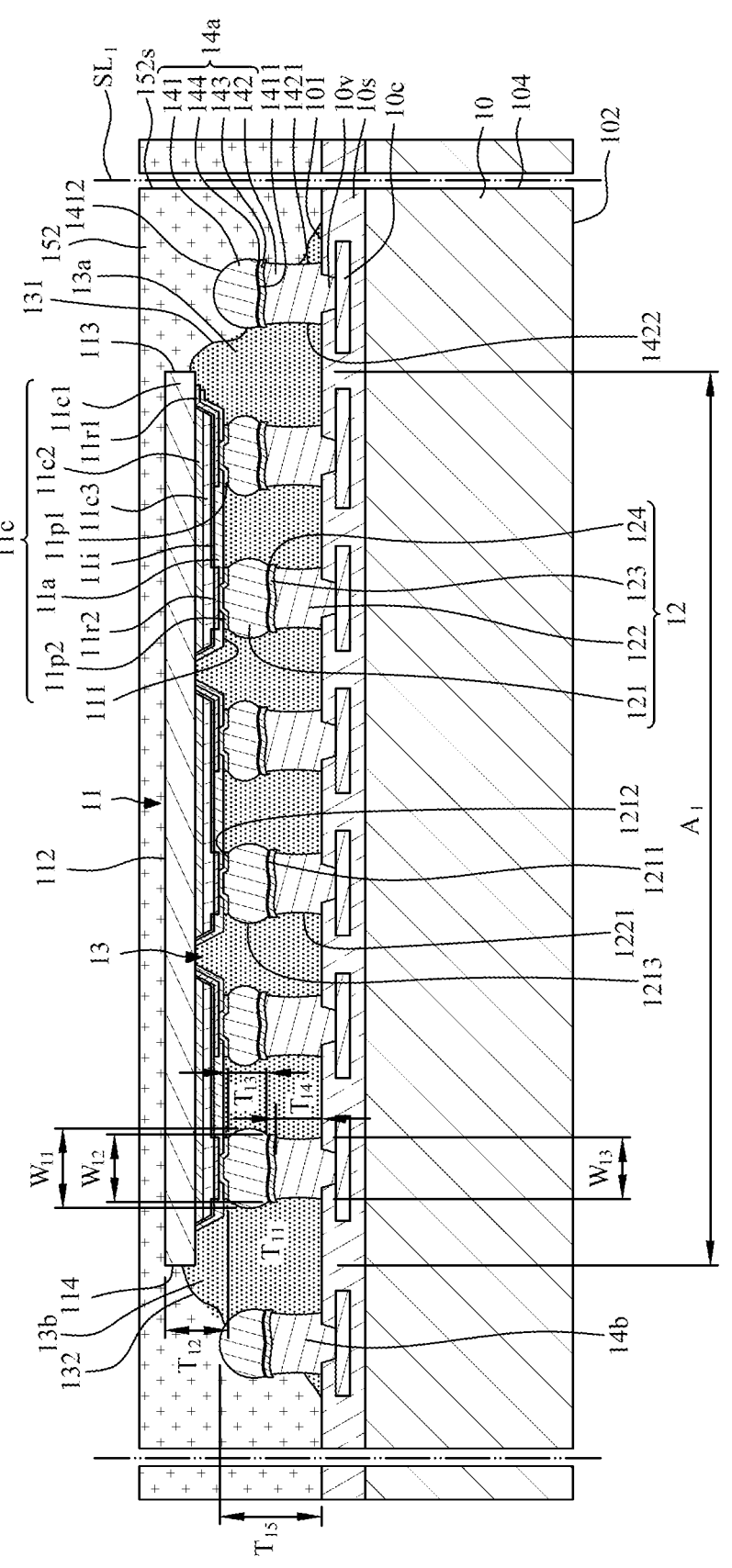
FIG. 5B illustrates one or more stages of an example of a method for manufacturing a package structure according to some embodiments of the present disclosure.

FIG. 5A and FIG. 5B illustrate a method for manufactur-ing a semiconductor package structure according to some embodiments of the present disclosure. In some embodi-ments, the method is for manufacturing the package struc-ture 300G shown in FIG. 3G.

The initial several stages of the method corresponding to FIG. 5A and FIG. 5B are the same as, or at least similar to, the stages illustrated in FIG. 4A through FIG. 4G, except that no barrier 97 is included in the steps of FIG. 4A through FIG. 4G. FIG. 5A depicts a stage subsequent to that depicted in FIG. 4G.

Referring to FIG. 5A, a molding compound 152 may be formed to cover the circuit structure. The molding com-pound 152 may be a transparent layer. The molding com-pound 152 may be configured to protect the semiconductor devices 11c of the electronic device 11 and allow the passage of the light from the semiconductor devices 11c. Since there is no barrier on the surface 101 of the substrate, the molding compound 152 may cover the entire portion of the surface 101, except for the portion under the projection A1.

As shown in FIG. 5B, the substrate 10 and the molding compound 152 are in the same process singulated along the line $SL_1$, to thereby form the package structure 300G shown in FIG. 3G. The molding compound 152 may have a lateral surface 152s coplanar with the lateral surface 104 of the substrate 10.

Figure 6A:
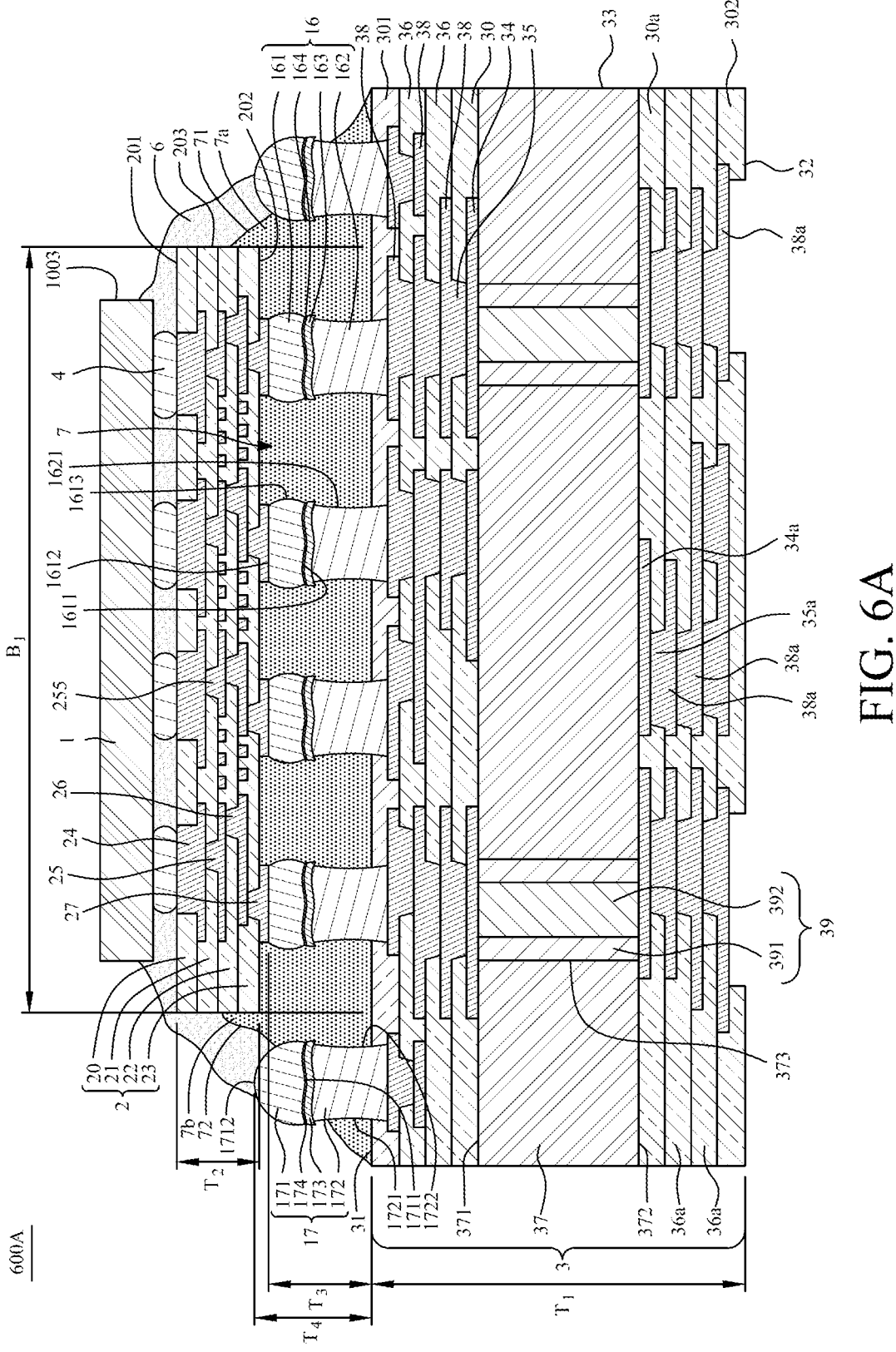
FIG. 6A illustrates a cross-sectional view of a package structure according to some embodiments of the present disclosure.

FIG. 6A is a cross-section of a package structure 600A according to some embodiments of the present disclosure. The package structure 600A may include an electronic device 1 (or an electronic component), a second circuit structure 2 (e.g., a redistribution layer (RDL) structure), a first circuit structure 3 (e.g., a carrier or a substrate), a plurality of second connecting elements 4, a second underfill 6, a first underfill 7, a plurality of first connecting elements 16, and an underfill guide structure 17.

The electronic device 1 may include a semiconductor chip. The electronic device 1 may be also referred to as a second electronic component. The electronic device 1 may be disposed on the second circuit structure 2. For example, the electronic device 1 may be electrically connected and bonded to the second circuit structure 2 through the second connecting elements 4 (e.g., solder bumps or other conduc-tive bumps). The plurality of the second connecting ele-ments 4 may be disposed between the electronic device 1 and the second circuit structure 2.

The second underfill 6 may be disposed between the electronic device 1 and the second circuit structure 2. The second underfill 6 may at least cover a portion of a lateral surface 1003 (or an edge) of the electronic device 1. The second underfill 6 may encapsulate the second connecting elements 4. The second underfill 6 may cover a top surface 201 of the second circuit structure 2. The second underfill 6 may contact the top surface 201 of the second circuit structure 2.

The second underfill 6 may cover a lateral surface 203 of the second circuit structure 2. The second underfill 6 may be in contact with the first underfill 7.

The second circuit structure 2 may be disposed on or disposed over the first circuit structure 3. The second circuit structure 2 may be also referred to as a first electronic component. The second circuit structure 2 may include at least one dielectric layer (including, for example, a first dielectric layer 20, a second dielectric layer 21, a third dielectric layer 22, and a fourth dielectric layer 24), at least one circuit layer (including, for example, a first circuit layer 24, a second circuit layer 25, a third circuit layer 26, and a fourth circuit layer 27) in contact with the dielectric layer. The circuit layer may be formed of a metal, a metal alloy, or other conductive material. In some embodiments, the second circuit structure 2 may be similar to a coreless substrate, and may be a bumping level redistribution structure. Each of the circuit layers 24, 25, 26, 27 of the second circuit structure 2 may also be referred to as "a high-density circuit layer". The second circuit structure 2 may be referred as a high-density circuit structure. In some embodiments, a density of a circuit line (including, for example, a trace or a pad) of the high-density circuit layer exceeds a density of a circuit line of a low-density circuit layer. That is, the number of circuit lines (including, for example, the trace or the pad) in a unit area of the high-density circuit layer exceeds the number of circuit lines in an equal unit area of the low-density circuit layer, such as 1.2 times or greater, about 1.5 times or greater, or about 2 times or greater, or about 3 times or greater. Alternatively, or in combination, a line width/line space (L/S) of the high-density circuit layer is less than an L/S of the low-density circuit layer, such as about 90% or less, about 50% or less, or about 20% or less.

The second circuit structure 2 has a top surface 201, a bottom surface 202 opposite to the top surface 201, and a lateral surface 203 extending between the top surface 201 and the bottom surface 202. As shown in FIG. 6A, the dielectric layers 20, 21, 22, 23 are stacked.

The first circuit layer 24 may be a fan-out circuit layer or a redistribution layer (RDL), and an L/S of the circuit layer 24 may be less than about 10 μm/10 μm, less than or equal to 8 μm/8 μm, less than or equal to 5 μm/5 μm, less than or equal to 3 μm/3 μm, less than or equal to about 2 μm/about 2 μm, or less than or equal to about 1.8 μm/about 1.8 μm. In some embodiments, the circuit layer 24 is embedded in the corresponding dielectric layers 20, 21. In some embodi-ments, the circuit layer 24 may include a seed layer and a conductive material (e.g., a plating metallic material) dis-posed on the seed layer. As shown in FIG. 6A, the topmost circuit layer 24 is covered by the second dielectric layer 21. The topmost circuit layer 24 may contact one of the second connecting elements 4. As such, the electronic device 1 may be electrically connected and bonded to the circuit layer 24 of the second circuit structure 2 through the second connecting elements 4. As illustrated in the embodiment of FIG. 6A, a horizontally connecting or extending circuit layer may be omitted from the first dielectric layer 20.

The second circuit layer 25 may be a fan-out circuit layer or a redistribution layer (RDL), and an L/S of the circuit layer 25 may fall in the similar range of the first circuit layer 24. In some embodiments, the circuit layer 25 is embedded in the corresponding dielectric layers 21, 22. In some embodiments, the circuit layer 25 may include a seed layer and a conductive material similar to the seed layer and the conductive material of the circuit layer 24. As shown in FIG. 6A, the circuit layer 25 may be covered by the third dielectric layer 22. The circuit layer 25 may include at least one inner via 255 tapering upward.

The third circuit layer 26 may be a fan-out circuit layer or a redistribution layer (RDL), and an L/S of the circuit layer 26 may fall in the similar range of the first circuit layer 24. In some embodiments, the circuit layer 26 is embedded in the corresponding dielectric layers 22, 23.

The fourth circuit layer 27 may be a fan-out circuit layer or a redistribution layer (RDL), and an L/S of the circuit layer 27 may fall in the similar range of the first circuit layer 24. In some embodiments, a portion of the circuit layer 27 may be embedded in the corresponding fourth dielectric layer 23 and another portion of the circuit layer 27 may be exposed from the corresponding fourth dielectric layer 23.

The first circuit structure 3 includes at least one dielectric layer (including, for example, one first upper dielectric layer 30, two second upper dielectric layers 36, one first lower dielectric layer 30a, two second lower dielectric layers 36a) and at least one circuit layer (including, for example, one first upper circuit layer 34, three second upper circuit layers 38, one first lower circuit layer 34a and three second lower circuit layers 38a formed of a metal, a metal alloy, or other conductive material) in contact with the dielectric layer (e.g., one first upper dielectric layer 30, two second upper dielectric layers 36, one first lower dielectric layer 30a, two second lower dielectric layers 36a). In some embodiments, the first circuit structure 3 may be similar to a core substrate that further includes a core portion 37. The core portion 37 may include an organic substrate. The circuit layer (including, for example, the first upper circuit layer 34, the second upper circuit layers 38, the first lower circuit layer 34a and the second lower circuit layers 38a) of the first circuit structure 3 may also be referred to as "a low-density circuit layer". The first circuit structure 3 may be referred as a low-density circuit structure. As shown in FIG. 6A, the first circuit structure 3 has a top surface 31, a bottom surface 32 opposite to the top surface 31, and a lateral surface 33 extending between the top surface 31 and the bottom surface 32. The first circuit structure 3 may include a plurality of dielectric layers 30, 36, 30a, 36a, a plurality of circuit layers 34, 38, 34a, 38a and at least one inner conductive via (including, for example, a plurality of upper interconnection vias 35 and a plurality of lower interconnection vias 35a). As shown in FIG. 6A, the lateral surface 203 of the upper circuit structure 2 may be displaced or recessed from the lateral surface 33 of the first circuit structure 3.

As shown in FIG. 6A, the first circuit structure 3 may have a first thickness $T_1$ and the second circuit structure 2 may have a second thickness $T_2$. The second thickness $T_2$ may be less than the first thickness $T_1$.

The core portion 37 has a top surface 371 and a bottom surface 372 opposite to the top surface 371, and defines a plurality of through holes 373 extending through the core portion 37. An interconnection via 39 is disposed or formed in each through hole 373 for vertical connection. In some embodiments, the interconnection via 39 includes a base metallic layer 391 and an insulation material 392.

The first upper dielectric layer 30 is disposed on the top surface 371 of the core portion 37. The second upper dielectric layers 36 are stacked or disposed on the first upper dielectric layer 30. In addition, the first lower dielectric layer 30a is disposed on the bottom surface 372 of the core portion 37. The second lower dielectric layers 36a are stacked or disposed on the first lower dielectric layer 30a. In some embodiments, the first circuit structure 3 may further include a top protection layer 301 and a bottom protection layer 302. The top protection layer 301 may be a solder resist layer and cover the second upper dielectric layers 36. Further, the top protection layer 301 may define a plurality of openings to expose portions of the second upper circuit layer 38. The bottom protection layer 302 may be a solder resist layer and cover the second lower dielectric layers 36a. Further, the bottom protection layer 302 may define a plurality of openings to expose portions of the second lower circuit layer 38a.

An L/S of the first upper circuit layer 34 may exceed or equal about 10 μm/about 10 μm. Thus, the L/S of the first upper circuit layer 34 may exceed or equal about five times the L/S of the circuit layer 24 of the second circuit structure 2. In some embodiments, the first upper circuit layer 34 is formed or disposed on the top surface 371 of the core portion 37, and covered by the first upper dielectric layer 30. In some embodiments, the first upper circuit layer 34 may include a first metallic layer disposed on the top surface 371 of the core portion 37, and may be formed from a copper foil (e.g., may constitute a portion of the copper foil).

An L/S of the second upper circuit layer 38 may exceed or equal about 10 μm/about 10 μm. In some embodiments, the second upper circuit layer 38 is formed or disposed on the first upper dielectric layer 30, and covered by the second upper dielectric layer 36. In some embodiments, the second upper circuit layer 38 is electrically connected to the first upper circuit layer 34 through the upper interconnection vias 35. Each upper interconnection via 35 tapers downwardly along a direction from the top surface 31 towards the bottom surface 32 of the first circuit structure 3. In some embodiments, the second upper circuit layers 38 are electrically connected to each other through the upper interconnection vias 35.

An L/S of the first lower circuit layer 34a may exceed or equal about 10 μm/about 10 μm. In some embodiments, the first lower circuit layer 34a is formed or disposed on the bottom surface 372 of the core portion 37, and covered by the first lower dielectric layer 30a. In some embodiments, the first lower circuit layer 34a may include a first metallic layer disposed on the bottom surface 372 of the core portion 37, and may be copper foil.

An L/S of the second lower circuit layer 38a may exceed or equal about 10 μm/about 10 μm. In some embodiments, the second lower circuit layer 38a is formed or disposed on the first lower dielectric layer 30a, and covered by the second lower dielectric layer 36a. In some embodiments, the second lower circuit layer 38a is electrically connected to the first lower circuit layer 34a through the lower interconnection vias 35a. The lower interconnection via 35a tapers upwardly along a direction from the bottom surface 32 towards the top surface 31 of the first circuit structure 3. In some embodiments, the second lower circuit layers 38a are electrically connected to each other through the lower interconnection vias 35a. The second lower circuit layer 38a may be electrically connected and bonded to a carrier (e.g., a motherboard such as a printed circuit board (PCB)) through connecting elements (e.g., solder bumps or other conductive bumps).

In some embodiments, each interconnection via 39 may electrically connect the first upper circuit layer 34 and the first lower circuit layer 34a.

The plurality of the first connecting elements 16 may be disposed between the first circuit structure 3 and the second circuit structure 2. The fourth circuit layer 27 (e.g., the bottommost circuit layer 27) of the second circuit structure 2 may contact one of the first connecting elements 16. The second upper circuit layer 38 of the first circuit structure 3 may contact one of the first connecting elements 16. As such, the first circuit structure 3 (e.g., the second upper circuit layer 38) may be electrically connected and bonded to the second circuit structure 2 (e.g., the bottommost circuit layer 27) through the first connecting elements 16.

The first underfill 7 may be disposed between the second circuit structure 2 and the first circuit structure 3. The first underfill 7 may at least partially encapsulate a portion of the lateral surface 203 (or an edge) of the second circuit structure 2. The first underfill 7 may encapsulate the first connecting elements 16. The first underfill 7 may cover the bottom surface 202 of the second circuit structure 2. The first underfill 7 may contact the bottom surface 202 of the second circuit structure 2. The first underfill 7 may cover the top surface 31 of the first circuit structure 3. The first underfill 7 may contact the top surface 31 of the first circuit structure 3. In some embodiments, the first underfill 7 may include an epoxy resin, a molding compound (e.g., an epoxy molding compound or other molding compound), a polyimide, a phenolic compound or material, a material including silicone dispersed therein, or a combination thereof. A material of the second underfill 6 may be different from that of the first underfill 7.

The first connecting elements 16 may each include a solder 161 and a conductive pillar 162 surrounded by the first underfill 7. A bottom portion of the conductive pillar 162 is disposed in the openings of the top protection layer 301 of the first circuit structure 3. The solder 161 may have a surface 1611 connected to the conductor pillar 162 and a surface 1612 connected to the fourth circuit layer 27, and a curved lateral surface 1613 connected between the surfaces 1611 and 1612. The conductive pillar 162 is farther away from the first circuit structure 3 than the solder 161 is. The conductive pillar 162 may have a curved lateral surface 1621. The curved lateral surface 1621 of the conductive pillar 162 may be concave, i.e., the width of a middle part of the conductive pillar 162 is smaller than that of a bottom part/upper part of the conductive pillar 162.

The solders 161 of the connection elements 16 may have different thicknesses in a direction perpendicular to the surface 101 of the substrate 10. The solders 161 of the connection elements 16 may have different widths in a direction parallel to the surface 31. The width of one of the solders 161 is larger than the thickness of that solder 161. The conductive pillars 162 of the connection elements 16 may have different thicknesses in a direction perpendicular to the surface 31.

The connection elements 16 may each include a first portion 163 and a second portion 164 disposed between the solder 161 and the conductive pillar 162. The first portion 163 may be disposed on the conductive pillar 162, and may include a first metal such as nickel. The second portion 164 may be disposed on the first portion 163, and may include a second metal such as SnAg alloy. The conductive pillar 162 may include a third metal such as copper. The solder 161 may include a fourth metal such as Sn. A width of the first portion 163 is greater than a width of the conductive pillar 162.

The underfill guide structure 17 is disposed outside of a projection area (e.g., a vertical projection) B1 of the second circuit structure 2 on the surface 31 and overlaps a gap between the upper circuit structure 2 and the first circuit structure 3. The underfill guide structure 17 may be disposed over the surface 31 of the first circuit structure 3.

In some embodiments, the underfill guide structure 17 may be a dummy. That is, the underfill guide structure 17 may have no electrical function, and may not be used for transmitting signals. In addition, the size and structure of the underfill guide structure 17 may be similar to or the same as the size and structure of the first connection elements 16, and they may be formed in the same process. The underfill guide structure 17 and the first connection elements 16 may differ in that a solder 171 of the underfill guide structure 17 is not connected to a circuit layer, resulting in the solder having a round upper part.

A thickness $T_4$ of the underfill guide structure 17 is greater than a thickness $T_2$ of the second circuit structure 2 in the direction perpendicular to the surface 31. The thickness $T_4$ may be greater than a gap between the first circuit structure 3 and the second circuit structure 2. The thickness $T_4$ may be greater than a thickness $T_3$ of the first connection elements 16 in the direction perpendicular to the surface 31. The thickness $T_3$ of the first connection elements 16 is greater than the thickness $T_2$ of the second circuit structure 2. The underfill guide structure 17 may include a solder 171 and a conductive pillar 172 connected to the solder 171. The solder 171 is farther away from the carrier (or the substrate) 10 than the conductive pillar 172 is. The solder 171 may have a surface 1711 connected to the conductor pillar 172 and a round surface 1712 opposite to the surface 1711 and exposed by the underfill 7. The conductive pillar 172 is closer to the first circuit structure 3 than the solder 171 is. The conductive pillar 172 may have a curved lateral surface (or a first sidewall) 1721. The curved lateral surface 1721 of the conductive pillar 172 may be concave, i.e., the width of a middle part of the conductive pillar 172 is smaller than that of a bottom part/upper part of the conductive pillar 172.

The underfill guide structure 17 may include a first portion 173 and a second portion 174 disposed between the solder 171 and the conductive pillar 172. The underfill guide structure 17 may include a pillar that includes a first metal (e.g., the conductive pillar 172) and the second metal (e.g., the first portion 173) disposed on the first metal. A lateral surface of the first metal is recessed from a lateral surface of the second metal. The first portion 173 may be disposed on the conductive pillar 172, and may include a first metal such as nickel. The second portion 174 may be disposed on the first portion 173, and may include a second metal such as SnAg alloy. The conductive pillar 172 may include a third metal such as copper. The solder 171 may include a fourth metal such as Sn. A width of the first portion 173 is greater than a width of the conductive pillar 172.

The underfill guide structure 17 may be configured to reduce an extension of the portion 7a of the underfill along the lateral surface 203 of the circuit structure 2. The underfill guide structure 17 may be configured to increase a contact area between the portion 7a and the surface 31 of the circuit structure 3. The first underfill 7 may be in contact with the underfill guide structure 17. The first underfill 7 may extend beyond the underfill guide structure 17 along a direction substantially parallel with the surface 31 of the first circuit structure 3. The underfill guide structure 17 is configured to enlarge a contact area between the first underfill 7 and the first circuit structure 3. The underfill guide structure 17 is configured to increase or facilitate a horizontal distribution (or horizontal extension) of the first underfill 7 on the surface 31 of the first circuit structure 3 and suppress a vertical distribution (or vertical extension) of the first underfill 7 on the lateral surface 203 of the second circuit structure 2.

A portion (or a first portion) 7a of the first underfill 7 may be disposed outside of the projection area B1 of the second circuit structure 2 on the surface 31 of the first circuit structure 3. In a cross section, a first length of the portion 7a along the surface 31 of the first circuit structure 3 is greater than a second length of the portion 7a in contact with the lateral surface 203 of the second circuit structure 2. The portion 7a of the first underfill 7 may include a first inner part and a first outer part separated from the first inner part by the underfill guide structure 17. A curvature of a surface of the first inner part may be discontinuous with a curvature of a surface of the first outer part. The first inner part is disposed between the second circuit structure 2 and the underfill guide structure 17. In the cross-sectional view, a length of a contact surface between the first outer part and the first circuit structure 3 is greater than the second length of the portion 7a in contact with the lateral surface 203 of the second circuit structure 2.

In some embodiments, the portion 7a of the underfill 7 may have a top portion disposed between the surface 201 and the surface 202 of the second circuit structure 2.

In some embodiments, in a cross section, the underfill guide structure 17 has a second sidewall 1722 opposite to the first sidewall 1721. In a cross section, a first contact length of the underfill 7 at the first sidewall 1721 is different from a second contact length of the underfill 13 at the second sidewall 1722. The first contact length may be greater than the second contact length. In some embodiments, a first height (e.g., the first contact length) of a first contact surface between the first part and the protrusion 17 is greater than a second height (e.g., the second contact length) of a second contact surface between the second part 13a2 and the protrusion 17.

A portion (a second portion) 7b of the first underfill 7 may be disposed outside of the projection area B1 of the second circuit structure 2 on the surface 31 of the first circuit structure 3. The portion 7b is opposite to the portion 7a with respect to the second circuit structure 2. In a cross section, a first length of the portion 7b along the surface 31 of the first circuit structure 3 is greater than a second length of the portion 7b in contact with the lateral surface 203 of the second circuit structure 2. The portion 7b of the first underfill 7 may include a second inner part and a second outer part separated from the second inner part by the underfill guide structure 17. A curvature of a surface of the second inner part may be discontinuous with a curvature of a surface of the second outer part. The second inner part is disposed between the second circuit structure 2 and the underfill guide structure 17. In the cross-sectional view, a length of a contact surface between the second outer part and the first circuit structure 3 is greater than the second length of the portion 7b in contact with the lateral surface 203 of the second circuit structure 2.

In some embodiments, the portion 7b of the underfill 7 may have a top portion disposed between the surface 201 and the surface 202 of the second circuit structure 2.

The portion 7a of the underfill 7 and the portion 7b of the underfill 7 may be asymmetrical. For example, the highest point of the portion 7a and the portion 7b may be at different elevations with respect to the surface 31 of the first circuit structure 3. The length of the portion 7a along the surface 31 of the first circuit structure 3 is different from the length of the portion 7b along the surface 31 of the first circuit structure 3. A curvature of a lateral surface 71 of the portion 7a is different from that of a lateral surface 72 of the portion 17b.

The underfill guide structure 17 may include one or more protrusions 17 (used with the same numeral for brevity). The protrusion 17 may be disposed over the surface 31 of the first circuit structure 3. The protrusion 17 may be spaced apart from the second circuit structure 2. The first underfill 7 may be in contact with the protrusion 17. The first underfill 7 may define a first concave portion 7a outside the projection region B1 of the second circuit structure 2 on the surface 31 of the first circuit structure 3. The first concave portion 7a is recessed from a space between a top portion (e.g., the solder 171) of the protrusion 17 and a top portion of the second circuit structure 2. In some embodiments, the first concave portion 7a opens toward a space between the top portion of the protrusion 17 and the top portion of the second circuit structure 2. In some embodiments, the first concave portion 7a may open substantially upward. An outer surface 71 of the first concave portion 7a is concave toward a space between the top portion of the protrusion 17 and a top edge (e.g., the lateral surface 203) of the second circuit structure 2. In some embodiments, the outer surface 71 of the first concave portion 7a is concave upward. In some embodiments, a central axis of the first concave portion 7a extends through a space between the top portion of the protrusion 17 and the top edge of the second circuit structure 2.

In some embodiments, an elevation of a highest point where the first concave portion 7a contacts the lateral surface 203 of the second circuit structure 2 is between the surface 202 of the second circuit structure 2 and the surface 201 of the second circuit structure 2.

In the present disclosure, the package structure 600A includes the underfill guide structure 17 disposed outside the projection area B1 of the second circuit structure 2 on the surface 31 of the first circuit structure 3. The underfill guide structure 17 is configured to increase or facilitate a horizontal distribution (or horizontal extension) of the underfill 7 on the surface 31 of the first circuit structure 3 and suppress a vertical distribution (or vertical extension) of the underfill 7 on the lateral surface 203 of the second circuit structure 2. The underfill guide structure 17 can direct the underfill 7 with the relatively small volume toward the edge (defined by an imaginary line that is aligned with and below the lateral surface 203) of the second circuit structure 2 by capillary effect. The underfill guide structure 17 ensures that the portions 7a of the underfill 7 stay outside the projection area B1. The underfill guide structure 17 alters the distribution of the underfill 7 to support or secure the thin circuit structure 2 during the de-carrier process, thus achieving an arrangement of the thin circuit structure 2 (the thickness $T_2$) with the relatively thick (or taller) connection elements 16 (the thickness $T_3$).

In addition, an elevation of the highest points of the portions 7a and 7b, in contact with the lateral surface 203 of the second circuit structure 2, can be between the upper surface 201 and the lower surface 202 of the electronic device 11. Thus, the underfill 7 with the relatively large volume (hindering the de-carrier process if there is no guide structure) would not reach the lateral surface of a temporary carrier. The underfill guide structure 17 enables the process window to be wider because a slightly higher volume of the underfill 7 can be dispensed without underfill overflowing toward the temporary carrier. The underfill guide structure 17 can hold the underfill 7 in the event of excessive fillet, which could jeopardize the de-carrier process. The underfill guide structure 17 ensures good underfill support for the flip-chip bonding process.

Figure 6B:
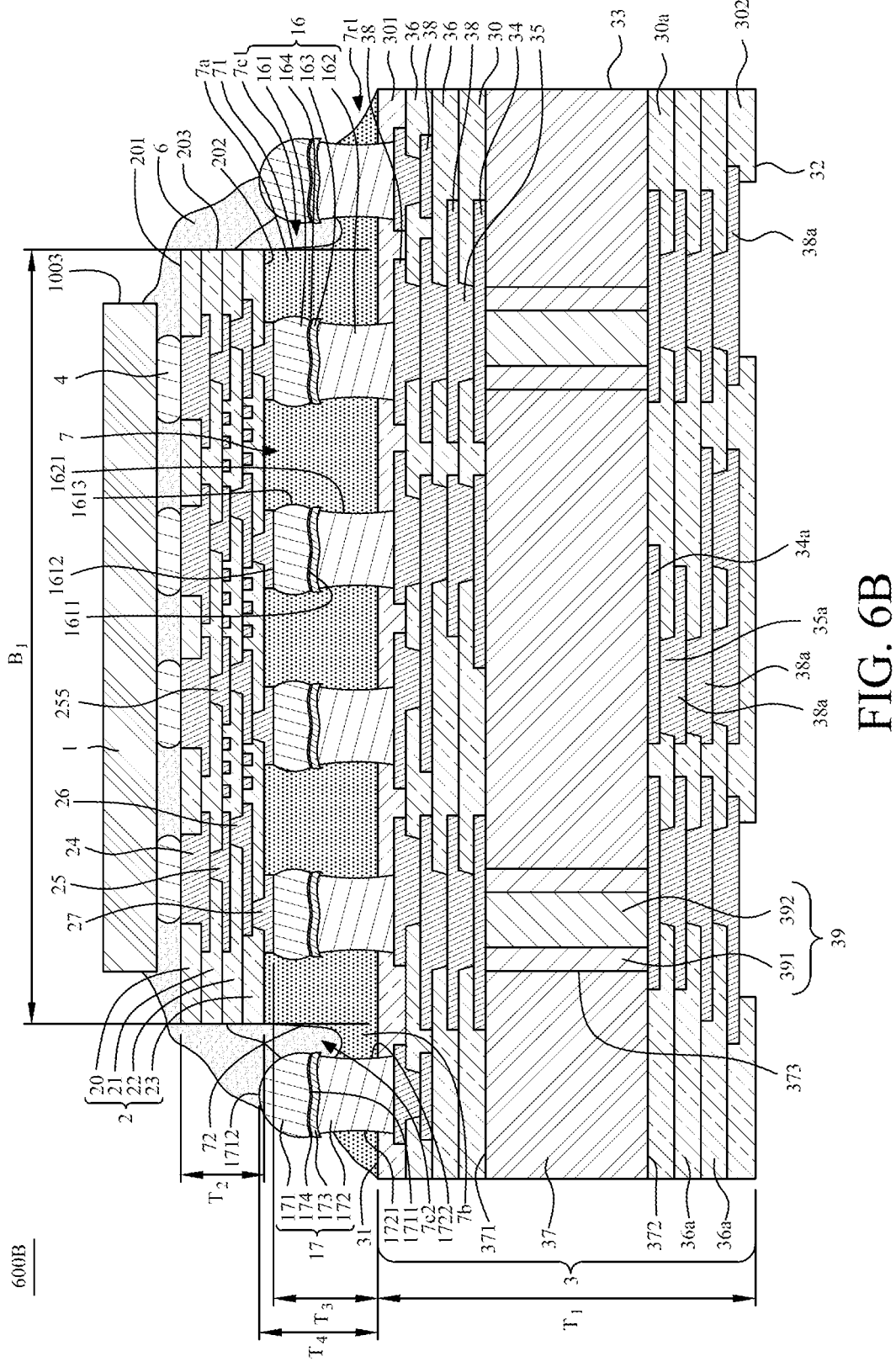
FIG. 6B illustrates a cross-sectional view of a package structure according to some embodiments of the present disclosure.

FIG. 6B illustrates a cross-sectional view of a package structure 600B according to some embodiments of the present disclosure. The package structure 600B in FIG. 6B is similar to the package structure 600A in FIG. 6A. Therefore, some detailed descriptions may refer to corresponding preceding paragraphs and are not repeated hereinafter for conciseness, with differences therebetween as follows.

The underfill 7 of the package structure 600B defines a first concave portion 7c1 outside the projection region B1. The first concave portion 13c1 is recessed from a space between a top portion (or the solder 171) of the underfill guide structure 17 on the right side and a top portion of the second circuit structure 2. The underfill 7 may further define a first recess portion 7r1 opposite to the first concave portion 17c1 with respect to the underfill guide structure 17. A curvature of a surface of the first recess portion 7r1 is different from a curvature of a surface of the first concave portion 7c1.

The underfill 7 of the package structure 600B defines a second concave portion 7c2 outside the projection region B1. The second concave portion 7c2 is recessed from a space between a top portion (or the solder 171) of the underfill guide structure 17 on the left side and a top portion of the second circuit structure 2. A curvature of a surface of the second concave portion 7c2 is different from a curvature of a surface of the first concave portion 7c1. The direction of the opening of the first concave portion 7cl is different from that of the second concave portion 7c2.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:

a substrate;

an electronic device disposed over the substrate;

an underfill outflanked by the substrate and the electronic device; and an underfill guide structure disposed outside of a vertical projection of the electronic device and horizontally overlapping a gap between the substrate and the electronic device, and configured to reduce an extension of a portion of the underfill outside of the vertical projection along a lateral surface of the electronic device, wherein the underfill guide structure includes a first protrusion outflanked by the underfill, wherein the portion of the underfill comprises a first part contacting the first protrusion and a second part contacting the first protrusion, and wherein the first part is closer to the gap than the second part is, and a thickness of the first part is greater than a thickness of the second part, wherein the first protrusion comprises a first pillar disposed on the substrate, and a width of the substrate is greater than a width of the electronic device, wherein the first pillar comprises a first metal and a second metal disposed on the first metal, and a lateral surface of the first metal is recessed from a lateral surface of the second metal.

2. The package structure of claim 1, wherein the underfill guide structure is configured to increase a horizontal extension of the portion of the underfill.

3. The package structure of claim 1, wherein the electronic device comprises a pad electrically connected to the substrate, and a height of the first protrusion is greater than a thickness of the pad.

4. The package structure of claim 1, wherein the underfill guide structure further comprises a second protrusion, and a height of the first protrusion is different from a height of the second protrusion.

5. The package structure of claim 1, wherein, in a cross section, a first height of a first contact surface between the first part and the first protrusion is greater than a second height of a second contact surface between the second part and the first protrusion.

6. The package structure of claim 1, further comprising a plurality of connection elements electrically connecting the electronic device to the substrate, wherein the underfill guide structure and the connection elements are formed in a same process.

7. The package structure of claim 1, wherein a thickness of the first protrusion is greater than a thickness of the electronic device.

* * * * *